(12) United States Patent
Kosakai et al.

(10) Patent No.: US 10,475,687 B2
(45) Date of Patent: Nov. 12, 2019

(54) ELECTROSTATIC CHUCK DEVICE

(71) Applicant: SUMITOMO OSAKA CEMENT CO., LTD., Tokyo (JP)

(72) Inventors: Mamoru Kosakai, Tokyo (JP); Yukio Miura, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 226 days.

(21) Appl. No.: 15/528,026

(22) PCT Filed: Nov. 19, 2015

(86) PCT No.: PCT/JP2015/082609
§ 371 (c)(1),
(2) Date: May 18, 2017

(87) PCT Pub. No.: WO2016/080502
PCT Pub. Date: May 26, 2016

(65) Prior Publication Data
US 2019/0088517 A1    Mar. 21, 2019

(30) Foreign Application Priority Data

Nov. 20, 2014   (JP) ................................ 2014-235454
Nov. 20, 2014   (JP) ................................ 2014-235737
(Continued)

(51) Int. Cl.
*H05B 3/03*     (2006.01)
*H05B 3/20*     (2006.01)
(Continued)

(52) U.S. Cl.
CPC .... *H01L 21/6833* (2013.01); *H01L 21/67069* (2013.01); *H01L 21/67103* (2013.01);
(Continued)

(58) Field of Classification Search
CPC .......... H05B 1/023–1/0233; H05B 3/02–3/03; H05B 3/20–3/32; H05B 3/36;
(Continued)

(56) References Cited

U.S. PATENT DOCUMENTS 5,729,423 A * 3/1998 Donde ................ H01L 21/6831
361/234
2003/0169553 A1* 9/2003 Brown ................... H02N 13/00
361/234
(Continued)

FOREIGN PATENT DOCUMENTS

JP      07-106319 A    4/1995
JP      10-204645 A    8/1998
(Continued)

OTHER PUBLICATIONS

International Search Report for PCT/JP2015/082609 (dated Feb. 23, 2016).
(Continued)

*Primary Examiner* — Michael A Laflame, Jr.
(74) *Attorney, Agent, or Firm* — Merchant & Gould P.C.

(57) ABSTRACT

An aspect of the present invention has an object to provide an electrostatic chuck device which is provided with a plurality of divided heaters and in which uniform temperature control of a zone which is heated by each heater can be performed with a simple configuration. An electrostatic chuck device according to an aspect of the present invention includes: an electrostatic chuck part which has a mounting surface on one principal surface thereof to mount a plate-shaped sample and has an electrode for electrostatic attraction; a temperature controlling base part which is provided at a side opposite to the mounting surface of the electrostatic chuck part and is configured to cool the electrostatic chuck part; a high frequency generating electrode which is provided in a layer between the electrostatic chuck part and the
(Continued)

temperature controlling base part; a high frequency power source which is connected to the high frequency generating electrode; a first heater element which is configured with a plurality of main heaters which are provided in a layer between the high frequency generating electrode and the temperature controlling base part; and a guard electrode which is provided in a layer between the high frequency generating electrode and the first heater element.

17 Claims, 20 Drawing Sheets

(30) Foreign Application Priority Data

Mar. 18, 2015 (JP) ................................ 2015-054573
Mar. 18, 2015 (JP) ................................ 2015-054985

(51) Int. Cl.
*H05B 3/36* (2006.01)
*H02N 13/00* (2006.01)
*H01L 21/683* (2006.01)
*H01L 21/67* (2006.01)

(52) U.S. Cl.
CPC .. *H01L 21/67109* (2013.01); *H01L 21/67248* (2013.01); *H02N 13/00* (2013.01)

(58) Field of Classification Search
CPC ........ H02N 13/00; H01L 21/67063–21/67075; H01L 21/67098–21/67115; H01L 21/683–21/6833
See application file for complete search history.

(56) References Cited

U.S. PATENT DOCUMENTS

| | | | | |
|---|---|---|---|---|
| 2004/0060656 | A1* | 4/2004 | Saigusa | H01J 37/32477 156/345.1 |
| 2006/0158822 | A1* | 7/2006 | Kondo | H02N 13/00 361/234 |
| 2008/0035306 | A1* | 2/2008 | White | C23C 16/4586 165/61 |
| 2015/0087144 | A1* | 3/2015 | Liu | H01L 21/02074 438/595 |
| 2016/0343600 | A1* | 11/2016 | Parkhe | H01J 37/32715 |
| 2019/0013231 | A1* | 1/2019 | Yamaguchi | H01L 21/6833 |
| 2019/0019712 | A1* | 1/2019 | Chito | H01L 21/3065 |

FOREIGN PATENT DOCUMENTS

| | | |
|---|---|---|
| JP | 11-163109 A | 6/1999 |
| JP | 2000-031253 A | 1/2000 |
| JP | 2002-313899 A | 10/2002 |
| JP | 2003-313899 A | 10/2002 |
| JP | 2004-508728 A | 3/2004 |
| JP | 2008-300491 A | 12/2008 |
| JP | 2013-508968 A | 3/2013 |
| JP | 2013-074251 A | 4/2013 |
| JP | 2014-112672 A | 6/2014 |
| JP | 2014-529910 A | 11/2014 |
| WO | 02/21590 A2 | 3/2002 |
| WO | 2011/125654 A1 | 10/2011 |

OTHER PUBLICATIONS

Notification for Japanese Patent Application No. 2017-100327, dated Nov. 6, 2018.
Japanese Office Action from JP Application No. 2017-100327 dated May 14, 2019. (Translation Attached).
Japanese Office Action from JP Application No. 2017-100328 dated May 14, 2019. (Translation Attached).

* cited by examiner

ELECTROSTATIC CHUCK DEVICE

TECHNICAL FIELD

The present invention relates to an electrostatic chuck device provided with a heater element, an electrostatic chuck device, an electrostatic chuck controller, a program, and an electrostatic chuck control method.

The present application is a National Stage Application under 35 U.S.C. § 371 of International Application No. PCT/JP2015/082609 filed Nov. 19, 2015, which claims the benefit of priority to Japanese Patent Application No. 2014-235737 filed on Nov. 20, 2014, Japanese Patent Application No. 2014-235454 filed on Nov. 20, 2014, Japanese Patent Application No. 2015-054573 filed on Mar. 18, 2015, and Japanese Patent Application No. 2015-054985 filed on Mar. 18, 2015, the disclosures of all of which are hereby incorporated by reference in their entireties. The International Application was published in Japanese on May 26, 2016 as WO 2016/080502.

BACKGROUND

In a semiconductor manufacturing apparatus using plasma, such as a plasma etching apparatus or a plasma CVD apparatus, in the past, as a device for easily mounting and fixing a wafer to a sample stage and maintaining the temperature of the wafer at a desired temperature, an electrostatic chuck device has been used.

In a plasma etching apparatus, if a wafer fixed to an electrostatic chuck device is irradiated with plasma, the surface temperature of the wafer rises. In order to suppress a rise in the surface temperature, the wafer is cooled from the lower side by circulating a cooling medium such as water through a temperature controlling base part of the electrostatic chuck device. However, a temperature distribution occurs in the surface of the wafer due to this cooling state. For example, a temperature becomes high at a central portion of the wafer and becomes low on a peripheral edge side of the wafer. Further, a plasma generation state changes due to a difference of the like of the structure or system of a plasma etching apparatus. A difference occurs in the in-plane temperature distribution of the wafer according to a change in the plasma generation state. Further, even in an apparatus for forming various films on a wafer, a temperature distribution occurs in the surface of the wafer under the influence of the film formation conditions or the control of an atmosphere in a film formation chamber.

Therefore, an electrostatic chuck device with a heater function has been proposed in which a heater member is mounted between an electrostatic chuck part and a temperature controlling base part (Patent Literature No. 1).

This electrostatic chuck device with a heater function can locally create a temperature distribution in a wafer. For this reason, the in-plane temperature distribution of the wafer can be appropriately set in accordance with a film deposition rate or a plasma etching rate. By setting the in-plane temperature distribution of the wafer, it is possible to efficiently perform local film formation such as pattern formation on the wafer or local plasma etching.

An electrostatic chuck device using an electrostatic chuck (ESC) is used in an etching apparatus using plasma, a CVD (Chemical Vapor Deposition) apparatus, or the like.

The electrostatic chuck device is provided with an electrostatic chuck part having a mounting surface on which a plate-shaped sample such as a silicon wafer is mounted and an electrode for electrostatic attraction, and generates electric charges in the electrode for an electrostatic chuck to fix the plate-shaped sample to the mounting surface with an electrostatic attraction force. Further, there is a case where an electrostatic chuck device is provided with a heater (refer to, for example, Patent Literature No. 2).

CITATION LIST

Patent Literature

[Patent Literature No. 1] Japanese Laid-open Patent Publication No. 2008-300491
[Patent Literature No. 2] Japanese Laid-open Patent Publication No. H11-163109

SUMMARY OF INVENTION

Technical Problem

In recent years, in the plasma etching apparatus, according to finer wiring or the like of a semiconductor device, uniformity of an etching rate has been more severely required as compared with that in the past. The etching rate by plasma etching is affected by the density of plasma, the surface temperature of a wafer, the concentration distribution of an etching gas, or the like. The plasma density or the etching gas concentration has a distribution in the surface of the wafer, and therefore, in addition to the uniformity of the wafer surface temperature, more accurate control of regulation of the in-plane temperature distribution of the wafer is required.

Further, it is also required to form a sharp in-plane temperature distribution by performing a change of an etching temperature in a short time in response to etching of a wide variety of films. In order to realize these, it is necessary to increase the power supply amount to a heater and increase the temperature difference between the control temperature of the temperature controlling base part and the attraction surface of the electrostatic chuck device. However, temperature uniformity on the same circumference on the wafer tends to deteriorate with an increase in the temperature difference between the control temperature of the temperature controlling base part and the attraction surface.

As a countermeasure against this, in the related art, improvement in temperature controllability and temperature uniformity in the wafer surface can be attained by performing temperature control by concentrically disposing a plurality of heaters, or increasing the number of divided portions of a heater in a radial direction in a concentric circular shape.

However, if the number of divided portions of the heater increases, there is a problem in which the degree of difficulty in temperature regulation in a state of imparting the in-plane temperature distribution of the wafer and during the temperature rise and fall increases. Further, if the number of divided portions of the heater increases, the configuration of an electrostatic chuck device becomes complicated accordingly.

The present invention has been made in consideration of the problems of the related art described above and has an object to provide an electrostatic chuck device in which even in a structure having a plurality of divided heaters, uniform temperature control of zones which are heated by the respective heaters can be performed with a simple configuration, and provide an electrostatic chuck device in which it is possible to accurately perform temperature control using a heater, an electrostatic chuck controller, a program, and an electrostatic chuck control method.

Solution to Problem

The present invention has the following configurations as means for solving the above-described problems.

An electrostatic chuck device according to an aspect of the present invention includes: an electrostatic chuck part which has a mounting surface on one principal surface thereof to mount a plate-shaped sample and has an electrode for electrostatic attraction; a temperature controlling base part which is provided at a side opposite to the mounting surface of the electrostatic chuck part and is configured to cool the electrostatic chuck part; a high frequency generating electrode which is provided in a layer between the electrostatic chuck part and the temperature controlling base part; a high frequency power source which is connected to the high frequency generating electrode; a first heater element which is configured with a plurality of main heaters which are provided in a layer between the high frequency generating electrode and the temperature controlling base part; and a guard electrode which is provided in a layer between the high frequency generating electrode and the first heater element.

According to this configuration, the guard electrode cuts off high frequencies which are generated from the high frequency generating electrode. For this reason, it is possible to suppress the influence of the high frequency on a heater power source configuring the first heater element. Further, it is possible to remove a high frequency cut-off filter for the first heater element. That is, complication of the configuration of the electrostatic chuck device is avoided, and this contributes to a reduction in the manufacturing cost of the electrostatic chuck device.

In the electrostatic chuck device according to an aspect of the present invention, a configuration can be adopted in which the electrostatic chuck device further includes a second heater element which are configured with a plurality of sub-heaters disposed in a layer between the first heater element and the guard electrode or between the first heater element and the temperature controlling base part.

According to this configuration, in addition to the guard electrode, the first heater element or the second heater element which is disposed on the guard electrode side also cuts off high frequencies which are generated from the high frequency generating electrode. Therefore, it is possible to further suppress the influence of the high frequency on the first heater element or the second heater element which is disposed on the temperature controlling base part side. That is, it is possible to further reduce a concern that the high frequency may leak as noise to a heater power source of the heater and impair the operation or performance of the heater power source.

Further, according to this configuration, the temperature distribution of each zone divided into a plurality of main heaters can be individually controlled and the temperature control in each zone can be finely adjusted by the sub-heater. For this reason, even if a partial temperature distribution occurs in the plate-shaped sample due to variation in plasma generation state or film forming condition while holding the plate-shaped sample, it is possible to suppress the temperature distribution by the fine adjustment of a temperature by the sub-heater. Therefore, in a case of being applied to an etching apparatus or a film forming apparatus, this contributes to improvement in uniformity of an etching rate and contributes to control of a local etching rate and improvement in stability of film formation.

In the electrostatic chuck device according to an aspect of the present invention, a configuration can be adopted in which the guard electrode has a first heat transfer barrier extending in a circumferential direction thereof.

According to this configuration, it is possible to suppress the conduction of heat in an in-plane direction through the guard electrode and further enhance the temperature controllability for each region. In the electrostatic chuck device, heat conduction in a concentric circular direction (a circumferential direction) in the in-plane direction can be permitted. On the other hand, heat conduction in a radial direction can become a factor of impairing temperature uniformity. For this reason, the temperature controllability of the electrostatic chuck device can be further enhanced by thermally separating the guard electrode in the radial direction.

In the electrostatic chuck device according to an aspect of the present invention, a configuration can be adopted in which the plurality of main heaters, which form the first heater element, are disposed concentrically in an annular shape in a circular region, and the first heat transfer barrier is provided to planarly overlap a region wherein the region is provided between the plurality of main heaters which are adjacent to each other in a radial direction in the circular region.

According to this configuration, it is possible to inhibit heat transfer in the in-plane direction of the metal plate in accordance with a region in which a temperature is controlled by each main heater and sub-heater. That is, it is possible to further enhance the temperature controllability for each region of the electrostatic chuck device 1.

In the electrostatic chuck device according to an aspect of the present invention, a configuration can be adopted in which the plurality of main heaters, which form the first heater element, are disposed concentrically in a circular region, the high frequency generating electrode has a second heat transfer barrier which extends in a circumferential direction thereof, and the second heat transfer barrier is provided to planarly overlap a region wherein the region is provided between the plurality of main heaters which are adjacent to each other in a radial direction in a circular region.

According to this configuration, it is possible to suppress the conduction of heat in the in-plane direction through the high frequency generating electrode and further enhance the temperature controllability for each region. The temperature controllability of the electrostatic chuck device can be further enhanced by thermally separating the high frequency generating electrode in the radial direction. Further, the potential in the electrode can be kept electrically uniform, and therefore, it is possible to reduce the influence on plasma density.

A configuration can be adopted in which a material which forms the high frequency generating electrode in the electrostatic chuck device according to an aspect of the present invention is a non-magnetic metal material.

The material for formation of the high frequency generating electrode is formed of non-magnetic metal, whereby even if the electrostatic chuck device is used in a high frequency atmosphere, self-heating of the high frequency generating electrode due to a high frequency does not occur. Therefore, even in a high frequency atmosphere, it becomes easy to maintain the in-plane temperature of the plate-shaped sample at a desired constant temperature or constant temperature pattern.

A configuration can be adopted in which a material for formation of the high frequency generating electrode in the electrostatic chuck device according to an aspect of the present invention has a thermal expansion coefficient of $4 \times 10^{-6}$/K or more and $10 \times 10^{-6}$/K or less.

If the thermal expansion coefficient is within the range, it is possible to further suppress occurrence of peeling of the joint interface with the electrostatic chuck part, cracking of the electrostatic chuck part, or the like, due to a difference in thermal expansion coefficient.

A configuration can be adopted in which the high frequency generating electrode in the electrostatic chuck device according to an aspect of the present invention has a thickness of 20 μm or more and 1000 μm or less.

If the thickness of the high frequency generating electrode is within the above range, the uniformity of plasma is not affected by generation of unevenness of heat generation and unevenness of an electric field due to the thickness of the high frequency generating electrode, the heat capacity of the high frequency generating electrode does not become too large, and it is possible to enhance the thermal responsiveness to the plate-shaped sample.

The electrostatic chuck device according to an aspect of the present invention can adopt a configuration in which a calorific value per unit area of the sub-heaters is set to be smaller than a calorific value per unit area of the main heater.

By performing temperature control in each zone by the sub-heater made such that a calorific value per unit area is smaller than that of the main heater, the sub-heater finely adjusts a temperature, and therefore, excessive heating is suppressed, and it is possible to more accurately control a temperature distribution.

An electrostatic chuck device according to an aspect of the present invention includes: an electrostatic chuck part which has a mounting surface on one principal surface thereof to mount a plate-shaped sample and has an electrode for electrostatic attraction; a temperature controlling base part which is provided at a side opposite to the mounting surface of the electrostatic chuck part and is configured to cool the electrostatic chuck part; a high frequency generating electrode which is provided in a layer between the electrostatic chuck part and the temperature controlling base part and insulated from the temperature controlling base part; a high frequency power source which is connected to the high frequency generating electrode; a first heater element which is configured with a plurality of main heaters which are provided in a layer between the electrostatic chuck part and the high frequency generating electrode; a second heater element which is configured with a plurality of sub-heaters which are provided between the high frequency generating electrode and the temperature controlling base part; and a metal plate which is provided between the high frequency generating electrode and the second heater element.

The temperature distribution of each zone divided into a plurality of main heaters can be individually controlled and the temperature control in each zone can be finely adjusted by the sub-heater. For this reason, even if a partial temperature distribution occurs in the plate-shaped sample due to variation in plasma generation state or film forming condition while holding the plate-shaped sample, it is possible to suppress the temperature distribution by the fine adjustment of a temperature by the sub-heater. For this reason, in a case of being applied to an etching apparatus or a film forming apparatus, this contributes to improvement in uniformity of an etching rate and contributes to control of a local etching rate and improvement in stability of film formation.

Further, even if a large temperature difference is taken between the control temperature of the temperature controlling base part and the attraction surface of the electrostatic chuck device in order to form a sharp in-plane temperature distribution by performing a change of an etching temperature in a short time in response to etching of a wide variety of films, this contributes to improvement in uniformity of the in-plane temperature distribution of the plate-shaped sample and contributes to improvement in temperature uniformity.

Further, the second heater element configured with a plurality of sub-heaters has a metal plate between itself and the high frequency generating electrode. For this reason, the influence of the high frequency on the second heater element can be suppressed. Therefore, it is possible to prevent a high frequency current from leaking to the power source for the sub-heater through the second heater element. That is, in the electrostatic chuck device according to an aspect of the present invention, it is possible to remove a high frequency cut-off filter for the sub-heater.

The electrostatic chuck device according to an aspect of the present invention can adopt a configuration in which a material which forms the temperature controlling base part is a metal material and the metal plate and the temperature controlling base part are electrically connected to each other.

The metal plate and the temperature controlling base part are electrically connected to each other, and therefore, it is not necessary to provide wiring or the like for grounding the metal plate, and thus it is possible to realize a simpler electrostatic chuck device.

The electrostatic chuck device according to an aspect of the present invention can adopt a configuration in which a calorific value per unit area of the sub-heater is set to be smaller than a calorific value per unit area of the main heater.

According to this configuration, it is possible to perform the temperature control in each zone by the sub-heater made such that a calorific value per unit area is smaller than that of the main heater. The sub-heater finely adjusts a temperature, and therefore, excessive heating is suppressed, and thus it is possible to more accurately control a temperature distribution.

The electrostatic chuck device according to an aspect of the present invention can adopt a configuration in which both the first heater element and the second heater element are arranged such that the first heater element and the second heater element are provided in circular regions along surfaces on which the elements are provided, the first heater element and the second heater element are divided into a plurality of portions in circumferential directions or radial directions thereof, and the number of divided portions of the second heater element is greater than that of the first heater element.

According to this configuration, the number of sub-heaters capable of finely adjusting a temperature is greater than the number of main heaters. For this reason, the temperature fine adjustment for each region smaller than the region which is heated by the main heater becomes possible, and thus the local temperature fine adjustment of the plate-shaped sample becomes possible.

The electrostatic chuck device according to an aspect of the present invention can adopt a configuration in which the plurality of main heaters which form the first heater element are provided concentrically in a circular region and the metal plate has a plurality of first heat transfer barriers extending in a circumferential direction thereof.

According to this configuration, it is possible to suppress the conduction of heat in the in-plane direction through the metal plate and further enhance the temperature controllability for each region. In the electrostatic chuck device, heat conduction in a concentric circular direction (a circumferential direction) in the in-plane direction can be permitted. On the other hand, heat conduction in a radial direction can become a factor of impairing temperature uniformity. For this reason, the temperature controllability of the electrostatic chuck device can be further enhanced by thermally separating the metal plate in the radial direction.

The electrostatic chuck device according to an aspect of the present invention can adopt a configuration in which both the first heater element and the second heater element are arranged such that the first heater element and the second heater element are provided in circular regions along surfaces on which the elements are provided, and the metal plate has the plurality of first heat transfer barriers which are provided to planarly overlap a region provided between the plurality of adjacent main heaters and a region provided between the plurality of adjacent sub-heaters.

According to this configuration, it is possible to inhibit heat transfer in the in-plane direction of the metal plate in accordance with a region in which a temperature is controlled by each main heater and sub-heater. That is, it is possible to further enhance the temperature controllability for each region of the electrostatic chuck device.

The electrostatic chuck device according to an aspect of the present invention can adopt a configuration in which both the first heater element and the second heater element are arranged such that the first heater element and the second heater element are provided in circular regions along surfaces on which the elements are provided, and the high frequency generating electrode has a plurality of second heat transfer barriers which are provided to planarly overlap a region provided between the plurality of adjacent main heaters and a region provided between the plurality of adjacent sub-heaters.

According to this configuration, it is possible to inhibit heat transfer in the in-plane direction of the high frequency generating electrode in accordance with a region in which a temperature is controlled by each main heater and sub-heater. That is, it is possible to further enhance the temperature controllability for each region of the electrostatic chuck device.

In the present invention, a configuration can be adopted in which a temperature sensor which measures a temperature of the main heater is provided to be in contact with the main heater via an insulation material on a temperature controlling base part side of the main heater or installed in a temperature measuring part which is provided on the same surface on which the main heater is provided.

Further, a configuration can be adopted in which one surface of the temperature sensor is in contact via the insulation material or installed in the temperature measuring part which is provided on the same surface on which the main heater is provided, and the other surface of the temperature sensor is not in contact with the temperature controlling base part.

According to this configuration, the temperature control of the plate-shaped sample can be performed while measuring the temperature of the main heater with the temperature sensor in a state where the influence of the temperature of the temperature controlling base is small, and therefore, it is possible to avoid overshoot when controlling the temperature of the plate-shaped sample and accurately adjust the temperature of the plate-shaped sample.

An electrostatic chuck device according to an aspect of the present invention includes: an electrostatic chuck part which has a mounting surface on one principal surface thereof to mount a plate-shaped sample and has an electrode for electrostatic attraction; a temperature controlling base part which is provided at a side opposite to the mounting surface of the electrostatic chuck part and is configured to cool the electrostatic chuck part; a first heater element which is configured with a plurality of main heaters which are provided in a layer between the electrostatic chuck part and the temperature controlling base part; and a second heater element which is configured with a plurality of sub-heaters which are provided in a layer between the temperature controlling base part and the first heater element or between the first heater element and the electrostatic chuck part, in which a calorific value per unit area of the sub-heaters is set to be smaller than that of the main heaters.

The temperature distribution of each zone divided into a plurality of main heaters can be individually controlled and the temperature control in each zone can be finely adjusted by the sub-heater made such that a calorific value per unit area is smaller that of the main heater. For this reason, even if a partial temperature distribution occurs in the plate-shaped sample due to variation in plasma generation state or film forming condition while holding the plate-shaped sample, it is possible to suppress the temperature distribution by the fine adjustment of a temperature by the sub-heater. For this reason, in a case of being applied to an etching apparatus or a film forming apparatus, this contributes to improvement in uniformity of an etching rate and contributes to control of a local etching rate and improvement in stability of film formation.

Further, even if a large temperature difference is taken between the control temperature of the temperature controlling base part and the attraction surface of the electrostatic chuck device in order to forma sharp in-plane temperature distribution by performing a change of an etching temperature in a short time in response to etching of a wide variety of films, this contributes to improvement in uniformity of the in-plane temperature distribution of the plate-shaped sample and contributes to improvement in temperature uniformity.

In the present invention, a configuration can be adopted in which both the first heater element and the second heater element are arranged such that the first heater element and the second heater element are provided to have a circular form along surfaces on which the elements are provided, the first heater element and the second heater element are divided into a plurality of portions in circumferential directions or radial directions thereof, and the number of divided portions of the second heater element is greater than that of the first heater element.

The number of sub-heaters capable of finely adjusting a temperature is greater than the number of main heaters, and therefore, the temperature fine adjustment for each region smaller than the region which is heated by the main heater becomes possible, and thus the local temperature fine adjustment of the plate-shaped sample becomes possible.

In the present invention, a configuration can be adopted in which a temperature sensor which measures a temperature of the main heater is provided to be in contact with the main heater via an insulation material on a temperature controlling base part side of the main heater or installed in a temperature measuring part which is provided on the same surface on which the main heater is provided.

Further, a configuration can be adopted in which one surface of the temperature sensor is in contact via the insulation material or installed in the temperature measuring part which is provided on the same surface on which the main heater is provided, and the other surface of the temperature sensor is not in contact with the temperature controlling base part.

According to this configuration, the temperature control of the plate-shaped sample can be performed while measuring the temperature of the main heater with the temperature sensor in a state where the influence of the temperature of the temperature controlling base is small, and therefore, it is possible to avoid overshoot when controlling the temperature of the plate-shaped sample and accurately adjust the temperature of the plate-shaped sample.

In the present invention, a configuration can be adopted in which the first heater element and the second heater element are laminated via a plurality of heat-resistant insulation plates on the electrostatic chuck part side of the temperature controlling base part, and a power supply terminal is provided which is connected to the main heater or the sub-heater through a contact hole provided in the insulation plate and a through-hole provided in the temperature controlling base part.

By laminating the first heater element and the second heater element with the heat-resistant insulation plates interposed therebetween, it is possible to realize a laminated structure of these heater elements between the electrostatic chuck part and the temperature controlling base part. The power feeding to the first heater element and the second heater element can be performed by the power supply terminal penetrating through the temperature controlling base part and the insulation plates.

In the present invention, a configuration can be adopted in which an insulation plate is provided between the second heater element and the temperature controlling base part and a wiring layer which is connected to each sub-heater of the second heater element is formed along a surface of the insulation plate, which is located on the temperature controlling base part side.

Even in a structure in which the second heater element is divided into a plurality of sub-heaters, it is possible to configure a circuit which can individually energize individual sub-heaters, by using the wiring layer provided along the insulation plate, and therefore, it is possible to perform energization control for each sub-heater, and thus temperature control for each fine region corresponding to each of the plurality of sub-heaters can be realized.

In the present invention, a configuration can be adopted in which the first heater element and the second heater element are laminated in this order between the temperature controlling base part and the electrostatic chuck part via the insulation plate from a side of the electrostatic chuck part.

In a case where a plurality of sub-heaters are provided between the main heater and the temperature controlling base part, the effect of making the temperature controlling base part suppress the temperature rise of the plate-shaped sample can be locally finely adjusted by the plurality of sub-heaters, and this contributes to improvement in the uniformity of the in-plane temperature distribution of the plate-shaped sample.

In the present invention, a configuration can be adopted in which the second heater element and the first heater element are laminated in this order between the temperature controlling base part and the electrostatic chuck part via the insulation plate from a side of the electrostatic chuck part.

In a case where a plurality of sub-heaters are provided between the main heater and the electrostatic chuck part, the sub-heater having a fine adjustment effect is provided at a position close to the plate-shaped sample, and therefore, local fine temperature control by a plurality of sub-heaters becomes possible, and thus local temperature fine adjustment of the plate-shaped sample becomes possible.

Further, as an aspect of the present invention, there is provided an electrostatic chuck device including: an electrostatic chuck part which has a mounting surface on one principal surface thereof to mount a plate-shaped sample and has an electrode for electrostatic attraction; a temperature controlling base part which is provided at a side opposite to the mounting surface of the electrostatic chuck part and is configured to cool the electrostatic chuck part; a first heater element which is configured with a single or a plurality of main heaters, wherein the main heaters control a temperature of an attraction surface of the electrostatic chuck part from a single or a plurality of main heater control regions thereof; a second heater element which is configured with a plurality of sub-heaters which control a temperature of sub-heater control regions, wherein the number of the sub-heater control regions is larger than that of main heater control regions of the first heater element; and a control part which is configured to control a voltage applied to the sub-heaters.

As an aspect, in the electrostatic chuck device, a configuration may be used in which the control part uses a pulse voltage as the voltage applied to the sub-heaters.

As an aspect, in the electrostatic chuck device, a configuration may be used in which the control part controls a time width of the pulse voltage which is applied to each of the sub-heaters of the second heater element during periods of the same length, wherein the periods are cyclically assigned to the plurality of sub-heaters of the second heater element.

As an aspect, in the electrostatic chuck device, a configuration may be used in which the control part uses a DC voltage as the voltage applied to the sub-heaters.

As an aspect, in the electrostatic chuck device, a configuration may be used in which the control part controls a magnitude of the voltage applied to the sub-heaters with respect to the plurality of sub-heaters of the second heater element.

As an aspect, in the electrostatic chuck device, a configuration may be used in which the control part controls the voltage applied to the main heater.

As an aspect, in the electrostatic chuck device, a configuration may be used in which, in a state in which there is a temperature difference between the electrostatic chuck part and the temperature controlling base part, the control part always applies the voltage to the main heater except for during a cooling process and intermittently applies the voltage to each of the sub-heaters.

As an aspect, in the electrostatic chuck device, a configuration may be used in which the control part controls a magnitude of the voltage, which is applied to each of the sub-heaters, on the basis of a magnitude of the voltage, a current or an electric power, which is applied to the main heaters, and the sub-heaters are provided to have a form wherein main heater control regions of a main heater are divided by the form.

As an aspect, in the electrostatic chuck device, a configuration may be used in which the control part controls a magnitude of the voltage, which is applied to each of the sub-heaters, on the basis of a difference between a temperature obtained as a result of temperature detection at least corresponding to the main heater and a temperature obtained as a result of temperature detection corresponding to a chiller of the temperature controlling base part, and the sub-heaters are provided to have a form wherein main heater control regions of a main heater are divided by the form.

As an aspect, in the electrostatic chuck device, a configuration may be used in which the electrostatic chuck device includes a memory part which stores information used to control the voltage applied to the sub-heaters, and the control part controls the voltage which is applied to the sub-heaters based on the information stored in the memory part.

As an aspect, in the electrostatic chuck device, a configuration may be used in which the memory part stores information corresponding to a part of a temperature range wherein a temperature control is performed by the sub-heater, and the control part controls the voltage, which is applied to the sub-heaters, on the basis of the information stored in the memory part and the magnitude of the voltage, the current or the electric power, which is applied to the main heater.

As an aspect, in the electrostatic chuck device, a configuration may be used in which the memory part stores the information corresponding to a part of the temperature range wherein the temperature control is performed by the sub-heaters, and the control part controls the voltage, which is applied to the sub-heaters, on the basis of the information stored in the memory part and on the basis of a difference between a temperature, which is obtained as the result of temperature detection at least corresponding to the main heater, and a temperature, which is obtained as the result of temperature detection of the chiller of the temperature controlling base part.

As an aspect, in the electrostatic chuck device, a configuration may be used in which the first heater element controls a temperature of each of the plurality of main heater control regions in which a temperature thereof is controllable independently.

As an aspect, in the electrostatic chuck device, a configuration may be used in which the sub-heaters are provided to have a laminar form wherein main heater control regions of a main heater are divided by the form.

As an aspect, in the electrostatic chuck device, a configuration may be used in which a calorific value per unit area of the sub-heaters is ⅕ or less of that of the main heater.

As an aspect, in the electrostatic chuck device, a configuration may be used in which the second heater element is formed in a single layer or a plurality of layers.

As an aspect, there is provided an electrostatic chuck controller including: an electrostatic chuck device and a control part which is configured to control a voltage applied to sub-heaters of the electrostatic chuck device, wherein the electrostatic chuck device includes: an electrostatic chuck part which has a mounting surface on one principal surface thereof to mount a plate-shaped sample, and has an electrode for electrostatic attraction, a temperature controlling base part which is provided at aside opposite to the mounting surface of the electrostatic chuck part and is configured to cool the electrostatic chuck part, a first heater element which is configured with a single or a plurality of main heaters wherein the main heaters control a temperature of an attraction surface of the electrostatic chuck part from a single or a plurality of main heater control regions, and a second heater element which is configured with a plurality of sub-heaters which control a temperature of sub-heater control regions wherein the number of the sub-heater control regions are more than that of the first heater element.

As an aspect, there is provided a program which controls an electrostatic chuck device, in which the program causes a computer to execute a step of controlling a voltage, wherein the voltage is applied to sub-heaters of the electrostatic chuck device and a pulse voltage is used as the voltage, and the electrostatic chuck device includes an electrostatic chuck part which has a mounting surface on one principal surface thereof to mount a plate-shaped sample and has an electrode for electrostatic attraction, a temperature controlling base part which is provided at a side opposite to the mounting surface of the electrostatic chuck part and is configured to cool the electrostatic chuck part, a first heater element which is configured with a single or a plurality of main heaters wherein the main heaters control a temperature of an attraction surface of the electrostatic chuck part from a single or a plurality of main heater control regions, and a second heater element which is configured with a plurality of sub-heaters which control a temperature of sub-heater control regions wherein the number of the sub-heater control regions are more than that of main heater control regions of the first heater element.

As an aspect, there is provided an electrostatic chuck control method, in which a single or a plurality of main heaters, which form a first heater element, control a temperature of an attraction surface of an electrostatic chuck part from a single or a plurality of main heater control regions of the first heater element, a plurality of sub-heaters, which form a second heater element, control a temperature of sub-heater control regions wherein the number of the sub-heater control regions is larger than that of main heater control regions, and a control part controls a voltage applied to the sub-heaters.

As an aspect, there is provided an electrostatic chuck control method, in which a magnitude of a voltage applied to sub-heaters is controlled on the basis of a magnitude of a voltage, a current or an electric power which is applied to a main heater, wherein the sub-heaters are provided to have a form wherein main heater control regions of a main heater are divided by the form.

As an aspect, there is provided an electrostatic chuck control method, in which a magnitude of a voltage which is applied to sub-heaters is controlled on the basis of a difference between a temperature, which is obtained as a result of temperature detection at least corresponding to a main heater, and a temperature, which is obtained as a result of temperature detection of a chiller of a temperature controlling base part, and the sub-heaters are provided to have a form wherein main heater control regions of a main heater are divided by the form.

As an aspect, there is provided an electrostatic chuck control method, in which, in controlling a temperature of sub-heaters which is provided to have a form wherein main heater control regions of a main heater are divided by the form, an electric power which is supplied to the sub-heaters is controlled by a voltage value and an application time of a pulse voltage, the application time is controlled by a temperature provided by the main heater, and the voltage value is controlled by the electric power applied to the main heater or by a difference between a temperature, which is obtained as a result of temperature detection at least corresponding to the main heater, and a temperature, which is obtained as a result of temperature detection of a chiller of a temperature controlling base part. As an aspect, there is provided an electrostatic chuck control method, in which an electrostatic chuck device is provided wherein the device includes a first heater element which is configured with a single or a plurality of main heaters wherein the main heaters control a temperature of an attraction surface of an electrostatic chuck part from a single or a plurality of main heater control regions, and a second heater element which is configured with a plurality of sub-heaters which control a temperature of sub-heater control regions wherein the number of the sub-heater control regions is larger than that of main heater control regions of the first heater element, a switching element is provided in one of, or both of, a space between a DC power source and the sub-heaters and a space between a ground and the sub-heaters, and a predetermined pulse voltage is applied to the sub-heaters when pulse voltage is cyclically applied to the sub-heaters.

Advantageous Effects of Invention

According to an aspect of the electrostatic chuck device according to the present invention, the high frequencies which are generated from the high frequency generating electrode are cut off by the guard electrode, and thus the influence on the main heater can be suppressed. Therefore, it is possible to suppress the influence of the high frequency on the heater power source which is connected to the main heater and remove the high frequency cut-off filter for the main heater. That is, complication of the configuration of the electrostatic chuck device is avoided, and this contributes to a reduction in the manufacturing cost of the electrostatic chuck device.

Further, according to an aspect of the electrostatic chuck device according to the present invention, the temperature distribution of each zone divided by a plurality of main heaters can be individually controlled and the temperature control in each zone can be finely adjusted by the sub-heater made such that a calorific value per unit area is smaller than that of the main heater.

For this reason, even if a partial temperature distribution occurs in the plate-shaped sample due to variation in plasma generation state or film forming condition while holding the plate-shaped sample, it is possible to suppress the temperature distribution by the fine adjustment of a temperature by the sub-heater. Therefore, if etching or film formation processing is performed while holding the plate-shaped sample by the electrostatic chuck device according to the present invention, this contributes to improvement in the uniformity of an etching rate and contributes to the control of a local etching rate and improvement in stability of the film formation.

Further, a metal plate is provided between the second heater element configured with a plurality of sub-heaters and the high frequency generating electrode. For this reason, the second heater element is not affected by a high frequency. That is, it is possible to prevent a high frequency current from leaking to the power source for the sub-heater through the second heater element, and thus it is possible to remove a high frequency cut-off filter for the sub-heater.

Further, according to an aspect of the present invention, it is possible to accurately perform temperature control using a heater in the electrostatic chuck device.

DESCRIPTION OF EMBODIMENTS

Hereinafter, the present invention will be described based on embodiments shown in the accompanying drawings.

The embodiments are for specifically describing the present invention in order to make the gist of the invention better understood and are not limit the present invention unless otherwise specified.

First Embodiment

Figure 1:
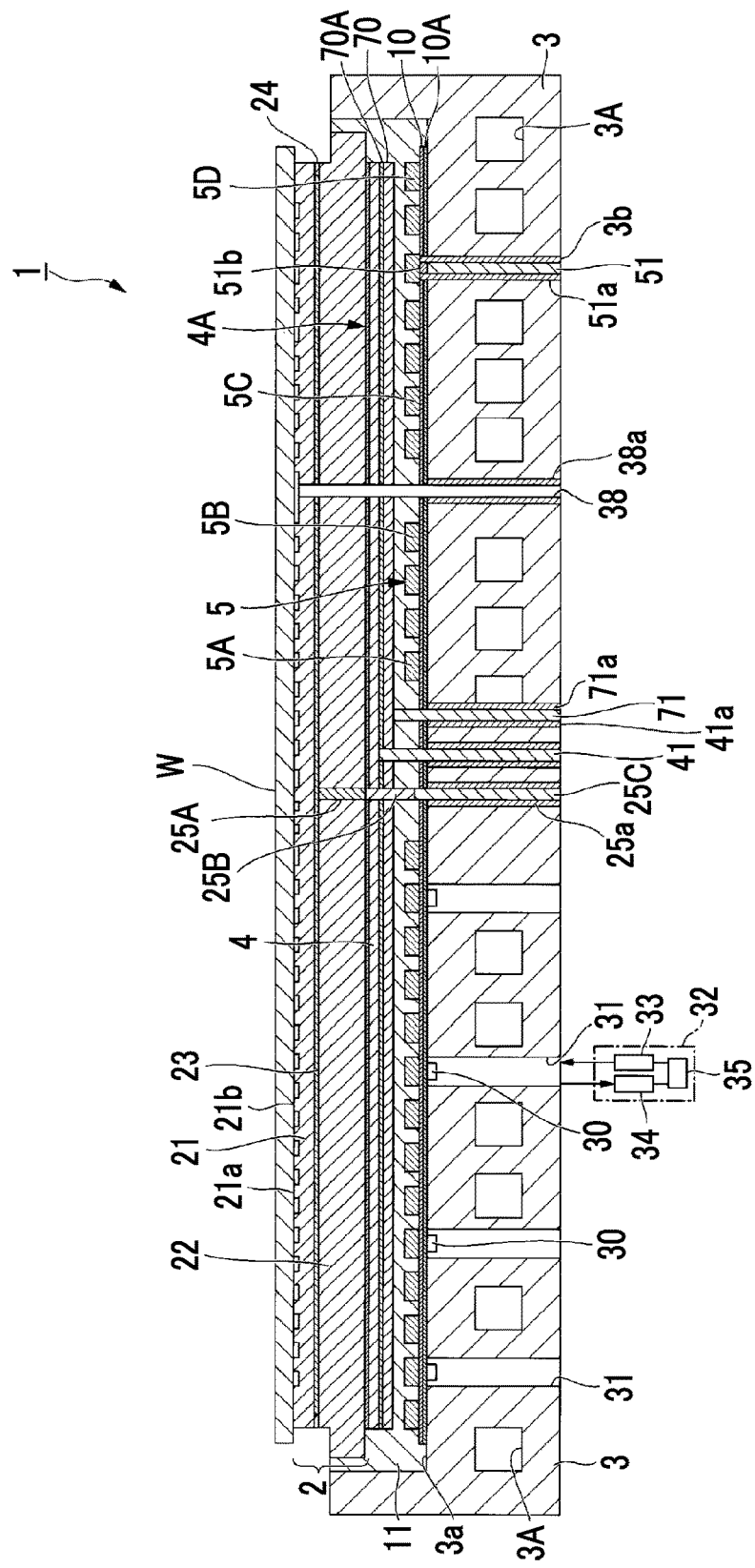
FIG. 1 is a cross-sectional view showing an electrostatic chuck device according to a first embodiment of the present invention.

FIG. 1 is a cross-sectional view showing an electrostatic chuck device according to a first embodiment of the present invention. An electrostatic chuck device 1 of this embodiment has a disk-shaped electrostatic chuck part 2 having a mounting surface on one principal surface (an upper surface) side thereof, a thick disk-shaped temperature controlling base part 3 which is provided below the electrostatic chuck part 2 to adjust the temperature of the electrostatic chuck part 2 to a desired temperature, a high frequency generating electrode 4 interposed between the electrostatic chuck part 2 and the temperature controlling base part 3, a high frequency power source (not shown) connected to the high frequency generating electrode, a first heater element 5 configured with a plurality of main heaters disposed in a layer between the high frequency generating electrode 4 and the temperature controlling base part 3, and a guard electrode 70 disposed in a layer between the high frequency generating electrode 4 and the first heater element 5.

Further, the electrostatic chuck device 1 is configured to include an adhesion layer 4A which sticks the high frequency generating electrode 4 to the bottom surface side of the electrostatic chuck part 2, an adhesion layer 70A which sticks the guard electrode 70 to the high frequency generating electrode 4, an insulation plate 10 which electrically separates the first heater element 5 from the temperature controlling base part 3, and an adhesive layer 11 formed to cover the peripheries of these elements. Further, the electrostatic chuck device 1 is configured to include a high frequency power source (not shown) connected to the high frequency generating electrode 4 through a power supply terminal 41.

The electrostatic chuck part 2 is configured of a mounting plate 21 having an upper surface serving as a mounting surface 21a on which a plate-shaped sample W such as a semiconductor wafer is mounted, a supporting plate 22 which is integrated with the mounting plate 21 and supports the bottom portion side of the mounting plate 21, an electrode for electrostatic attraction (an internal electrode for electrostatic attraction) 23 provided between the mounting plate 21 and the supporting plate 22, an insulating material layer 24 which insulates the periphery of the electrode for electrostatic attraction 23, and an extraction electrode terminal 25A which is provided so as to penetrate the supporting plate 22 and applies a direct-current voltage to the electrode for electrostatic attraction 23.

The mounting plate 21 and the supporting plate 22 have disk shapes in which the shapes of the superimposed surfaces are the same, and each of the mounting plate 21 and the supporting plate 22 is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

A plurality of protrusion portions 21b each having a diameter smaller than the thickness of a plate-shaped sample are formed at predetermined intervals on the mounting surface 21a of the mounting plate 21, and these protrusion portions 21b support the plate-shaped sample W.

The total thickness including the mounting plate 21, the supporting plate 22, the electrode for electrostatic attraction 23, and the insulating material layer 24, that is, the thickness of the electrostatic chuck part 2 is formed to be 0.7 mm or more and 5.0 mm or less, as an example.

For example, if the thickness of the electrostatic chuck part 2 falls below 0.7 mm, it becomes difficult to secure the mechanical strength of the electrostatic chuck part 2. If the thickness of the electrostatic chuck part 2 exceeds 5.0 mm, the heat capacity of the electrostatic chuck part 2 becomes large, and thus the thermal responsiveness of the plate-shaped sample W which is mounted thereon deteriorates. That is, the heat transfer in a lateral direction of the electrostatic chuck part increases, and thus it becomes difficult to maintain the in-plane temperature of the plate-shaped sample W at a desired temperature pattern. The thickness of each part described here is an example and is not limited to the above-described range.

The electrode for electrostatic attraction 23 is used as an electrode for an electrostatic chuck for generating electric charges and fixing the plate-shaped sample W with an electrostatic attraction force, and the shape or size thereof is appropriately adjusted according to a use thereof.

The electrode for electrostatic attraction 23 is preferably formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo).

The thickness of the electrode for electrostatic attraction 23 is not particularly limited. However, for example, a thickness of 0.1 μm or more and 100 μm or less can be selected, and a thickness of 5 μm or more and 20 μm or less is more preferable.

If the thickness of the electrode for electrostatic attraction 23 falls below 0.1 μm, it becomes difficult to secure sufficient electric conductivity. If the thickness of the electrode for electrostatic attraction 23 exceeds 100 μm, due to a difference in thermal expansion coefficient between the electrode for electrostatic attraction 23, and the mounting plate 21 and the supporting plate 22, peeling or cracking easily occurs in the joint interfaces between the electrode for electrostatic attraction 23, and the mounting plate 21 and the supporting plate 22.

The electrode for electrostatic attraction 23 having such a thickness can be easily formed by a film formation method such as a sputtering method or a vapor deposition method, or a coating method such as a screen printing method.

The insulating material layer 24 surrounds the electrode for electrostatic attraction 23 so as to protect the electrode for electrostatic attraction 23 from corrosive gas and plasma thereof, joins and integrates a boundary portion between the mounting plate 21 and the supporting plate 22, that is, an outer peripheral portion region except for the electrode for electrostatic attraction 23, and is configured of an insulating material having the same composition or the same main component as the material configuring the mounting plate 21 and the supporting plate 22.

The extraction electrode terminal 25A is a rod-shaped member provided in order to apply a direct-current voltage to the electrode for electrostatic attraction 23, and as a material of the extraction electrode terminal 25A, it is not particularly limited as long as it is a conductive material having excellent heat resistance. However, a material having a thermal expansion coefficient approximated to the coefficients of thermal expansion of the electrode for electrostatic attraction 23 and the supporting plate 22 is preferable, and it is made of a conductive ceramic material such as $Al_2O_3$—$Ta_4C_5$, for example.

The extraction electrode terminal 25A is connected to a conductive adhesion part 25B and a power supply terminal 25C (described later). The conductive adhesion part 25B is made of a silicon-based conductive adhesive having flexibility and electrical resistance, and the power supply terminal 25C is made of a metal material such as tungsten (W), tantalum (Ta), molybdenum (Mo), niobium (Nb), or a kovar alloy.

An insulator 25a having insulating properties is provided on the outer periphery side of the power supply terminal 25C, and the power supply terminal 25C is insulated from the temperature controlling base part 3 made of metal, by the insulator 25a. The extraction electrode terminal 25A is joined to and integrated with the supporting plate 22, and the mounting plate 21 and the supporting plate 22 are joined to and integrated with each other by the electrode for electrostatic attraction 23 and the insulating material layer 24, whereby the electrostatic chuck part 2 is configured.

The power supply terminal 25C is provided so as to penetrate a through-hole 3b of the temperature controlling base part 3 which will be described in detail later.

The temperature controlling base part 3 is a member for adjusting the temperature of the electrostatic chuck part 2 to a desired temperature and has a thick disk shape. As the temperature controlling base part 3, for example, a water-cooled base or the like, in which a flow path 3A for circulating water is formed in the interior thereof, is suitable.

As a material configuring the temperature controlling base part 3, it is not particularly limited as long as it is metal which is excellent in thermal conductivity, electric conductivity, and workability, or a compound material which includes the metal, and for example, aluminum (Al), an aluminum alloy, copper (Cu), a copper alloy, stainless steel (SUS), or the like is suitably used. It is preferable that at least the surface which is exposed to plasma, of the temperature controlling base part 3, is subjected to alumite treatment or has an insulating film such as alumina formed thereon.

In the structure of this embodiment, a recess portion 3a having a size capable of accommodating the insulation plate 10, the first heater element 5, the guard electrode 70, the high frequency generating electrode 4, and the bottom surface side of the electrostatic chuck part 2 is formed on the upper surface side of the temperature controlling base part 3. An adhesion layer 10A, the insulation plate 10, the first heater element 5, the guard electrode 70, the adhesion layer 70A, the high frequency generating electrode 4, the adhesion layer 4A, and the bottom portion side of the supporting plate 22 are accommodated in this order from the bottom portion side in the recess portion 3a, and they are integrated by the adhesive layer 11 formed so as to fill the recess portion 3a.

The insulation plate 10 is bonded to the upper surface of the recess portion 3a by the adhesion layer 10A. The adhesion layer 10A is made of a sheet-shaped or film-shaped adhesive resin having heat resistance and insulating properties, such as polyimide resin, silicon resin, or epoxy resin. The adhesion layer is formed to have a thickness in a range of about 5 to 100 μm, for example. The insulation plate 10 is made of a thin plate, a sheet, or a film of resin having heat resistance, such as polyimide resin, epoxy resin, or acrylic resin. Each of the adhesion layers 4A and 70A is configured with a sheet type adhesive layer having heat resistance and is made of the same material as the adhesion layer 10A.

The insulation plate 10 may be an insulating ceramic plate instead of the resin sheet and may be a thermally sprayed film having insulating properties such as alumina.

The high frequency generating electrode 4 is an electrode for generating a high frequency in order to generate plasma in the apparatus. For example, in a reactive ion etching (RIE) apparatus, by applying high frequency power from a high frequency generating power source to the high frequency generating electrode 4, it is possible to make a gas turn into plasma by causing electric discharge between electrodes facing each other.

The high frequency generating electrode 4 is bonded to the bottom surface side of the supporting plate 22 through the adhesion layer 4A. A high frequency power source (not shown) connected through the power supply terminal 41 is connected to the high frequency generating electrode 4, and thus a configuration capable of applying high frequency power to the high frequency generating electrode 4 is made. The power supply terminal 41 is covered with an insulator 41a in order to maintain insulation from the temperature controlling base part 3.

It is preferable that a material for formation of the high frequency generating electrode 4 is a non-magnetic metal material. The material for formation of the high frequency generating electrode 4 is formed of non-magnetic metal, whereby even if the electrostatic chuck device 1 is used in a high frequency atmosphere, it is possible to suppress self-heating of the high frequency generating electrode 4 due to a high frequency. Therefore, even in a high frequency atmosphere, it becomes easy to maintain the in-plane temperature of the plate-shaped sample at a desired constant temperature or constant temperature pattern.

It is preferable that the material for formation of the high frequency generating electrode 4 has a thermal expansion coefficient of $4 \times 10^{-6}$/K or more and $10 \times 10^{-6}$/K or less.

If the thermal expansion coefficient is within the above range, it is possible to further suppress occurrence of peeling of the joint interface between the electrostatic chuck part and the high frequency generating electrode 4 due to a difference in thermal expansion coefficient.

At a place where peeling has occurred in the joint interface and a place where peeling has not occurred, a difference occurs in heat transference between the electrostatic chuck part and the high frequency generating electrode, and thus it becomes difficult to maintain temperature uniformity in the surface of the electrostatic chuck part.

It is preferable that the thickness of the high frequency generating electrode 4 is 20 μm or more and 1000 μm or less. If the thickness of the high frequency generating electrode 4 is too thick, the heat capacity becomes too large, and thus the thermal responsiveness of the plate-shaped sample W which is placed on the electrostatic chuck device deteriorates. Further, if the thickness of the high frequency generating electrode 4 is too thin, unevenness of heat generation of the high frequency generating electrode and unevenness of an electric field occur, thereby affecting the uniformity of plasma.

The first heater element 5 is disposed in a layer between the high frequency generating electrode 4 and the temperature controlling base part 3.

Figure 2:
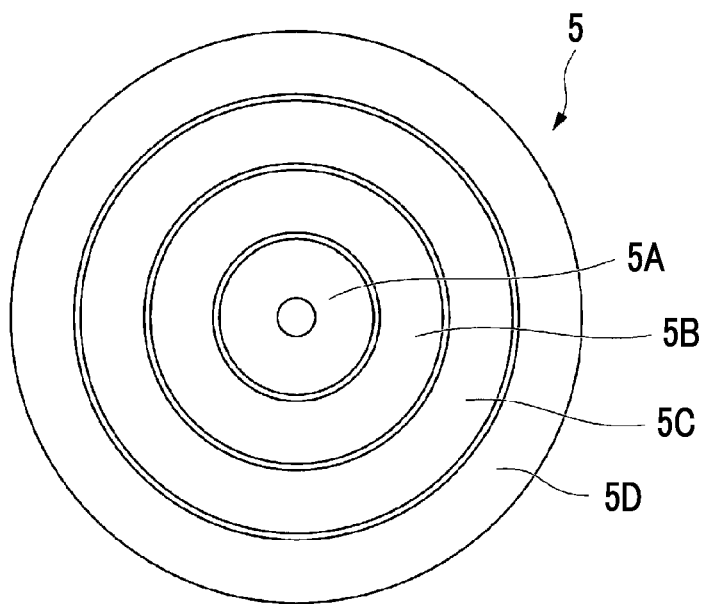
FIG. 2 is a plan view showing an example of a pattern of a main heater element which is provided in the electrostatic chuck device according to the first embodiment of the present invention.

The first heater element 5 is configured with a first main heater 5A disposed in an annular region of a central portion, and a second main heater 5B, a third main heater 5C, and a fourth main heater 5D disposed in annular regions so as to sequentially surround the first main heater 5A, as shown in FIG. 2. It is preferable that an area in which the first to fourth main heaters 5A to 5D are disposed as shown in FIG. 2 has approximately the same size as the disk-shaped electrostatic chuck part 2.

In FIG. 2, each of the main heaters 5A, 5B, 5C, and 5D is drawn in a simple annular shape when viewed in a planar view. However, each of the main heaters 5A, 5B, 5C, and 5D is disposed so as to occupy an annular region shown in FIG. 2 by meandering a strip-shaped heater. For this reason, in the cross-sectional structure shown in FIG. 1, strip-shaped heaters configuring the respective main heaters 5A, 5B, 5C, and 5D are individually drawn. Further, the first heater element 5 has a structure in which it is divided into four portions in the radial direction thereof to form the four main heaters 5A to 5D. However, the number of divided portions of the first heater element 5 is not limited to four and may be any number.

As an example, each of the main heaters 5A to 5D is obtained by processing a non-magnetic metal thin plate, for example, a titanium (Ti) thin plate, a tungsten (W) thin plate, a molybdenum (Mo) thin plate, or the like, having a constant thickness of 0.2 mm or less, preferably, about 0.1 mm, into a desired heater shape by a photolithography method, for example, processing an entire contour of a meandering shape of a strip-shaped heater into an annular shape.

These main heaters 5A to 5D are fixed to the temperature controlling base part 3 through the insulation plate 10 having a uniform thickness and having heat resistance and insulating properties.

The first heater element 5 is configured with the main heaters 5A, 5B, 5C, and 5D, and a plurality of power supply terminals 51 for feeding electric power to these individual main heaters 5A, 5B, 5C, and 5D are provided and connected to a heater power source (a positive electrode) for heating the main heaters. In FIG. 2, only the schematic shapes of the main heaters 5A, 5B, 5C, and 5D are shown. However, in any heater, conduction parts for connecting it to a power supply are provided on one end side and the other end side of each heater. For this reason, two power supply terminals 51 are provided for each of the main heaters 5A, 5B, 5C, and 5D, and a total of eight power supply terminals 51 are provided.

In FIG. 1, for simplification of description, one power supply terminal 51 connected to the outermost peripheral main heater 5D is drawn. The power supply terminal 51 is disposed so as to partially penetrate the temperature controlling base part 3 and the insulation plate 10 in the thickness direction thereof. Further, a tubular insulator 51a for insulation is mounted on the outer peripheral surface of the power supply terminal 51, and thus the temperature controlling base part 3 and the power supply terminal 51 are insulated from each other. Further, the power supply terminal 51 is bonded to the first heater element 5 through an adhesion part 51b.

As a material configuring the power supply terminal 51, the same material as the material configuring the power supply terminal 25C described above can be used.

The guard electrode 70 is provided between the first heater element 5 and the high frequency generating electrode 4. For this reason, the high frequency generated from the high frequency generating electrode 4 can be cut off. That is, it is possible to suppress the influence of the high frequency on the main heaters configuring the first heater element 5. Therefore, a high frequency being applied as noise to a heater power source for supplying electric power to the main heaters is suppressed, and thus a concern that the operation or performance of the heater power source may be impaired is reduced.

Further, the guard electrode 70 cuts off the high frequency, and therefore, it is not necessary to provide a high frequency cut-off filter in the main heater configuring the first heater element 5. That is, it is possible to avoid complication of the configuration of the electrostatic chuck device 1 and reduce the manufacturing cost of the electrostatic chuck device 1.

The guard electrode 70 is bonded to the bottom surface side of the high frequency generating electrode 4 through the adhesion layer 70A. The guard electrode 70 is grounded to the outside through a current-carrying terminal 71. The current-carrying terminal 71 is covered with an insulator 71a in order to maintain insulation from the temperature controlling base part 3.

Figure 3:
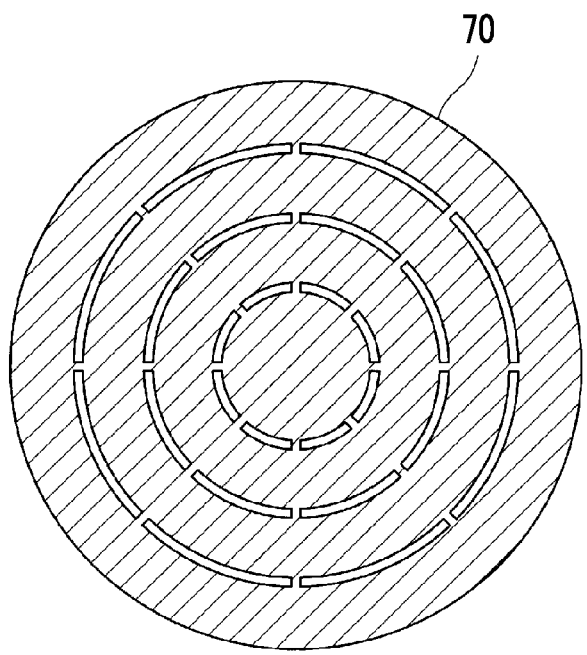
FIG. 3 is a plan view showing an example of a pattern of a guard electrode which is provided in the electrostatic chuck device according to the first embodiment of the present invention.

The guard electrode 70 cuts off the high frequency generated from the high frequency generating electrode 4. It is preferable that the guard electrode has a heat transfer barrier which inhibits heat conduction in the in-plane direction thereof. The heat transfer barrier may be an incision, a groove, or the like provided in the guard electrode, and the inside thereof may be filled with resin or the like having poor thermal conductivity (poorer thermal conductivity than the material configuring the guard electrode). Hereinafter, description will be made based on a case where the heat transfer barrier is an incision, as an example. FIG. 3 is a plan view of the guard electrode 70 which is used in the electrostatic chuck device 1 according to the first embodiment of the present invention.

As shown in FIG. 3, the guard electrode 70 has a plurality of incisions (first heat transfer barriers), each of which is disposed in a circular region along the surface on which the first heater element 5 is disposed, and extends in the circumferential direction of the circular region. Further, in a case where the plurality of main heaters 5A to 5D configuring the first heater element 5 are concentrically disposed in the circular regions, it is preferable that the incision of the guard electrode 70 is provided to planarly overlap the region between the plurality of main heaters 5A to 5D adjacent to each other in the radial direction of the circular region.

The guard electrode 70 has the plurality of incisions extending in the circumferential direction thereof, whereby it is possible to enhance temperature uniformity in the circumferential direction in the guard electrode. In the electrostatic chuck device, heat conduction in a concentric circular direction (the circumferential direction) in the in-plane direction can be permitted. On the other hand, heat conduction in the radial direction can become a factor of impairing temperature uniformity. For this reason, by thermally separating the guard electrode 70 in the radial direction, it is possible to accurately perform the temperature control for each region of the plate-shaped sample.

Further, the incision is provided in the guard electrode 70 in accordance with the heating region of the main heater, whereby the heat applied by the main heaters 5A to 5D spreading in the radial direction due to the heat conduction of the guard electrode 70 can be further suppressed. That is, it is possible to more accurately perform the temperature control for each region of the plate-shaped sample.

As shown in FIG. 3, even in a case where the guard electrode 70 has a heat transfer barrier, it is preferable that the guard electrode 70 is partially connected and electrically integrated. The guard electrode 70 is electrically integrated, whereby it is possible to keep the potential of the guard electrode 70 constant. For this reason, it is also possible to reduce the influence on plasma density.

Such a heat transfer barrier may be provided in the high frequency generating electrode 4. Further, the heat transfer barriers may be provided in both the high frequency generating electrode 4 and the guard electrode 70. The high frequency generating electrode 4 has a plurality of heat transfer barriers (second heat transfer barriers) extending in the circumferential direction thereof, whereby it is possible to enhance temperature uniformity in the circumferential direction in the high frequency generating electrode 4. As described above, in the electrostatic chuck device, heat conduction in the concentric circular direction (the circumferential direction) in the in-plane direction can be permitted. On the other hand, heat conduction in the radial direction can become a factor of impairing temperature uniformity. For this reason, by thermally separating the high frequency generating electrode 4 in the radial direction, it is possible to more accurately perform the temperature control for each region of the plate-shaped sample.

Further, the heat transfer barrier is provided in the high frequency generating electrode 4 in accordance with the heating region of the main heater, whereby the heat applied by the main heaters 5A to 5D spreading in the radial direction due to the heat conduction of the high frequency generating electrode 4 can be further suppressed. That is, it is possible to more accurately perform the temperature control for each region of the plate-shaped sample.

A material for formation of the guard electrode 70 may be a metal material capable of cutting off a high frequency. However, it is preferable that the material is a non-magnetic metal material. The material for formation of the guard electrode 70 is formed of non-magnetic metal, whereby it is possible to suppress heat generation of the guard electrode 70 due to the high frequency which is generated from the high frequency generating electrode 4. Therefore, even in a high frequency atmosphere, it becomes easy to maintain the in-plane temperature of the plate-shaped sample at a desired constant temperature or constant temperature pattern.

It is preferable that the material for formation of the guard electrode 70 has a thermal expansion coefficient of $4\times10^{-6}$/K or more and $10\times10^{-6}$/K or less.

If the thermal expansion coefficient is within the above range, it is possible to further suppress occurrence of peeling or the like of the joint interface between the guard electrode 70 and the high frequency generating electrode 4 due to a difference in thermal expansion coefficient. If peeling occurs in the joint interface, a difference in heat transference occurs between a place where the peeling has occurred and a place where the peeling has not occurred, and thus it becomes difficult to maintain temperature uniformity in the surface.

It is preferable that the thickness of the guard electrode 70 is 20 μm or more and 1000 μm or less. If the thickness of the guard electrode 70 is too thick, the heat capacity becomes too large, and thus the thermal responsiveness of the plate-shaped sample W which is placed on the electrostatic chuck device deteriorates. Further, if the thickness of the guard electrode 70 is too thin, a sufficient high frequency shielding property is not obtained and a problem such as heat generation arises.

A temperature sensor 30 is provided on the lower surface side of each of the main heaters 5A, 5B, 5C, and 5D. In the structure shown in FIG. 1, an installation hole 31 for the temperature sensor 30 is formed so as to partially penetrate the temperature controlling base part 3 in the thickness direction thereof, and the temperature sensor 30 is installed at the uppermost portion of the installation hole 31 and a position close to any one of the main heaters 5A, 5B, 5C, and 5D.

It is preferable that the temperature sensors 30 are installed at positions as close to the main heaters 5A, 5B, 5C, and 5D as possible.

Further, the temperature sensor 30 is not affected by the temperature of the temperature controlling base, and therefore, it is preferable that the surface on one side of the temperature sensor is bonded to the heater side through an insulating layer and the surface on the other side is not in contact with a cooling base or the temperature sensor 30 is sufficiently small (⅕ or less, more preferably 1/10) as compared with the heat transfer coefficients of the heater and the temperature sensor 30.

The temperature sensor 30 is a fluorescent emission type temperature sensor in which a phosphor layer is formed on the upper surface side of a rectangular parallelepiped-shaped light transmission body made of quartz glass or the like, as an example, and the temperature sensor 30 is bonded to the lower surface of each of the main heaters 5A, 5B, 5C, and 5D by a silicon resin-based adhesive or the like having translucency and heat resistance.

The phosphor layer is made of a material which generates fluorescence in response to heat generation from the main heater, and a wide variety of fluorescent materials can be selected as long as it is a material generating fluorescence in response to heat generation. However, as an example, a material appropriately selected from a fluorescent material to which a rare earth element having an energy level suitable for light emission is added, a semiconductor material such as AlGaAs, a metal oxide such as a magnesium oxide, and a mineral such as ruby or sapphire can be used.

The temperature sensors 30 corresponding to the main heaters 5A, 5B, 5C, and 5D are respectively provided at positions which do not interfere with the power supply terminal and the like and at arbitrary positions in the circumferential direction of the lower surfaces of the main heaters 5A, 5B, 5C, and 5D.

A temperature measurement unit 32 which measures the temperatures of the main heaters 5A to 5D from the fluorescence of these temperature sensors 30 is configured of an excitation unit 33 which irradiates the phosphor layer with excitation light on the outside (the lower side) of the installation hole 31 of the temperature controlling base part 3, a fluorescence detector 34 which detects the fluorescence emitted from the phosphor layer, and a control part 35 which controls the excitation unit 33 and the fluorescence detector 34 and calculates the temperature of the main heater on the basis of the fluorescence, as shown in FIG. 1, as an example.

Incidentally, in FIG. 1, a reference numeral 38 denotes a pin insertion hole provided so as to partially penetrate from the temperature controlling base part 3 to the mounting plate 23 in the thickness direction thereof, and a lift pin for removal of the plate-shaped sample is provided in the pin insertion hole 38. A tubular insulator 38a is provided on the outer peripheral portion of the pin insertion hole 38.

In the electrostatic chuck device 1 having the configuration described above, it is preferable that the heat transfer coefficient between the first heater element 5 and the temperature controlling base part 3 is smaller than 4000 W/m²K and larger than 200 W/m²K.

If the heat transfer coefficient is larger than 200 W/m²K, it is possible to increase the thermal responsiveness between the first heater element 5 and the temperature controlling base part 3, and thus in a case of performing the temperature control of the electrostatic chuck device 1, temperature control with good responsiveness becomes possible.

In a case where the heat transfer coefficient is larger than 4000 W/m²K, outflow of heat from the heater part to the temperature controlling base increases, and thus it is necessary to supply excessive electric power to the heater in order to raise the temperature of the mounted object (the plate-shaped sample) W to a predetermined temperature, and thus it is not preferable.

The electrostatic chuck device 1 configured as described above can be used to attract the plate-shaped sample W onto the protrusion portions 21b of the mounting surface 21a by generating an electrostatic attraction force by feeding electric power from the power supply terminal 25C to the electrode for electrostatic attraction 23 of the electrostatic chuck part 2.

Further, the plate-shaped sample W can be cooled by circulating a refrigerant in the temperature controlling base part 3, and temperature control can be performed by heating the plate-shaped sample W by causing the main heaters 5A to 5D to individually generate heat by feeding electric power from the power supply to each of the main heaters 5A to 5D through the power supply terminal 51.

The electrostatic chuck device 1 uses the above-described configuration, whereby even in a structure having a plurality of divided heaters, uniform temperature control of zones which are heated by the respective heaters can be realized with a simple configuration. Further, with the configuration, a high frequency cut-off filter for the first heater element 5 becomes unnecessary, and thus it is possible to avoid complication of the configuration of the electrostatic chuck device 1 and reduce the manufacturing cost of the electrostatic chuck device 1.

Second Embodiment

Figure 4:
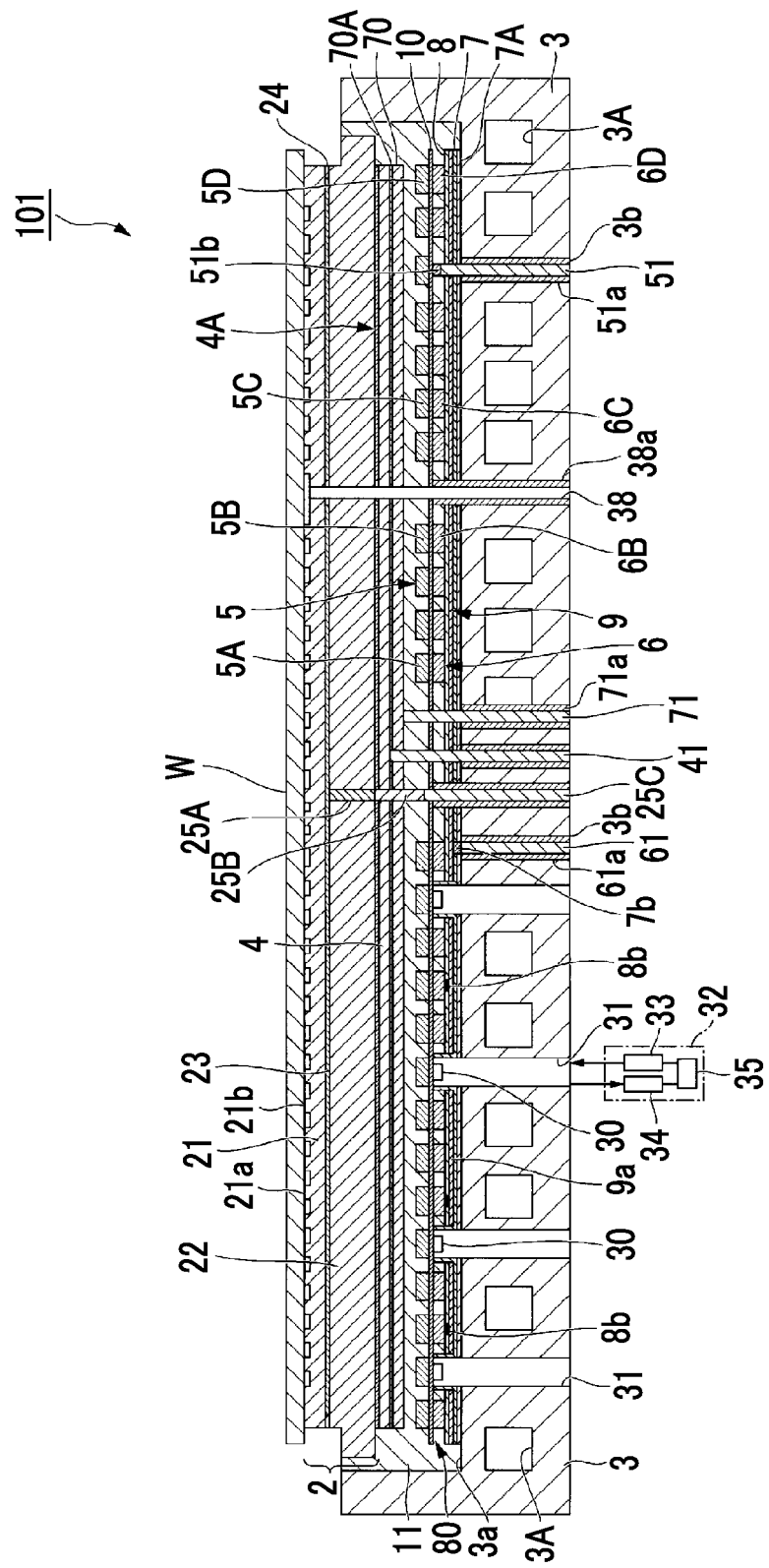
FIG. 4 is a cross-sectional view showing an electrostatic chuck device according to a second embodiment of the present invention.

FIG. 4 is a cross-sectional view showing an electrostatic chuck device according to a second embodiment of the present invention. An electrostatic chuck device 101 of this embodiment is different from the electrostatic chuck device of the first embodiment in that the electrostatic chuck device 101 is provided with a second heater element between the first heater element 5 and the temperature controlling base part 3. Further, insulation plates 7 and 8, a wiring layer 9 interposed between the insulation plates 7 and 8, and an adhesion layer 7A for bonding the insulation plate 7 to the temperature controlling base part 3 are disposed associated with the provision of the second heater element.

Figure 5:
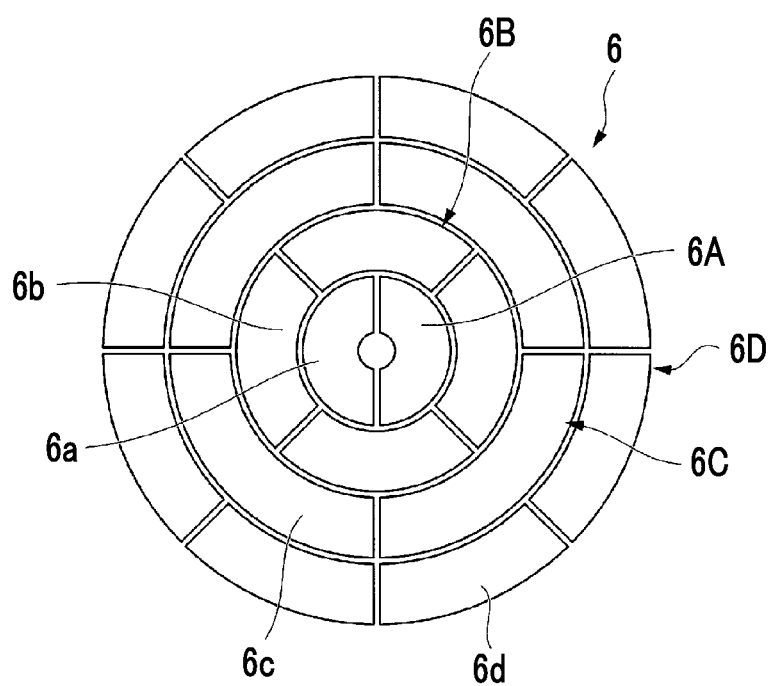
FIG. 5 is an explanatory diagram showing a state where a surface temperature distribution of a plate-shaped sample supported by the electrostatic chuck device according to the second embodiment of the present invention is examined by a thermo-camera.

In FIG. 5, a second heater element 6 is disposed in a layer between the first heater element 5 and the temperature controlling base part 3. On the other hand, the second heater element 6 may be disposed between the first heater element 5 and the guard electrode 70. In any case, the guard electrode 70 cuts off the high frequency which is generated from the high frequency generating electrode 4. Therefore, the high frequency being applied as noise to the main heaters configuring the first heater element and sub-heaters configuring the second heater element is suppressed, and thus a concern that the operation or performance of the heater power source may be impaired is reduced. Therefore, it is not necessary to provide a high frequency cut-off filter for the main heater and the sub-heater. For this reason, it is possible to avoid complication of the configuration of the electrostatic chuck device 101 and reduce the manufacturing cost of the electrostatic chuck device 101.

The second heater element 6 is configured with a first sub-heater 6A disposed in an annular region of a central portion, and a second sub-heater 6B, a third sub-heater 6C, and a fourth sub-heater 6D disposed in annular regions so as to sequentially surround the first sub-heater 6A, as shown in FIG. 5.

The first sub-heater 6A is annularly formed by combining a plurality of (in the case of the configuration of FIG. 5, two) heater split bodies 6a disposed in regions each having a fan-shaped annular body shape, and the second sub-heater 6B is annularly formed by combining a plurality of (in the case of the configuration of FIG. 5, four) heater split bodies 6b disposed in regions each having a fan-shaped annular body shape. The third sub-heater 6C is annularly formed by combining a plurality of (in the case of the configuration of FIG. 5, four) heater split bodies 6c disposed in regions each having a fan-shaped annular body shape. The fourth sub-heater 6D is annularly formed by combining a plurality of (in the case of the configuration of FIG. 5, eight) heater split bodies 6d disposed in regions each having a fan-shaped annular body shape.

Each of the heater split bodies 6a to 6d is obtained by processing a non-magnetic metal thin plate, for example, a molybdenum (Mo) thin plate, a tungsten (W) thin plate, a niobium (Nb) thin plate, a titanium (Ti) thin plate, a copper (Cu) thin plate, or the like, which is thinner than the main heaters 5A to 5D, into a desired heater shape by a photolithography method, for example, processing an entire contour of a meandering shape of a strip-shaped heater into a fan-shaped annular body shape.

It is preferable that each of these heater split bodies 6a to 6d has a configuration exhibiting a calorific value lower than the calorific value per unit area of each of the main heaters 5A to 5D, and it is preferable that each of these heater split bodies 6a to 6d is configured into a thinner structure than each of the main heaters 5A to 5D, or configured of a material having a low amount of heat generation. As an example, in a case where the main heater is configured of a Ti thin plate having a thickness of 100 μm, the sub-heater can be configured of a Mo thin plate having a thickness of 5 μm.

These heater split bodies 6a to 6d are bonded and fixed to the upper surface of the insulation plate 8 by an adhesive layer (not shown) made of a sheet-shaped or film-shaped silicon resin, acrylic resin, or the like having a uniform thickness and having heat resistance and insulating properties.

In this embodiment, the sub-heaters 6A, 6B, 6C, and 6D have two-, four-, and eight-division structures. However, the number of divisions may be arbitrary, and a shape in a case of being divided may also be arbitrary.

In a case of having the second heater element 6, like the electrostatic chuck device 101, it is preferable that the first heat transfer barrier which is formed in the guard electrode 70 and the second heat transfer barrier which is formed in the high frequency generating electrode 4 are provided so as to planarly overlap the region between a plurality of main heaters adjacent to each other and the region between a plurality of sub-heaters adjacent to each other.

Next, the heater split bodies configuring the sub-heaters 6A to 6D and a structure for individually feeding electric power to the heater split bodies will be described.

The sub-heaters 6A to 6D have collective structures of a plurality of heater split bodies 6a, 6b, 6c, and 6d obtained by individually dividing the respective sub-heaters 6A to 6D in the circumferential direction thereof, as shown in FIG. 5, when viewed in a planar view. In order to feed electric power to the heater split bodies 6a, 6b, 6c, and 6d, in this embodiment, the wiring layer 9 made of a low resistance material such as copper is provided on the upper surface side of the insulation plate 7.

The wiring layer 9 is configured with a plurality of wiring bodies 9a branched individually, and each of the wiring bodies 9a is connected to any one of the heater split bodies 6a, 6b, 6c, and 6d.

In FIG. 4, the plurality of wiring bodies 9a are disposed on the upper surface side of the insulation plate 7 so as to extend from the central portion side thereof to the peripheral edge side, and one end side of each of the wiring bodies 9a is connected to any one of the heater split bodies through a conduction part 8b such as a welded part formed in a contact hole formed in a part of the insulation plate 8. Further, the other end side of each of the wiring bodies 9a is connected to a power supply terminal 61 through a conduction part 7b such as a welded part formed in a contact hole formed in a part of the insulation plate 7. The power supply terminal 61 is formed so as to penetrate the temperature controlling base part 3 in the thickness direction thereof along the through-hole 3b of the temperature controlling base part 3 and reach the insulation plate 7, and an insulator 61a for insulation is provided on the outer periphery side of the power supply terminal 61 such that the power supply terminal 61 is insulated from the temperature controlling base part 3.

The plurality of heater split bodies 6a, 6b, 6c, and 6d are formed in the circumferential direction of the sub-heaters 6A, 6B, 6C, and 6D, and therefore, the power supply terminals 61 to be connected to the heater split bodies are disposed at positions spaced apart from each other in the circumferential direction of the temperature controlling base part 3 such that the power supply terminals 61 do not interfere with each other, and the heater split bodies 6a, 6b, 6c, and 6d are individually connected by using the individual wiring bodies 9a.

In order to individually feed electric power to the heater split bodies 6a, 6b, 6c, and 6d, two power supply terminals 61 are connected to each heater split body. However, in the cross-sectional structure shown in FIG. 4, only a part is shown and the connection structure of the other wiring body 9a is abbreviated as appropriate.

The two power supply terminals 61 are connected to each of the heater split bodies 6a, 6b, 6c, and 6d, and a switch element and a power source device are connected to each of the heater split bodies 6a, 6b, 6c, and 6d through the two power supply terminals 61.

With the configuration described above, with respect to each of the heater split bodies 6a, 6b, 6c, and 6d, energization and heat generation control can be performed according to the operation of the switch element and the power supply. With respect to the operation of the switching element and the power supply, the number of switching elements, the number of positive electrodes, and the number of negative electrodes merely differ according to a difference in the first heater element 5 and the number of resistors, and the operation can be performed with the same configuration.

The number of power supply terminals 61 of the sub-heaters 6A to 6D can be less than twice the number of heater split bodies due to the heater pattern and the disposition of the switch element.

If the plate-shaped sample W is supplied to an etching apparatus or a film forming apparatus and exposed to a plasma atmosphere or a film formation atmosphere, a temperature difference occurs in the plate-shaped sample W according to a plasma generation state, a temperature distribution in a film formation chamber, or the like.

Figure 6:
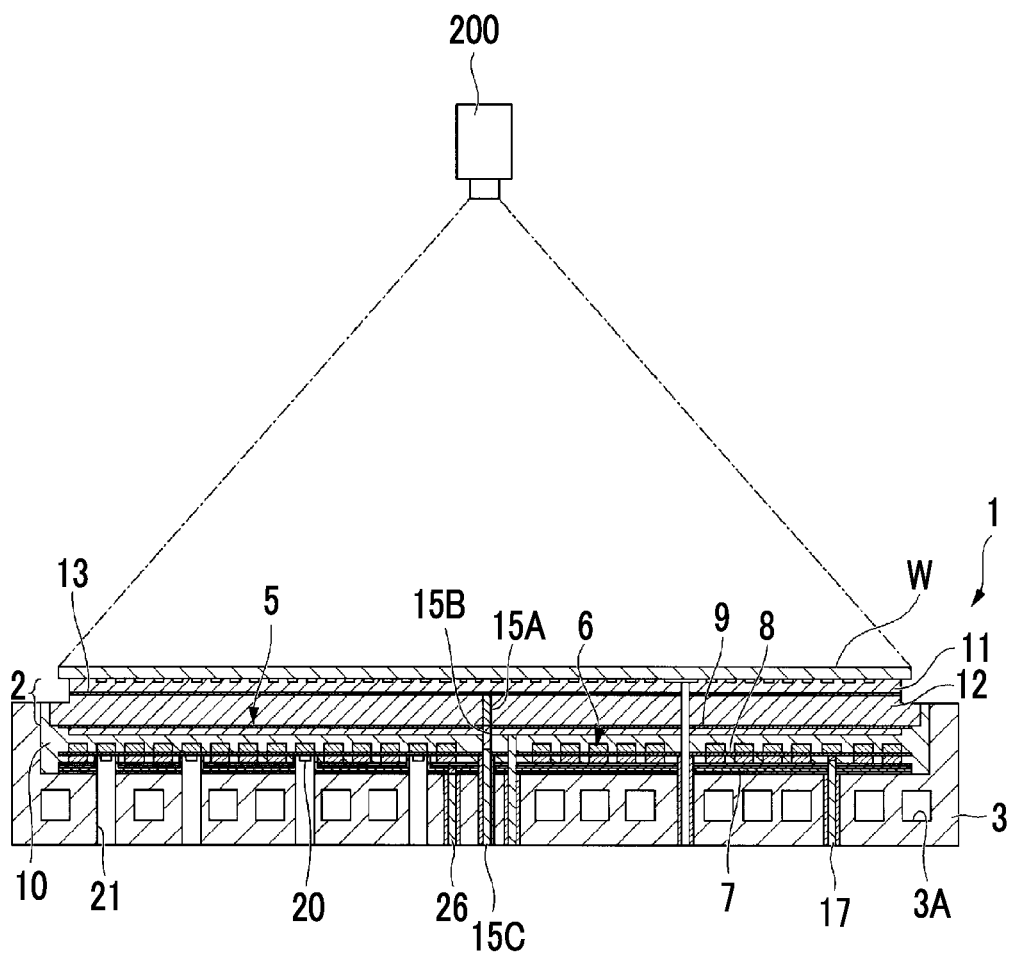
FIG. 6 is a plan view showing an example of a pattern of a sub-heater element which is provided in the electrostatic chuck device according to the second embodiment of the present invention.

For example, as shown in FIG. 6, a temperature distribution in the surface of the plate-shaped sample W is photographed by a thermo-camera 200 and analyzed by a thermograph, and then, if a region having a low temperature is generated in the plate-shaped sample W, the surface temperature of the plate-shaped sample W can be uniformized by locally raising the surface temperature of each corresponding zone of the plate-shaped sample W above the individual regions of the heater split bodies 6a, 6b, 6c, and 6d by energizing and heating any one of the heater split bodies 6a, 6b, 6c, and 6d in the corresponding region.

Temperature control at the time of heating can be performed by application voltage control, voltage application time control, current value control, or the like when energizing each of the heater split bodies 6a, 6b, 6c, and 6d.

In the structure described above, a configuration is made such that the second heater element 6 is divided into a plurality of heater split bodies 6a, 6b, 6c, and 6d and the energization and heat generation control can be performed individually, and therefore, even in a case where a temperature distribution occurs in the attracted plate-shaped sample W, the temperature distribution can be uniformized by raising the temperature of a low-temperature zone of the plate-shaped sample W by energizing any one of the heater split bodies 6a, 6b, 6c, and 6d at a position corresponding to the low-temperature zone to generate heat.

For this reason, in a case where the plate-shaped sample W is held by the electrostatic chuck device 101 for plasma etching, film formation, or the like, the surface temperature of the plate-shaped sample W is uniformized by the individual temperature control of the heater split bodies 6a to 6d, whereby uniform etching or uniform film formation can be performed.

Further, by reducing the calorific value per unit area of each of the heater split bodies 6a, 6b, 6c, and 6d with respect to the main heaters 5A to 5D, it is possible to reduce the energization amount of each of the heater split bodies 6a, 6b, 6c, and 6d for temperature fine adjustment. Further, the energization amount of each of the heater split bodies 6a, 6b, 6c, and 6d can be reduced, and therefore, the power supply amount can be reduced, for example, by using a pulse current as the energizing current of the heater split bodies 6a, 6b, 6c, and 6d.

In the structure described above, the thickness of each of the main heaters 5A to 5D and the thickness of each of the heater split bodies 6a, 6b, 6c, and 6d can be freely selected at the time of manufacturing, and therefore, it is possible to individually set the withstand voltage according to each heater and each wiring and it is possible to set a desirable individual withstand voltage value for each heater and each wiring. For example, by setting the thickness of the main heater made of a Ti thin plate to be 100 μm and setting the thickness of the heater split body made of a Mo thin plate to be 5 μm, as an example, it is possible to adjust the calorific value per unit area of the heater split body to ⅕ or less of that of the main heater. Of course, the adjustment of the calorific value of the main heater and the heater split body may be performed by the adjustment of a supply voltage, in addition to the constituent material and the heater thickness.

Incidentally, in the structure of the second embodiment, a structure is made in which the first heater element 5 is divided into four portions in the radial direction thereof to form the four main heaters 5A to 5D. However, the number of divided portions of the first heater element 5 is not limited to four and may be any number. Further, with respect to the second heater element 6, the second heater element 6 is divided into four portions in the radial direction to form the four sub-heaters 6A to 6D, the first sub-heater 6A has a two-division structure, the second sub-heater 6B has a four-division structure, the third sub-heater 6C has a four-division structure, and the fourth sub-heater 6D has an eight-division structure. However, the number of divided portions of the second heater element 6 in the radial direction may be any number, and the number of divided portions of each sub-heater may also be any number. However, from the viewpoint of performing local temperature fine adjustment by the sub-heaters, it is preferable that the number of divided portions of the second heater element 6 is larger than the number of divided portions of the first heater element 5.

In this embodiment, the second heater element 6 has a single layer structure. However, the second heater element 6 may have a multilayer structure formed of two or more layers. Further, in this embodiment, the first heater element 5 and the second heater element 6 are disposed at regions overlapping in an annular shape when viewed in a planar view. However, they may be disposed at positions slightly deviated from overlapping regions when viewed in a planar view. For example, it is also possible to dispose the plurality of sub-heaters of the second heater element so as to fill slight gaps formed between the plurality of main heater installation regions (annular installation regions) configuring the first heater element 5 when viewed in a planar view, thereby filling the gap regions between the plurality of main heaters with the plurality of sub-heaters. Of course, in a case where two or more layers of second sub-heaters are disposed, a structure may be adopted in which the gap between the main heaters is filled by shifting the disposition region of each layer when viewed in a planar view.

The electrostatic chuck device 101 uses the above-described configuration, whereby the electrostatic chuck device 101 can be provided in which even in a structure having a plurality of divided heaters, it is possible to perform uniform temperature control of zones which are heated by the respective heaters. Further, due to the guard electrode 70, high frequency cut-off filters for the main heater and the sub-heater configuring the first heater element 5 and the second heater element 6 are unnecessary, and thus it is possible to avoid complication of the configuration of the electrostatic chuck device 101 and reduce the manufacturing cost of the electrostatic chuck device 101.

Third Embodiment

Figure 7:
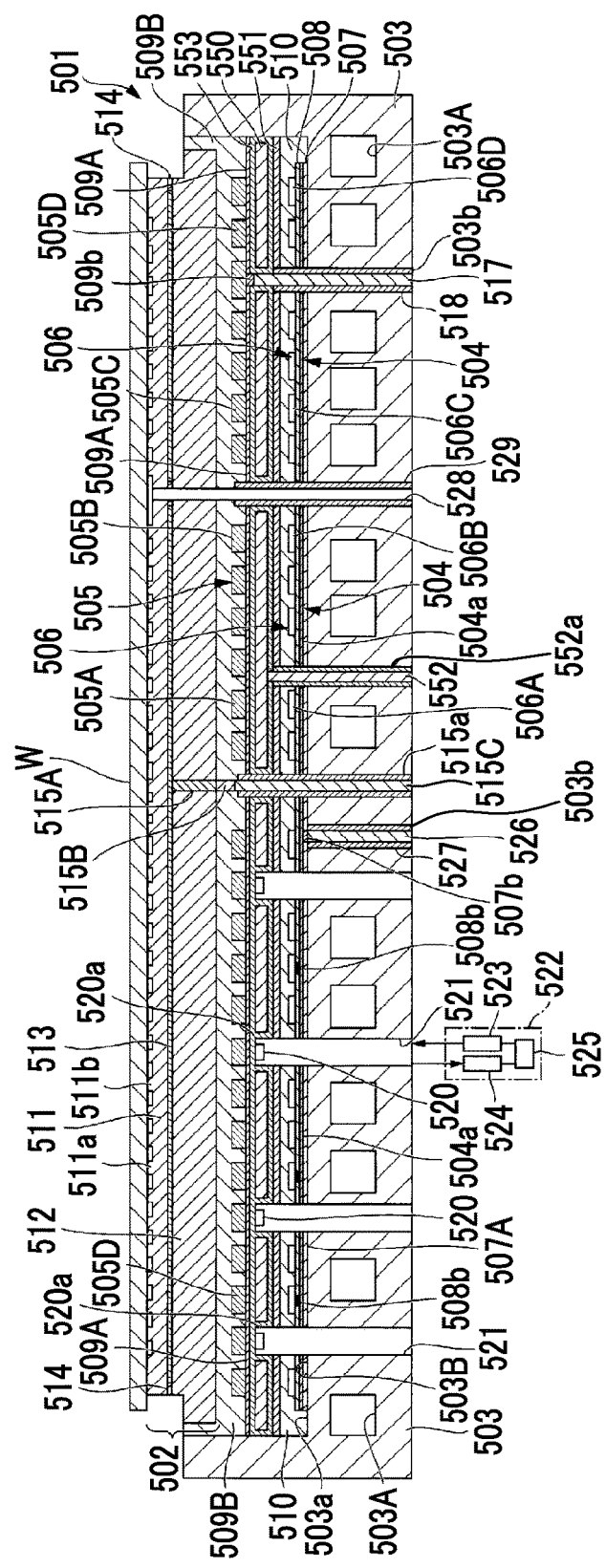
FIG. 7 is a cross-sectional view showing an electrostatic chuck device according to a third embodiment of the present invention.

FIG. 7 is a cross-sectional view showing an electrostatic chuck device according to a third embodiment of the present invention. An electrostatic chuck device 501 of this embodiment is provided with a disk-shaped electrostatic chuck part 502 having a mounting surface on one principal surface (an upper surface) side thereof, a thick disk-shaped temperature controlling base part 503 which is provided below the electrostatic chuck part 502 to adjust the temperature of the electrostatic chuck part 502 to a desired temperature, a high frequency generating electrode 550 having a layered structure and interposed between the electrostatic chuck part 502 and the temperature controlling base part 503, a first heater element 505 having a layered structure and interposed between the electrostatic chuck part 502 and the high frequency generating electrode 550, a second heater element 506 having a layered structure and interposed between the high frequency generating electrode 550 and the temperature controlling base part 503, and a metal plate 551 interposed between the high frequency generating electrode 550 and the second heater element. Further, the electrostatic chuck device 501 is configured to include an adhesive layer 509B formed to cover the bottom surface side of the electrostatic chuck part 502 and the periphery of the first heater element 505.

The electrostatic chuck part 502 is configured of a mounting plate 511 having an upper surface serving as a mounting surface 511a on which the plate-shaped sample W such as a semiconductor wafer is mounted, a supporting plate 512 which is integrated with the mounting plate 511 and supports the bottom portion side of the mounting plate 511, an electrode for electrostatic attraction (an internal electrode for electrostatic attraction) 513 provided between the mounting plate 511 and the supporting plate 512, an insulating material layer 514 which insulates the periphery of the electrode for electrostatic attraction 513, and an extraction electrode terminal 515A which is provided so as to penetrate the supporting plate 512 and applies a direct-current voltage to the electrode for electrostatic attraction 513.

The mounting plate 511 and the supporting plate 512 have disk shapes in which the shapes of the superimposed surfaces are the same. Each of these plates is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

A plurality of protrusion portions 511b each having a diameter smaller than the thickness of the plate-shaped sample are formed at predetermined intervals on the mounting surface 511a of the mounting plate 511. These protrusion portions 511b support the plate-shaped sample W.

The total thickness including the mounting plate 511, the supporting plate 512, the electrode for electrostatic attraction 513, and the insulating material layer 514, that is, the thickness of the electrostatic chuck part 502 is formed to be 0.7 mm or more and 5.0 mm or less, as an example.

For example, if the thickness of the electrostatic chuck part 502 falls below 0.7 mm, it becomes difficult to secure the mechanical strength of the electrostatic chuck part 502. If the thickness of the electrostatic chuck part 502 exceeds 5.0 mm, the heat capacity of the electrostatic chuck part 502 becomes large. For this reason, the thermal responsiveness of the plate-shaped sample W which is placed thereon deteriorates, and the heat transfer in a lateral direction of the electrostatic chuck part 502 increases. For this reason, it becomes difficult to maintain the in-plane temperature of the plate-shaped sample W at a desired temperature pattern. The thickness of each part described here is an example and is not limited to the above-described range.

The electrode for electrostatic attraction 513 is used as an electrode for an electrostatic chuck for generating electric charges and fixing the plate-shaped sample W with an electrostatic attraction force. The shape or size thereof is appropriately adjusted according to a use thereof.

The electrode for electrostatic attraction 513 is preferably formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, or an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo).

The thickness of the electrode for electrostatic attraction 513 is not particularly limited. However, a thickness of 0.1 µm or more and 100 µm or less can be selected, and a thickness of 5 µm or more and 20 µm or less is more preferable.

If the thickness of the electrode for electrostatic attraction 513 falls below 0.1 µm, it becomes difficult to secure sufficient electric conductivity. If the thickness of the electrode for electrostatic attraction 513 exceeds 100 µm, peeling or cracking easily occurs in the joint interfaces between the electrode for electrostatic attraction 513, and the mounting plate 511 and the supporting plate 512. This is considered to be due to a difference in thermal expansion coefficient between the electrode for electrostatic attraction 513, and the mounting plate 511 and the supporting plate 512.

The electrode for electrostatic attraction 513 having such a thickness can be easily formed by a film formation method such as a sputtering method or a vapor deposition method, or a coating method such as a screen printing method.

The insulating material layer 514 surrounds the electrode for electrostatic attraction 513 so as to protect the electrode for electrostatic attraction 513 from corrosive gas and plasma thereof, joins and integrates a boundary portion between the mounting plate 511 and the supporting plate 512, that is, an outer peripheral portion region except for the electrode for electrostatic attraction 513, and is configured of an insulating material having the same composition or the same main component as the material configuring the mounting plate 511 and the supporting plate 512.

The extraction electrode terminal 515A is a rod-shaped member provided in order to apply a direct-current voltage to the electrode for electrostatic attraction 513. As a material of the extraction electrode terminal 515A, it is not particularly limited as long as it is a conductive material having excellent heat resistance. However, a material having a thermal expansion coefficient approximated to the coefficients of thermal expansion of the electrode for electrostatic attraction 513 and the supporting plate 512 is preferable, and it is made of a conductive ceramic material such as $Al_2O_3$—$Ta_4C_5$, for example. The extraction electrode terminal 515A is connected to a conductive adhesion part 515B and a power supply terminal 515C (described later). The conductive adhesion part 515B is made of a silicon-based conductive adhesive having flexibility and electrical resistance.

The power supply terminal 515C is made of a metal material such as tungsten (W), tantalum (Ta), molybdenum (Mo), niobium (Nb), or a kovar alloy.

An insulator 515a having insulating properties is provided on the outer periphery side of the power supply terminal 515C, and the power supply terminal 515C is insulated from the temperature controlling base part 503 made of metal, by this insulator 515a. The extraction electrode terminal 515A is joined to and integrated with the supporting plate 512, and the mounting plate 511 and the supporting plate 512 are joined to and integrated with each other by the electrode for electrostatic attraction 513 and the insulating material layer 514, whereby the electrostatic chuck part 502 is configured.

The power supply terminal 515C is provided so as to penetrate a through-hole 503b of the temperature controlling base part 503 which will be described in detail later.

The temperature controlling base part 503 is a member for adjusting the temperature of the electrostatic chuck part 502 to a desired temperature and has a thick disk shape. A flow path 503A for circulating water or the like is formed in the interior of the temperature controlling base part 503.

A material for formation of the temperature controlling base part 503 is a metal material. The metal material is preferably metal which is excellent in thermal conductivity, electric conductivity, and workability, or a compound material which includes the metal. For example, aluminum (Al), an aluminum alloy, copper (Cu), a copper alloy, stainless steel (SUS), or the like is suitably used. It is preferable that at least the surface which is exposed to plasma, of the temperature controlling base part 503, is subjected to alumite treatment or has an insulating film such as alumina formed thereon.

An opening portion 503B is formed in a recess portion 503a formed on the electrostatic chuck part 502 side with respect to the flow path 503A of the temperature controlling base part 503. The second heater element 506 (described later) is disposed in the opening portion 503B.

The high frequency generating electrode 550 is an electrode for generating a high frequency in order to generate plasma in the apparatus. For example, in a reactive ion etching (RIE) apparatus, by applying high frequency power from a high frequency generating power source to the high frequency generating electrode 550, it is possible to make a gas turn into plasma by causing electric discharge between facing electrodes facing each other.

The high frequency generating electrode 550 is interposed between the electrostatic chuck part 502 and the temperature controlling base part 503. A high frequency power source (not shown) connected through a power supply terminal 552 is connected to the high frequency generating electrode 550, and thus a configuration capable of applying high frequency power to the high frequency generating electrode 550 is made. The power supply terminal 552 is covered with an insulator 552a in order to maintain insulation from the temperature controlling base part 503.

The high frequency generating electrode 550 is made of a metal material, and the periphery thereof is covered with an insulating layer 553.

The high frequency generating electrode 550 is insulated from the temperature controlling base part 503 by the insulating layer 553. That is, it is possible to prevent the voltage applied to the high frequency generating electrode 550 from leaking to the outside.

It is preferable that a material for formation of the high frequency generating electrode 550 is formed of non-magnetic metal. Non-magnetic metal is used, whereby even if the electrostatic chuck device 501 is used in a high frequency atmosphere, it is possible to suppress self-heating of the high frequency generating electrode 550 due to the high frequency. Therefore, even in a high frequency atmosphere, it becomes easy to maintain the in-plane temperature of the plate-shaped sample at a desired constant temperature or constant temperature pattern.

It is preferable that the thickness of the high frequency generating electrode 550 is 20 µm or more and 1000 µm or less. If the thickness of the high frequency generating electrode 550 is too thick, the heat capacity becomes too large, and thus the thermal responsiveness of the plate-shaped sample W which is placed on the electrostatic chuck device deteriorates. Further, if the thickness of the high frequency generating electrode 550 is too thin, unevenness of heat generation of the high frequency generating electrode and unevenness of an electric field occur, thereby affecting the uniformity of plasma.

The first heater element 505 is bonded to the insulating layer 553 with which the high frequency generating electrode 550 is covered, through an adhesion layer 509A. The adhesion layer 509A is made of the same adhesive resin as the adhesive layer 509B, and a sheet-shaped or film-shaped adhesive resin can be used. Further, the first heater element 505 may be bonded to the bottom surface side of the supporting plate 512 through the adhesion layer 509A.

Figure 8:
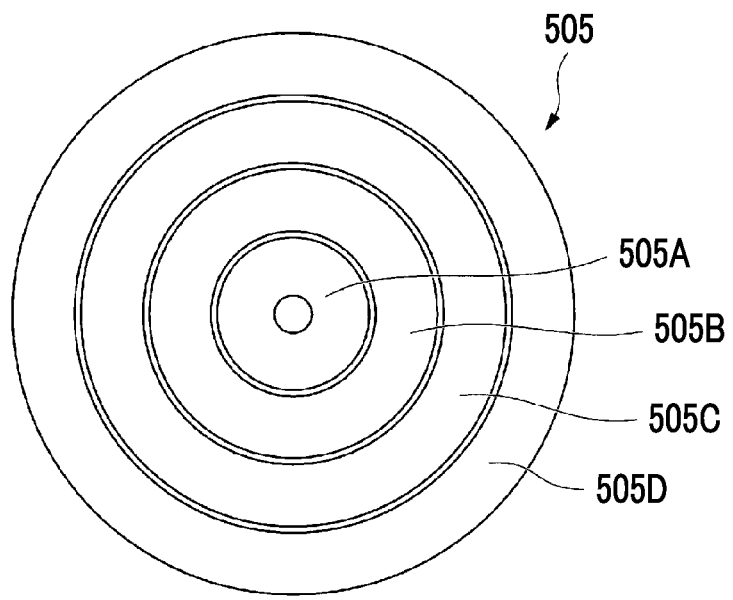
FIG. 8 is a plan view showing an example of a pattern of a main heater element which is provided in the electrostatic chuck device.

The first heater element 505 is configured with a first main heater 505A disposed in an annular region of a central portion, and a second main heater 505B, a third main heater 505C, and a fourth main heater 505D disposed in annular regions so as to sequentially surround the first main heater 505A, as shown in FIG. 8. It is preferable that an area in which the first to fourth main heaters 505A to 505D are disposed as shown in FIG. 8 has approximately the same size as the disk-shaped electrostatic chuck part 502.

In FIG. 8, each of the main heaters 505A, 505B, 505C, and 505D is drawn in a simple annular shape when viewed in a planar view. However, each of the main heaters 505A, 505B, 505C, and 505D is disposed so as to occupy an annular region shown in FIG. 8 by meandering a strip-shaped heater. For this reason, in the cross-sectional structure shown in FIG. 7, strip-shaped heaters configuring the respective main heaters 505A, 505B, 505C, and 505D are individually drawn.

As an example, each of the main heaters 505A to 505D is obtained by processing a non-magnetic metal thin plate, for example, a titanium (Ti) thin plate, a tungsten (W) thin plate, a molybdenum (Mo) thin plate, or the like, having a constant thickness of 0.2 mm or less, preferably, about 0.1 mm, into a desired heater shape by a photolithography method, for example, processing an entire contour of a meandering shape of a strip-shaped heater into an annular shape.

These main heaters 505A to 505D are bonded and fixed to the bottom surface of the supporting plate 512 by the adhesion layer 509A made of a sheet-shaped or film-shaped silicon resin, acrylic resin, or the like having uniform thickness and having heat resistance and insulating properties.

The second heater element 506 is disposed in the opening portion 503B formed in the recess portion 503a of the temperature controlling base part 503. The opening portion 503B is formed by the recess portion 503a of the temperature controlling base part 503 and the metal plate 551 provided above the recess portion 503a. In the opening portion 503B, an insulation plate 507, a wiring layer 504, an insulation plate 508, and the second heater element 506 are laminated in order from the flow path 503A side, and an insulating part 510 is formed so as to cover the peripheries of these elements. As the metal plate 551, a plate made of the same constituent material as that of the temperature controlling base part 503 can be used.

The insulation plate 507 is bonded to the surface on the flow path 503A side of the opening portion 503B by an adhesion layer 507A. As the adhesion layer 507A, the same adhesion layer as the adhesion layer 509A can be used. The adhesion layer 507A is formed to have a thickness in a range of about 5 to 100 μm, for example. Each of the insulation plates 507 and 508 is made of a thin plate, a sheet, or a film of heat-resistant resin such as polyimide resin, epoxy resin, or acrylic resin.

Each of the insulation plates 507 and 508 may be an insulating ceramic plate instead of the resin sheet and may be a thermally sprayed film having insulating properties such as alumina.

As an example, the wiring layer 504 is formed on the upper surface of the insulation plate 507, the second heater element 506 is formed on the upper surface of the insulation plate 508, and the peripheries of these elements are covered with the insulating part 510, whereby a laminated structure shown in FIG. 7 is realized. The insulating part 510 is provided in order to prevent the second heater element 506 and the temperature controlling base part 503 from being electrically connected to each other.

Figure 9:
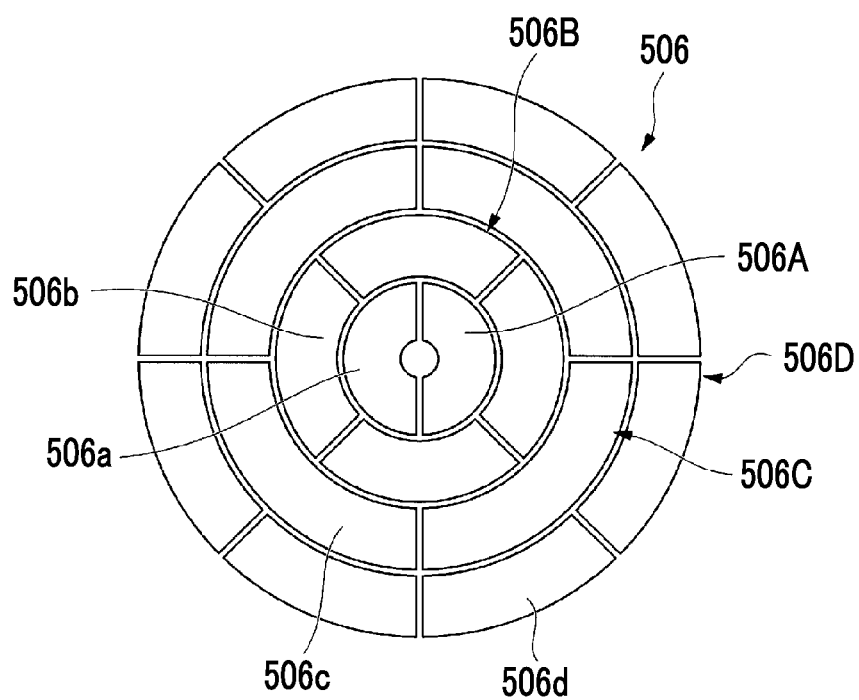
FIG. 9 is a plan view showing an example of a pattern of a sub-heater element which is provided in the electrostatic chuck device.

The second heater element 506 is configured with a first sub-heater 506A disposed in an annular region of a central portion, and a second sub-heater 506B, a third sub-heater 506C, and a fourth sub-heater 506D disposed in annular regions so as to sequentially surround the first sub-heater 506A, as shown in FIG. 9. The first sub-heater 506A is annularly formed by combining a plurality of (in the case of the configuration of FIG. 9, two) heater split bodies 506a disposed in regions each having a fan-shaped annular body shape, and the second sub-heater 506B is annularly formed by combining a plurality of (in the case of the configuration of FIG. 9, four) heater split bodies 506b disposed in regions each having a fan-shaped annular body shape. The third sub-heater 506C is annularly formed by combining a plurality of (in the case of the configuration of FIG. 9, four) heater split bodies 506c disposed in regions each having a fan-shaped annular body shape. The fourth sub-heater 506D is annularly formed by combining a plurality of (in the case of the configuration of FIG. 9, eight) heater split bodies 506d disposed in regions each having a fan-shaped annular body shape.

Each of the heater split bodies 506a to 506d is obtained by processing a non-magnetic metal thin plate, for example, a molybdenum (Mo) thin plate, a tungsten (W) thin plate, a niobium (Nb) thin plate, a titanium (Ti) thin plate, a copper (Cu) thin plate, or the like, which is thinner than the main heaters 505A to 505D, into a desired heater shape by a photolithography method, for example, processing an entire contour of a meandering shape of a strip-shaped heater into a fan-shaped annular body shape.

It is preferable that each of these heater split bodies 506a to 506d has a configuration exhibiting a calorific value lower than the calorific value per unit area of each of the main heaters 505A to 505D, and it is preferable that each of these heater split bodies 506a to 506d is configured into a thinner structure than each of the main heaters 505A to 505D, or configured of a material having a low amount of heat generation. As an example, in a case where the main heater is configured of a Ti thin plate having a thickness of 100 μm, the sub-heater can be configured of a Mo thin plate having a thickness of 5 μm.

These heater split bodies 506a to 506d are bonded and fixed to the upper surface of the insulation plate 508 by an adhesive layer (not shown) made of a sheet-shaped or film-shaped silicon resin, acrylic resin, or the like having a uniform thickness and having heat resistance and insulating properties.

In this embodiment, the sub-heaters 506A, 506B, 506C, and 506D have two-, four-, and eight-division structures. However, the number of divisions may be arbitrary, and a shape in a case of being divided may also be arbitrary.

The metal plate 551 is provided between the second heater element 506 configured with a plurality of sub-heaters and the high frequency generating electrode 550. The metal plate 551 is grounded, whereby it is possible to suppress the influence of a high frequency on the second heater element 506. Therefore, it is possible to prevent a high frequency current from leaking to a power source for the sub-heater through the second heater element 506, and thus it is possible to remove a high frequency cut-off filter for the sub-heater.

That is, it is possible to avoid complication of the configuration of the electrostatic chuck device 501 and reduce the manufacturing cost of the electrostatic chuck device 501. Further, there is no concern that a high frequency may leak as noise to the power source for the heater, thereby impairing the operation or performance of the heater power source. Further, the second heater element 506 disposed in the interior of the temperature controlling base part 503 generating heat due to a high frequency can be suppressed, and fine adjustment of a temperature distribution can be performed more accurately.

Further, it is preferable that the metal plate 551 and the temperature controlling base part 503 are electrically connected to each other.

The metal plate 551 and the temperature controlling base part 503 may be joined to and integrated with each other. If the metal plate 551 and the temperature controlling base part 503 are electrically connected to each other, only by grounding the temperature controlling base part 503, it is possible to remove the high frequency generated from the high frequency generating electrode 550 from the temperature controlling base part 503 through the metal plate 551. Therefore, it is possible to further avoid complication of the configuration of the electrostatic chuck device 501.

Figure 10:
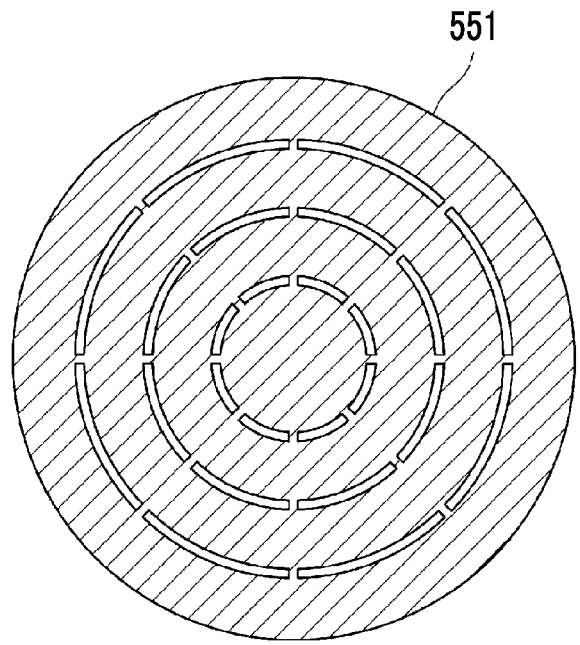
FIG. 10 is a plan view showing an example of a pattern of a metal plate which is provided in the electrostatic chuck device.

It is preferable that the metal plate 551 has a heat transfer barrier (a first heat transfer barrier) which impedes heat transfer in an in-plane direction thereof. Specifically, as shown in FIG. 10, it is preferable that the metal plate 551 has a plurality of incisions or grooves extending in the circumferential direction thereof, or a configuration in which the incisions or grooves are filled with resin or the like having poor thermal conductivity (poorer thermal conductivity than the metal configuring the metal plate). As the resin having poor thermal conductivity, for example, polyimide resin or the like can be used.

In the electrostatic chuck device, heat conduction in a concentric circular direction (the circumferential direction) in the in-plane direction can be permitted. On the other hand, heat conduction in the radial direction can become a factor of impairing temperature uniformity. If the metal plate can perform heat transfer in the in-plane direction, the controlled temperature distribution is mitigated. For this reason, by providing a plurality of heat transfer barriers extending in the circumferential direction in the metal plate 551, heat transfer in the in-plane direction of the metal plate can be inhibited. Further, the incisions may be filled with resin or the like having poor thermal conductivity. As the resin having poor thermal conductivity, for example, polyimide resin or the like can be used.

Further, it is preferable that the heat transfer barrier extending in the circumferential direction is not provided over the entire circumference in the circumferential direction, as shown in FIG. 10. That is, it is preferable that the metal plate 551 is made of a single plate which is not electrically separated. If the metal plate 551 is made of a single plate, the entire metal plate 551 can be grounded if a ground is made at any one point of the metal plate 551. Therefore, it is possible to further avoid complication of the configuration of the electrostatic chuck device 501.

Figure 11:
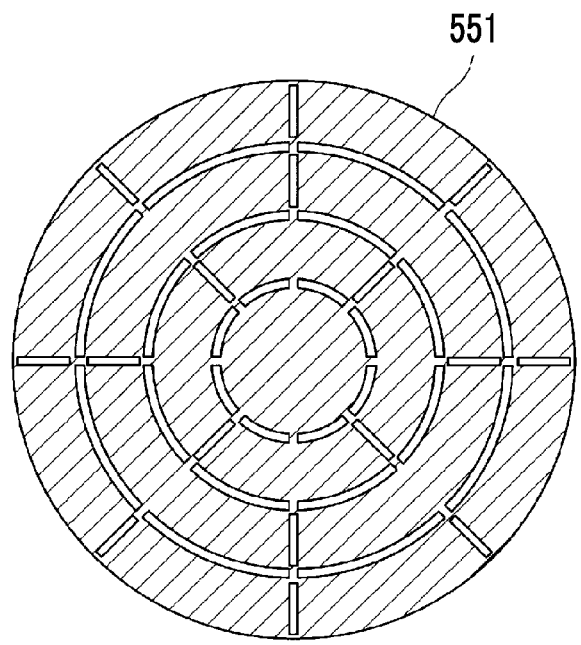
FIG. 11 is a plan view showing an example of a pattern of a metal plate which is provided in the electrostatic chuck device.

Further, it is further preferable that the metal plate 551 has a heat transfer barrier provided to planarly overlap the region between the plurality of main heaters adjacent to each other and the region between the plurality of main heaters adjacent to each other, as shown in FIG. 11. By providing such a heat transfer barrier in the metal plate 551, it is possible to inhibit heat transfer in the in-plane direction of the metal plate in accordance with the region controlled in temperature by each main heater and sub-heater. That is, it is possible to further enhance the temperature controllability for each region of the electrostatic chuck device 501.

Such a heat transfer barrier may be provided in the high frequency generating electrode 550. Further, the heat transfer barriers may be provided in both the high frequency generating electrode 550 and the metal plate 551. The high frequency generating electrode 550 has a plurality of heat transfer barriers (second heat transfer barriers) extending in the circumferential direction thereof, whereby it is possible to enhance the temperature uniformity in the circumferential direction in the high frequency generating electrode 550. As described above, in the electrostatic chuck device, heat conduction in the concentric circular direction (the circumferential direction) in the in-plane direction can be permitted. On the other hand, heat conduction in the radial direction can become a factor of impairing temperature uniformity. For this reason, by thermally separating the high frequency generating electrode 550 in the radial direction, it is possible to more accurately perform the temperature control for each area of the plate-shaped sample.

Further, the heat transfer barriers are provided in the high frequency generating electrode 550 in accordance with the heating region of the main heater and the heating region of the sub-heater, whereby the heat applied by the main heater and the sub-heater spreading in the radial direction due to the heat conduction of the high frequency generating electrode 550 can be further suppressed. That is, it is possible to more accurately perform the temperature control for each area of the plate-shaped sample. It is preferable that the high frequency generating electrode 550 is also made of a single plate which is not electrically separated.

Further, in the structure of this embodiment, the recess portion 503a having a size capable of accommodating the first heater element 505 and the bottom portion side of the electrostatic chuck part 502 is formed on the upper surface side of the metal plate 551 configuring the temperature controlling base part 503. The high frequency generating electrode 550, the first heater element 505, and the electrostatic chuck part 502 are integrated with each other by the adhesive layer 509B formed so as to fill the recess portion. As the adhesive layer 509B, an adhesive resin having heat resistance and insulating properties, such as polyimide resin, silicon resin, or epoxy resin, can be used.

Next, a structure for feeding electric power to the first heater element 505 will be described.

The first heater element 505 is configured with the main heaters 505A, 505B, 505C, and 505D, and a plurality of power supply terminals 517 for feeding electric power to these individual main heaters 505A, 505B, 505C, and 505D are provided. In FIG. 8, only the schematic shapes of the main heaters 505A, 505B, 505C, and 505D are shown. However, in any heater, conduction parts for connecting it to a power source are provided on one end side and the other end side of each heater, and therefore, two power supply terminals 517 are provided for each of the main heaters 505A, 505B, 505C, and 505D and a total of eight power supply terminals 517 are provided.

In FIG. 7, for simplification of description, only one power supply terminal 517 connected to the outermost peripheral main heater 505D is drawn. The power supply terminal 517 is disposed so as to partially penetrate the temperature controlling base part 503, the insulation plates 507 and 508, the sub-heater 506D, the insulating part 510, the metal plate 551, and the high frequency generating electrode 550 in the thickness direction thereof. Further, a tubular insulator 518 for insulation is mounted on the outer peripheral surface of the power supply terminal 517, and thus the temperature controlling base part 503 and the power supply terminal 517 are insulated from each other. Further, the power supply terminal 517 is bonded to the first heater element 505 through an adhesion part 509b.

As a material configuring the power supply terminal 517, the same material as the material configuring the power supply terminal 515C described above can be used.

Although all the power supply terminals 517 are not drawn in FIG. 7, two power supply terminals 517 are connected to any of the main heaters 505A, 505B, 505C, and 505D, and a power source device is connected to each of the main heaters 505A, 505B, 505C, and 505D through the two power supply terminals 517 such that energization control can be performed.

These power supply terminals 517 are respectively provided so as to penetrate the through-holes 503b formed in the temperature controlling base part 503, and in a case where the other party to be connected is any one of the main heaters 505A, 505B, 505C, and 505D, the power supply terminals 517 are provided so as to penetrate the insulation plates 507 and 508 as well.

With the configuration described above, energization and heat generation control of each of the main heaters can be performed with respect to each of the main heaters 505A, 505B, 505C, and 505D according to the operation of the switch element and the power source.

Further, a temperature sensor 520 is provided on the lower surface side of each of the main heaters 505A, 505B, 505C, and 505D. In the structure shown in FIG. 7, an installation hole 521 is formed so as to partially penetrate the temperature controlling base part 503, the insulation plates 507 and 508, the sub-heater 506D, and the high frequency generating electrode 550 in the thickness direction thereof. The temperature sensor 520 is installed at the uppermost portion of the installation hole 521 and at a position close to any one of the main heaters 505A, 505B, 505C, and 505D. It is desirable that the temperature sensors 520 are installed at positions as close to the main heaters 505A, 505B, 505C, and 505D as possible, and therefore, in the structure shown in FIG. 7, a protrusion portion 520a is formed so as to protrude toward the main heater side, and the temperature sensor 520 is provided inside of the protrusion portion 520a.

The temperature sensor 520 is a fluorescent emission type temperature sensor in which a phosphor layer is formed on the upper surface side of a rectangular parallelepiped-shaped light transmission body made of quartz glass or the like, as an example, and the temperature sensor 520 is bonded to the lower surface of each of the main heaters 505A, 505B, 505C, and 505D by a silicon resin-based adhesive or the like having translucency and heat resistance.

The phosphor layer is made of a material which generates fluorescence in response to heat generation from the main heater, and a wide variety of fluorescent materials can be selected as long as it is a material which generates fluorescence in response to heat generation. However, as an example, a material appropriately selected from a fluorescent material to which a rare earth element having an energy level suitable for light emission is added, a semiconductor material such as AlGaAs, a metal oxide such as a magnesium oxide, and a mineral such as ruby or sapphire can be used.

The temperature sensors 520 corresponding to the main heaters 505A, 505B, 505C, and 505D are respectively provided at positions which do not interfere with the power supply terminal and the like and at arbitrary positions in the circumferential direction of the lower surfaces of the main heaters 505A, 505B, 505C, and 505D.

A temperature measurement unit 522 which measures the temperatures of the main heaters 505A to 505D from the fluorescence of these temperature sensors 520 is configured of an excitation unit 523 which irradiates the phosphor layer with excitation light on the outside (the lower side) of the installation hole 521 of the temperature controlling base part 503, a fluorescence detector 524 which detects the fluorescence emitted from phosphor layer, and a control part 525 which controls the excitation unit 523 and the fluorescence detector 524 and calculates the temperature of the main heater on the basis of the fluorescence, as shown in FIG. 7, as an example.

Incidentally, in FIG. 7, a reference numeral 528 denotes a pin insertion hole provided so as to partially penetrate from the temperature controlling base part 503 to the mounting plate 511 in the thickness direction thereof, and a lift pin for removal of the plate-shaped sample is provided in the pin insertion hole 528. A tubular insulator 529 is provided on the outer peripheral portion of the pin insertion hole 528.

Next, the heater split bodies configuring the sub-heaters 506A to 506D and a structure for individually feeding electric power to the heater split bodies will be described.

The sub-heaters 506A to 506D have collective structures of a plurality of heater split bodies 506a, 506b, 506c, and 506d obtained by individually dividing the respective sub-heaters 506A to 506D in the circumferential direction thereof, as shown in FIG. 9, when viewed in a planar view. In order to feed electric power to the heater split bodies 506a, 506b, 506c, and 506d, in this embodiment, the wiring layer 504 made of a low resistance material such as copper is provided on the upper surface side of the insulation plate 507.

The wiring layer 504 is configured with a plurality of wiring bodies 504a branched individually, and each of the wiring bodies 504a is connected to any one of the heater split bodies 506a, 506b, 506c, and 506d.

In FIG. 7, the plurality of wiring bodies 504a are disposed on the upper surface side of the insulation plate 507 so as to extend from the central portion side thereof to the peripheral edge side, and one end side of each of the wiring bodies 504a is connected to any one of the heater split bodies through a conduction part 508b such as a welded part formed in a contact hole formed in a part of the insulation plate 508. Further, the other end side of each of the wiring bodies 504a is connected to a power supply terminal 526 through a conduction part 507b such as a welded part formed in a contact hole formed in a part of the insulation plate 507. The power supply terminal 526 is formed so as to penetrate the temperature controlling base part 503 in the thickness direction thereof along the through-hole 503b of the temperature controlling base part 503 and reach the insulation plate 507, and an insulator 527 for insulation is provided on the outer periphery side of the power supply terminal 526, and thus the power supply terminal 526 is insulated from the temperature controlling base part 503.

The plurality of heater split bodies 506a, 506b, 506c, and 506d are formed in the circumferential direction of the sub-heaters 506A, 506B, 506C, and 506D, and therefore, the power supply terminals 526 to be connected to the heater split bodies are disposed at positions spaced apart from each other in the circumferential direction of the temperature controlling base part 503 such that the power supply terminals 526 do not interfere with each other, and the heater split bodies 506a, 506b, 506c, and 506d are individually connected by using the individual wiring bodies 504a.

In order to individually feed electric power to the heater split bodies 506a, 506b, 506c, and 506d, two power supply terminals 526 are connected to each heater split body. However, in the cross-sectional structure shown in FIG. 7, only a part is shown and the connection structure of the other wiring body 504a is abbreviated as appropriate.

The two power supply terminals 526 are connected to any of the heater split bodies 506a, 506b, 506c, and 506d, and a switch element and a power source device are connected to each of the heater split bodies 506a, 506b, 506c, and 506d through the two power supply terminals 526.

With the configuration described above, energization and heat generation control can be performed with respect to each of the heater split bodies 506a, 506b, 506c, and 506d according to the operation of the switch element and the power source.

The number of power supply terminals 526 of the sub-heaters 506A to 506D can be less than twice the number of heater split bodies due to the heater pattern and the disposition of the switch element.

In the electrostatic chuck device 501 having the structure described above, it is preferable that the heat transfer coefficient between the first heater element 505 and the temperature controlling base part 503 is smaller than 4000 W/m²K and larger than 200 W/m²K.

If the heat transfer coefficient is larger than 200 W/m²K, it is possible to increase the thermal responsiveness between the first heater element 505 and the temperature controlling base part 503, and thus in a case of performing the temperature control of the electrostatic chuck device 502, temperature control with good responsiveness becomes possible.

In a case where the heat transfer coefficient is larger than 4000 W/m²K, outflow of heat from the heater part to the temperature controlling base increases, and it is necessary to supply excessive electric power to the heater in order to raise the temperature of the mounted object (the plate-shaped sample) W to a predetermined temperature, and thus it is not preferable.

The electrostatic chuck device 501 configured as described above can be used to attract the plate-shaped sample W onto the protrusion portions 511b of the mounting surface 511a by generating an electrostatic attraction force by feeding electric power from the power supply terminal 515C to the electrode for electrostatic attraction 513 of the electrostatic chuck part 502.

Further, the plate-shaped sample W can be cooled by circulating a refrigerant in the temperature controlling base part 503, and temperature control can be performed by heating the plate-shaped sample W by causing the main heaters 505A to 505D to individually generate heat by feeding electric power from the power source to each of the main heaters 505A to 505D through the power supply terminal 517. Further, by individually energizing the heater split bodies 506a to 506d, it is possible to finely adjust the temperatures of the regions corresponding to the heater split bodies 506a to 506d.

If the plate-shaped sample W is supplied to an etching apparatus or a film forming apparatus and exposed to a plasma atmosphere or a film formation atmosphere, a temperature difference occurs in the plate-shaped sample W according to a plasma generation state, a temperature distribution in a film formation chamber, or the like.

Figure 12:
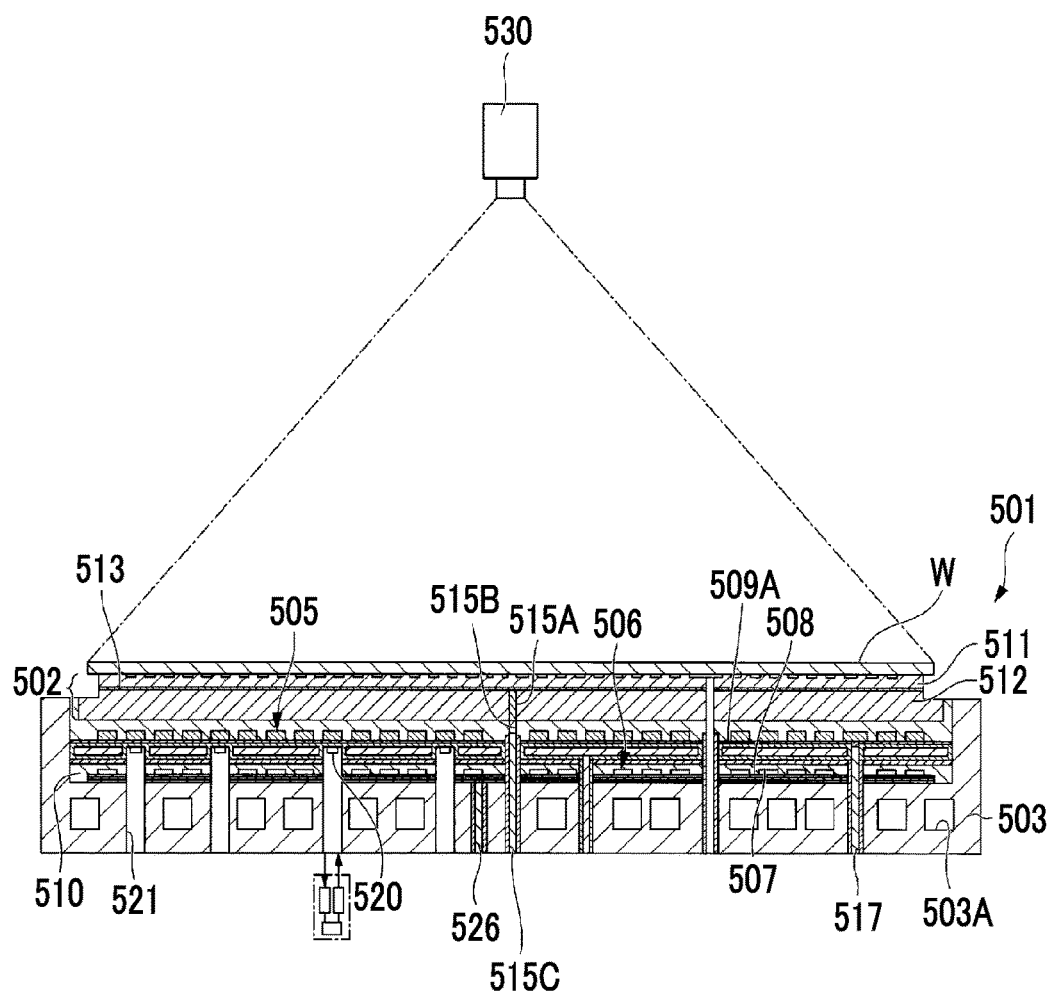
FIG. 12 is an explanatory diagram showing a state where a surface temperature distribution of a plate-shaped sample supported by the electrostatic chuck device is examined by a thermo-camera.

For example, as shown in FIG. 12, a temperature distribution in the surface of the plate-shaped sample W is photographed by a thermo-camera 530 and analyzed by a thermograph, and then, if a region having a low temperature is generated in the plate-shaped sample W, the surface temperature of the plate-shaped sample W can be uniformized by locally raising the surface temperature of each corresponding zone of the plate-shaped sample W above the individual regions of the heater split bodies 506a, 506b, 506c, and 506d by energizing and heating any one of the heater split bodies 506a, 506b, 506c, and 506d in the corresponding region.

Temperature control at the time of heating can be performed by application voltage control, voltage application time control, current value control, or the like when energizing each of the heater split bodies 506a, 506b, 506c, and 506d.

In the structure described above, a configuration is made such that the second heater element 506 is divided into a plurality of heater split bodies 506a, 506b, 506c, and 506d and the energization and heat generation control can be performed individually, and therefore, even in a case where a temperature distribution occurs in the attracted plate-shaped sample W, the temperature distribution can be uniformized by raising the temperature of a low-temperature zone of the plate-shaped sample W by energizing any one of the heater split bodies 506a, 506b, 506c, and 506d at a position corresponding to the low-temperature zone to generate heat.

For this reason, in a case where the plate-shaped sample W is held by the electrostatic chuck device 501 for plasma etching, film formation, or the like, uniform etching or uniform film formation can be performed by uniformizing the surface temperature of the plate-shaped sample W by individual temperature control of the heater split bodies 506a to 506d.

Further, by reducing the calorific value per unit area of the heater split bodies 506a, 506b, 506c, and 506d with respect to the main heaters 505A to 505D, it is possible to reduce the energization amount of the heater split bodies 506a, 506b, 506c, and 506d for temperature fine adjustment. Further, the energization amount of the heater split bodies 506a, 506b, 506c, and 506d can be reduced, and therefore, for example, the power supply amount can be reduced by using a pulse current as the energizing current of the heater split bodies 506a, 506b, 506c, and 506d.

In the structure described above, the thickness of each of the main heaters 505A to 505D and the thickness of each of the heater split bodies 506a, 506b, 506c, and 506d can be freely selected at the time of manufacturing, and therefore, it is possible to individually set the withstand voltage according to each heater and each wiring and it is possible to set a desirable individual withstand voltage value for each heater and each wiring. For example, by setting the thickness of the main heater made of a Ti thin plate to be 100 μm and setting the thickness of the heater split body made of a Mo thin plate to be 5 μm, as an example, it is possible to adjust the calorific value per unit area of the heater split body to ⅕ or less of the main heater. Of course, the adjustment of the calorific value of the main heater and the heater split body may be performed by the adjustment of a supply voltage, in addition to the constituent material and the heater thickness.

Incidentally, in the structure of the third embodiment, a structure is made in which the first heater element 505 is divided into four portions in the radial direction thereof to form the four main heaters 505A to 505D. However, the number of divided portions of the first heater element 505 is not limited to four and may be any number. Further, with respect to the second heater element 506, the second heater element 506 is divided into four portions in the radial direction to form the four sub-heaters 506A to 506D, and the first sub-heater 506A has a two-division structure, the second sub-heater 506B has a four-division structure, the third sub-heater 506C has a four-division structure, and the fourth sub-heater 506D has an eight-division structure. However, the number of divided portions of the second heater element 506 in the radial direction may be any number, and the number of divided portions of each sub-heater may also be any number. However, from the viewpoint of performing local temperature fine adjustment by the sub-heaters, it is preferable that the number of divided portions of the second heater element 506 is larger than the number of divided portions of the first heater element 505.

In this embodiment, the second heater element 506 has a single layer structure. However, the second heater element 506 may have a multilayer structure made of two or more layers. Further, in this embodiment, the first heater element 505 and the second heater element 506 are disposed at regions overlapping in an annular shape when viewed in a planar view. However, they may be disposed at positions slightly deviated from overlapping regions when viewed in a planar view. For example, it is also possible to dispose the plurality of sub-heaters of the second heater element so as to fill slight gaps formed between the plurality of main heater installation regions (annular installation regions) configuring the first heater element 505 when viewed in a planar view, thereby filling the gap regions between the plurality of main heaters with the plurality of sub-heaters. Of course, in a case where two or more layers of second sub-heaters are disposed, a structure may be adopted in which the gap between the main heaters is filled by shifting the disposition region of each layer when viewed in a planar view.

Fourth Embodiment

Figure 13:
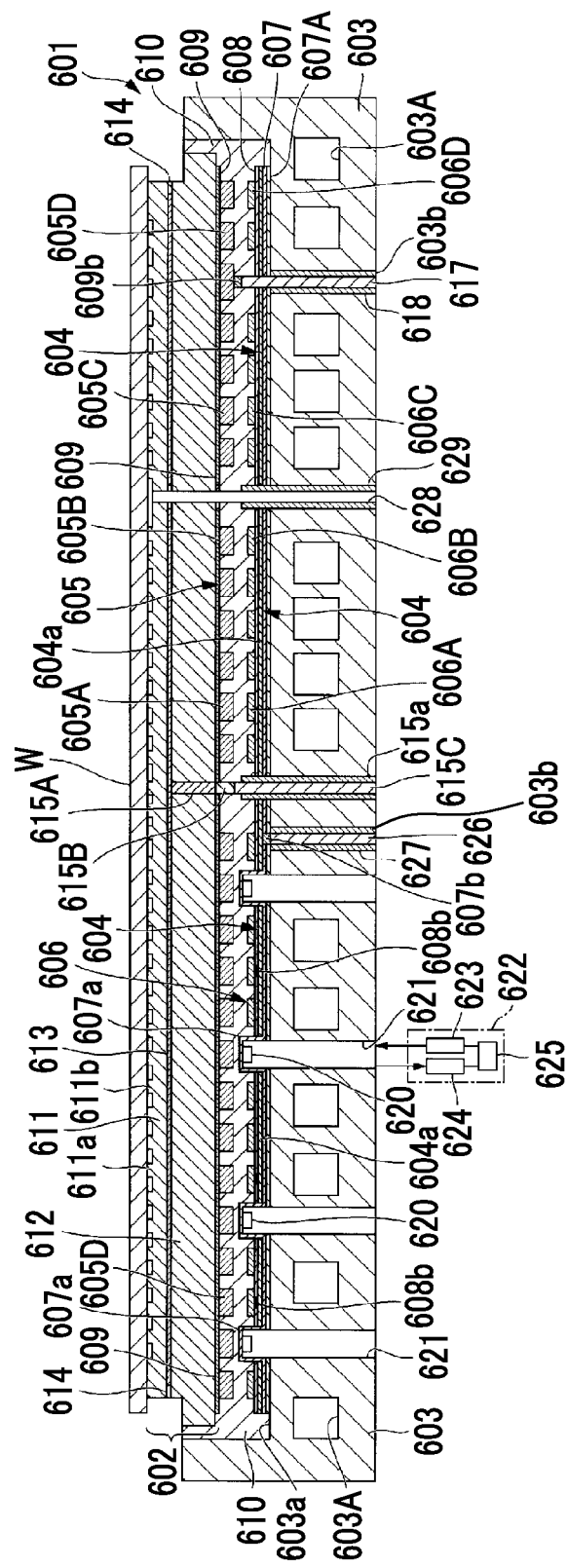
FIG. 13 is a cross-sectional view showing an electrostatic chuck device according to a fourth embodiment of the present invention.

FIG. 13 is a cross-sectional view showing an electrostatic chuck device according to a fourth embodiment of the present invention, and an electrostatic chuck device 601 of this embodiment is provided with a disk-shaped electrostatic chuck part 602 having a mounting surface on one principal surface (an upper surface) side thereof, a thick disk-shaped temperature controlling base part 603 which is provided below the electrostatic chuck part 602 to adjust the temperature of the electrostatic chuck part 602 to a desired temperature, and a first heater element 605 and a second heater element 606 interposed between the electrostatic chuck part 602 and the temperature controlling base part 603 and each having a layered structure. Further, the electrostatic chuck device 601 is configured to include two insulation plates 607 and 608 interposed so as to be laminated with the heater element 606 between the electrostatic chuck part 602 and the temperature controlling base part 603, a wiring layer 604 interposed between the insulation plates 607 and 608, an adhesion layer 609 which sticks the heater element 605 to the bottom surface side of the electrostatic chuck part 602, and an adhesive layer 610 formed so as to cover the peripheries of these elements.

The electrostatic chuck part 602 is configured of a mounting plate 611 having an upper surface serving as a mounting surface 611a on which the plate-shaped sample W such as a semiconductor wafer is mounted, a supporting plate 612 which is integrated with the mounting plate 611 and supports the bottom portion side of the mounting plate 611, an electrode for electrostatic attraction (an internal electrode for electrostatic attraction) 613 provided between the mounting plate 611 and the supporting plate 612, an insulating material layer 614 which insulates the periphery of the electrode for electrostatic attraction 613, and an extraction electrode terminal 615A which is provided so as to penetrate the supporting plate 612 and applies a direct-current voltage to the electrode for electrostatic attraction 613.

The mounting plate 611 and the supporting plate 612 have disk shapes in which the shapes of the superimposed surfaces are the same, and each of these plates is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

A plurality of protrusion portions 611b each having a diameter smaller than the thickness of the plate-shaped sample are formed at predetermined intervals on the mounting surface 611a of the mounting plate 611, and these protrusion portions 611b support the plate-shaped sample W.

The total thickness including the mounting plate 611, the supporting plate 612, the electrode for electrostatic attraction 613, and the insulating material layer 614, that is, the thickness of the electrostatic chuck part 602 is formed to be 0.7 mm or more and 5.0 mm or less, as an example.

For example, if the thickness of the electrostatic chuck part 602 falls below 0.7 mm, it becomes difficult to secure the mechanical strength of the electrostatic chuck part 602. If the thickness of the electrostatic chuck part 602 exceeds 5.0 mm, the heat capacity of the electrostatic chuck part 602 becomes large, and thus the thermal responsiveness of the plate-shaped sample W which is placed thereon deteriorates, and due to an increases in the heat transfer in a lateral direction of the electrostatic chuck part, it becomes difficult to maintain the in-plane temperature of the plate-shaped sample W at a desired temperature pattern. The thickness of each part described here is an example and is not limited to the above-described range.

The electrode for electrostatic attraction 613 is used as an electrode for an electrostatic chuck for generating electric charges and fixing the plate-shaped sample W with an electrostatic attraction force, and the shape or size thereof is appropriately adjusted according to a use thereof.

The electrode for electrostatic attraction 613 is preferably formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, or an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo).

The thickness of the electrode for electrostatic attraction 613 is not particularly limited. However, a thickness of 0.1 µm or more and 100 µm or less can be selected, and a thickness of 5 µm or more and 20 µm or less is more preferable.

If the thickness of the electrode for electrostatic attraction 613 falls below 0.1 µm, it becomes difficult to secure sufficient electric conductivity. If the thickness of the electrode for electrostatic attraction 613 exceeds 100 µm, cracking easily occurs in the joint interfaces between the electrode for electrostatic attraction 613, and the mounting plate 611 and the supporting plate 612 due to a difference in thermal expansion coefficient between the electrode for electrostatic attraction 613, and the mounting plate 611 and the supporting plate 612.

The electrode for electrostatic attraction 613 having such a thickness can be easily formed by a film formation method such as a sputtering method or a vapor deposition method, or a coating method such as a screen printing method.

The insulating material layer 614 surrounds the electrode for electrostatic attraction 613 so as to protect the electrode for electrostatic attraction 613 from corrosive gas and plasma thereof, joins and integrates a boundary portion between the mounting plate 611 and the supporting plate 612, that is, an outer peripheral portion region except for the electrode for electrostatic attraction 613, and is configured of an insulating material having the same composition or the same main component as the material configuring the mounting plate 611 and the supporting plate 612.

The extraction electrode terminal 615A is a rod-shaped member provided in order to apply a direct-current voltage to the electrode for electrostatic attraction 613. As a material of the extraction electrode terminal 615A, it is not particularly limited as long as it is a conductive material having excellent heat resistance. However, a material having a thermal expansion coefficient approximated to the coefficients of thermal expansion of the electrode for electrostatic attraction 613 and the supporting plate 612 is preferable, and it is made of a conductive ceramic material such as $Al_2O_3$—$Ta_4C_5$, for example.

The extraction electrode terminal 615A is connected to a conductive adhesion part 615B and a power supply terminal 615C (described later). The conductive adhesion part 615B is made of a silicon-based conductive adhesive having flexibility and electrical resistance. The power supply terminal 615C is made of a metal material such as tungsten (W), tantalum (Ta), molybdenum (Mo), niobium (Nb), or a kovar alloy.

An insulator 615a having insulating properties is provided on the outer periphery side of the power supply terminal 615C, and the power supply terminal 615C is insulated from the temperature controlling base part 603 made of metal, by this insulator 615a. The extraction electrode terminal 615A is joined to and integrated with the supporting plate 612, and the mounting plate 611 and the supporting plate 612 are joined to and integrated with each other by the electrode for electrostatic attraction 613 and the insulating material layer 614, whereby the electrostatic chuck part 602 is configured.

The power supply terminal 615C is provided so as to penetrate the heater element 606 (described in detail later) and the insulation plates 607 and 608 forming a two-layer structure and penetrate a through-hole 603b of the temperature controlling base part 603.

The temperature controlling base part 603 is a member for adjusting the temperature of the electrostatic chuck part 602 to a desired temperature and has a thick disk shape. As the temperature controlling base part 603, for example, a water-cooled base or the like, in which a flow path 603A for circulating water is formed in the interior thereof, is suitable.

As a material configuring the temperature controlling base part 603, it is not particularly limited as long as it is metal which is excellent in thermal conductivity, electric conductivity, and workability, or a compound material which includes the metal, and for example, aluminum (Al), an aluminum alloy, copper (Cu), a copper alloy, stainless steel (SUS), or the like is suitably used. It is preferable that at least the surface which is exposed to plasma, of the temperature controlling base part 603, is subjected to alumite treatment or has an insulating film such as alumina formed thereon.

In the structure of this embodiment, a recess portion 603a having a size capable of accommodating the heater elements 605 and 606 forming a two-layer structure, the insulation plates 607 and 608 forming a two-layer structure, and the bottom portion side of the electrostatic chuck part 602 is formed on the upper surface side of the temperature controlling base part 603. A sheet type adhesion layer 607A, the insulation plate 607, the wiring layer 604, the insulation plate 608, the second heater element 606, the first heater element 605, the adhesion layer 609, and the bottom portion side of the supporting plate 612 are accommodated in this order from the bottom portion side in the recess portion 603a, and they are integrated by an adhesive layer 610 formed so as to fill the recess portion 603a.

The insulation plate 607 is bonded to the upper surface of the recess portion 603a by the adhesion layer 607A. The adhesion layer 607A is made of a sheet-shaped or film-shaped adhesive resin having heat resistance and insulating properties, such as polyimide resin, silicon resin, or epoxy resin. The adhesion layer is formed to have a thickness in a range of about 5 to 100 µm, for example. Each of the insulation plates 607 and 608 is made of a thin plate, a sheet, or a film of resin having heat resistance, such as polyimide resin, epoxy resin, or acrylic resin. The adhesion layer 609 is configured with a sheet type adhesive layer having heat resistance and is made of the same material as the adhesion layer 607A.

Each of the insulation plates 607 and 608 may be an insulating ceramic plate instead of the resin sheet and may be a thermally sprayed film having insulating properties such as alumina.

As an example, the wiring layer 604 is formed on the upper surface of the insulation plate 607, the second heater element 606 is formed on the upper surface of the insulation plate 608, the first heater element 605 is bonded to the bottom surface side of the supporting plate 612, the insulation plates 607 and 608 are laminated, and the peripheries of these elements are covered with the adhesive layer 610, whereby the laminated structure shown in FIG. 13 is realized.

Figure 14:
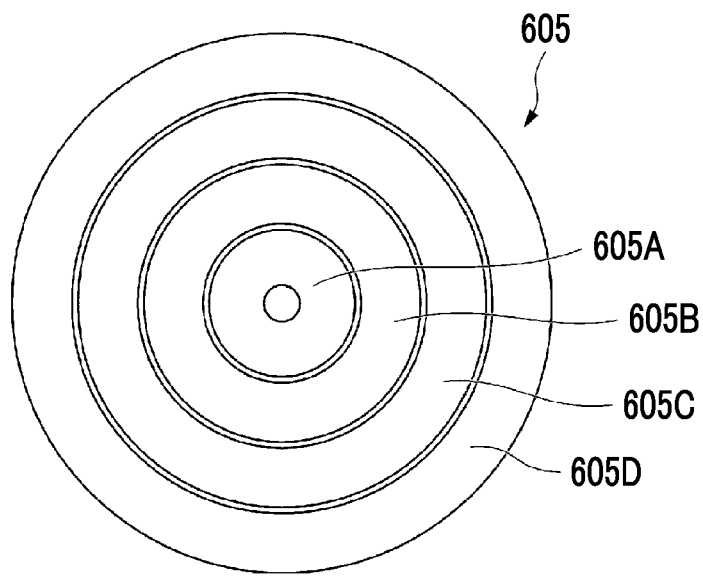
FIG. 14 is a plan view showing an example of a pattern of a main heater element which is provided in the electrostatic chuck device.

The first heater element 605 is configured with a first main heater 605A disposed in an annular region of a central portion, and a second main heater 605B, a third main heater 605C, and a fourth main heater 605D disposed in annular regions so as to sequentially surround the first main heater 605A, as shown in FIG. 14. It is preferable that an area in which the first to fourth main heaters 605A to 605D are disposed as shown in FIG. 14 has approximately the same size as the disk-shaped electrostatic chuck part 602.

In FIG. 14, each of the main heaters 605A, 605B, 605C, and 605D is drawn in a simple annular shape when viewed in a planar view. However, each of the main heaters 605A, 605B, 605C, and 605D is disposed so as to occupy an annular region shown in FIG. 14 by meandering a strip-shaped heater. For this reason, in the cross-sectional structure shown in FIG. 13, strip-shaped heaters configuring the respective main heaters 605A, 605B, 605C, and 605D are individually drawn.

As an example, each of the main heaters 605A to 605D is obtained by processing a non-magnetic metal thin plate, for example, a titanium (Ti) thin plate, a tungsten (W) thin plate, a molybdenum (Mo) thin plate, or the like, having a constant thickness of 0.2 mm or less, preferably, about 0.1 mm, into a desired heater shape by a photolithography method, for example, processing an entire contour of a meandering shape of a strip-shaped heater into an annular shape.

These main heaters 605A to 605D are bonded and fixed to the bottom surface of the supporting plate 612 by the adhesion layer 609 made of a sheet-shaped or film-shaped silicon resin, acrylic resin, or the like having a uniform thickness and having heat resistance and insulating properties.

Figure 15:
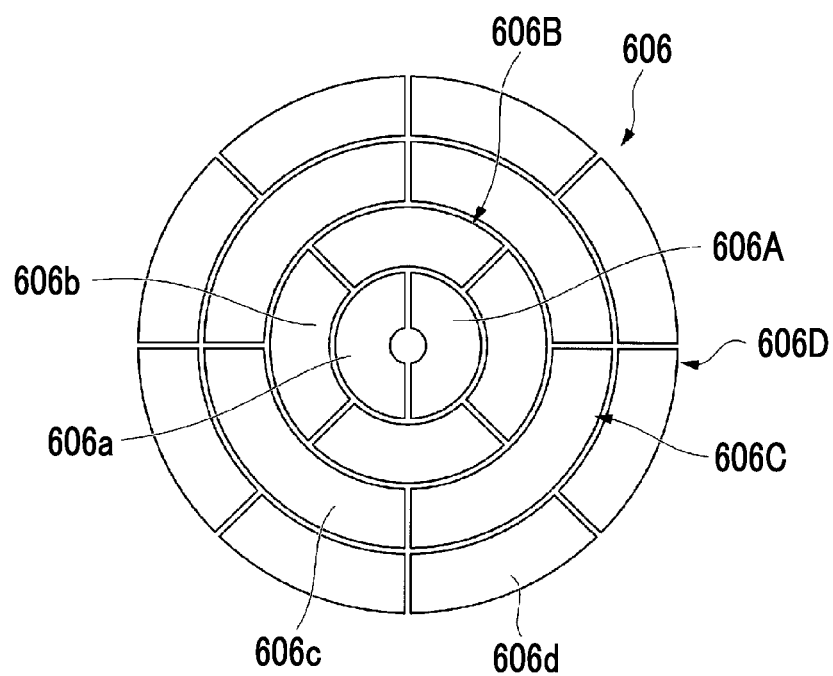
FIG. 15 is a plan view showing an example of a pattern of a sub-heater element which is provided in the electrostatic chuck device.

The second heater element 606 is configured with a first sub-heater 606A disposed in an annular region of a central portion, and a second sub-heater 606B, a third sub-heater 606C, and a fourth sub-heater 606D disposed in annular regions so as to sequentially surround the first sub-heater 606A, as shown in FIG. 15. The first sub-heater 606A is annularly formed by combining a plurality of (in the case of the configuration of FIG. 15, two) heater split bodies 606a disposed in regions each having a fan-shaped annular body shape, and the second sub-heater 606B is annularly formed by combining a plurality of (in the case of the configuration of FIG. 15, four) heater split bodies 606b disposed in regions each having a fan-shaped annular body shape. The third sub-heater 606C is annularly formed by combining a plurality of (in the case of the configuration of FIG. 15, four) heater split bodies 606c disposed in regions each having a fan-shaped annular body shape. The fourth sub-heater 606D is annularly formed by combining a plurality of (in the case of the configuration of FIG. 15, eight) heater split bodies 606d disposed in regions each having a fan-shaped annular body shape.

Each of the heater split bodies 606a to 606d is obtained by processing a non-magnetic metal thin plate, for example, a molybdenum (Mo) thin plate, a tungsten (W) thin plate, a niobium (Nb) thin plate, a titanium (Ti) thin plate, a copper (Cu) thin plate, or the like, which is thinner than the main heaters 605A to 605D, into a desired heater shape by a photolithography method, for example, processing an entire contour of a meandering shape of a strip-shaped heater into a fan-shaped annular body shape. Each of these heater split bodies 606a to 606d needs to have a configuration exhibiting a calorific value lower than the calorific value per unit area of each of the main heaters 605A to 605D and is configured into a thinner structure than each of the main heaters 605A to 605D, or configured of a material having a low amount of heat generation. As an example, in a case where the main heater is configured of a Ti thin plate having a thickness of 100 μm, the sub-heater can be configured of a Mo thin plate having a thickness of 5 μm.

These heater split bodies 606a to 606d are bonded and fixed to the upper surface of the insulation plate 608 by an adhesive layer (not shown) made of a sheet-shaped or film-shaped silicon resin, acrylic resin, or the like having a uniform thickness and having heat resistance and insulating properties.

In this embodiment, the sub-heaters 606A, 606B, 606C, and 606D have two-, four-, and eight-division structures. However, the number of divisions may be arbitrary, and a shape in a case of being divided may also be arbitrary.

As described above, the first heater element 605 is configured with the main heaters 605A, 605B, 605C, and 605D, and a plurality of power supply terminals 617 for feeding electric power to these individual main heaters 605A, 605B, 605C, and 605D are provided. In FIG. 14, only the schematic shapes of the main heaters 605A, 605B, 605C, and 605D are shown. However, in any heater, conduction parts for connecting it to a power supply are provided on one end side and the other end side of each heater, and therefore, two power supply terminals 617 are provided for each of the main heaters 605A, 605B, 605C, and 605D and a total of eight power supply terminals 617 are provided.

In FIG. 13, for simplification of description, only one power supply terminal 617 connected to the outermost peripheral main heater 605D is drawn. However, the power supply terminal 617 is disposed so as to partially penetrate the temperature controlling base part 603, the insulation plates 607 and 608, the sub-heater 606D, and the adhesive layer 610 which is present in the peripheries of these elements, in the thickness direction thereof. Further, a tubular insulator 618 for insulation is mounted on the outer peripheral surface of the power supply terminal 617, and thus the temperature controlling base part 603 and the power supply terminal 617 are insulated from each other.

As a material configuring the power supply terminal 617, the same material as the material configuring the power supply terminal 615C described above can be used.

Although all the power supply terminals 617 are not drawn in FIG. 13, two power supply terminals 617 are connected to any of the main heaters 605A, 605B, 605C, and 605D, and a switching element and a power source device (not shown) are connected to each of the main heaters 605A, 605B, 605C, and 605D through the two power supply terminals 617 such that energization control can be performed.

These power supply terminals 617 are respectively provided so as to penetrate the through-holes 603b formed in the temperature controlling base part 603, and in a case where the other party to be connected is any one of the main heaters 605A, 605B, 605C, and 605D, the power supply terminals 617 are provided so as to penetrate the insulation plates 607 and 608 as well. With the configuration described above, energization and heat generation control of each of the main heaters can be performed with respect to each of the main heaters 605A, 605B, 605C, and 605D according to the operation of the power source.

Further, a temperature sensor 620 is provided on the lower surface side of each of the main heaters 605A, 605B, 605C, and 605D. In the structure shown in FIG. 13, an installation hole 621 is formed so as to partially penetrate the temperature controlling base part 603, the insulation plates 607 and 608, the sub-heater 606D, and the adhesive layer 610 which is present in the peripheries of these elements, in the thickness direction thereof, and the temperature sensor 620 is installed at the uppermost portion of the installation hole 621 and at a position close to any one of the main heaters 605A, 605B, 605C, and 605D. It is desirable that the temperature sensors 620 are installed at positions as close to the main heaters 605A, 605B, 605C, and 605D as possible, and therefore, in the structure shown in FIG. 13, a protrusion portion 607a is formed at a part of the insulation plate 607 so as to protrude toward the main heater side, and the temperature sensor 620 is provided inside of the protrusion portion 607a.

The temperature sensor 620 is a fluorescent emission type temperature sensor in which a phosphor layer is formed on the upper surface side of a rectangular parallelepiped-shaped light transmission body made of quartz glass or the like, as an example, and the temperature sensor 620 is bonded to the lower surface of each of the main heaters 605A, 605B, 605C, and 605D by a silicon resin-based adhesive or the like having translucency and heat resistance.

The phosphor layer is made of a material which generates fluorescence in response to heat generation from the main heater, and a wide variety of fluorescent materials can be selected as long as it is a material which generates fluorescence in response to heat generation. However, as an example, a material appropriately selected from a fluorescent material to which a rare earth element having an energy level suitable for light emission is added, a semiconductor material such as AlGaAs, a metal oxide such as a magnesium oxide, and a mineral such as ruby or sapphire can be used.

The temperature sensors 620 corresponding to the main heaters 605A, 605B, and 605D are respectively provided at positions which do not interfere with the power supply terminal and the like and at arbitrary positions in the circumferential direction of the lower surfaces of the main heaters 605A, 605B, and 605D.

A temperature measurement unit 622 which measures the temperatures of the main heaters 605A to 605D from the fluorescence of these temperature sensors 620 is configured of an excitation unit 623 which irradiates the phosphor layer with excitation light on the outside (the lower side) of the installation hole 621 of the temperature controlling base part 603, a fluorescence detector 624 which detects the fluorescence emitted from phosphor layer, and a control part 625 which controls the excitation unit 623 and the fluorescence detector 624 and calculates the temperature of the main heater on the basis of the fluorescence, as shown in FIG. 13, as an example.

Incidentally, in FIG. 13, a reference numeral 628 denotes a pin insertion hole provided so as to partially penetrate from the temperature controlling base part 603 to the mounting plate 611 in the thickness direction thereof, and a lift pin for removal of the plate-shaped sample is provided in the pin insertion hole 628. A tubular insulator 629 is provided on the outer peripheral portion of the pin insertion hole 628.

Next, the heater split bodies configuring the sub-heaters 606A to 606D and a structure for individually feeding electric power to the heater split bodies will be described.

The sub-heaters 606A to 606D have collective structures of a plurality of heater split bodies 606a, 606b, 606c, and 606d obtained by individually dividing the respective sub-heaters 606A to 606D in the circumferential direction thereof, as shown in FIG. 15, when viewed in a planar view. In order to feed electric power to the heater split bodies 606a, 606b, 606c, and 606d, in this embodiment, the wiring layer 604 made of a low resistance material such as copper is provided on the upper surface side of the insulation plate 607.

The wiring layer 604 is configured with a plurality of wiring bodies 604a branched individually, and each of the wiring bodies 604a is connected to any one of the heater split bodies 606a, 606b, 606c, and 606d.

In FIG. 13, the plurality of wiring bodies 604a are disposed on the upper surface side of the insulation plate 607 so as to extend from the central portion side thereof to the peripheral edge side, and one end side of each of the wiring bodies 604a is connected to any one of the heater split bodies through a conduction part 608b such as a welded part formed in a contact hole formed in a part of the insulation plate 608. Further, the other end side of each of the wiring bodies 604a is connected to a power supply terminal 626 through a conduction part 607b such as a welded part formed in a contact hole formed in a part of the insulation plate 607. The power supply terminal 626 is formed so as to penetrate the temperature controlling base part 603 in the thickness direction thereof along the through-hole 603b of the temperature controlling base part 603 and reach the insulation plate 607, and an insulator 627 for insulation is provided on the outer periphery side of the power supply terminal 626, and thus the power supply terminal 626 is insulated from the temperature controlling base part 603.

The plurality of heater split bodies 606a, 606b, 606c, and 606d are formed in the circumferential direction of the sub-heaters 606A, 606B, 606C, and 606D, and therefore, the power supply terminals 626 to be connected to the heater split bodies are disposed at positions spaced apart from each other in the circumferential direction of the temperature controlling base part 603 such that the power supply terminals 626 do not interfere with each other, and the heater split bodies 606a, 606b, 606c, and 606d are individually connected by using the individual wiring bodies 604a.

In order to individually feed electric power to the heater split bodies 606a, 606b, 606c, and 606d, two power supply terminals 626 are connected to each heater split body. However, in the cross-sectional structure shown in FIG. 13, only a part is shown and the connection structure of the other wiring body 604a is abbreviated as appropriate.

The two power supply terminals 626 are connected to any of the heater split bodies 606a, 606b, 606c, and 606d, and a switch element and a power source device are connected to each of the heater split bodies 606a, 606b, 606c, and 606d through the two power supply terminals 626.

With the configuration described above, energization and heat generation control can be performed with respect to each of the heater split bodies 606a, 606b, 606c, and 606d according to the operation of the switch element and the power supply.

The number of power supply terminals 626 of the sub-heaters 606A to 606D can be less than twice the number of heater split bodies due to the heater pattern and the disposition of the switch element.

In the electrostatic chuck device 601 having the structure described above, it is preferable that the heat transfer coefficient between the first heater element 605 and the temperature controlling base part 603 is smaller than 4000 W/m²K and larger than 200 W/m²K.

If the heat transfer coefficient is larger than 200 W/m²K, it is possible to increase the thermal responsiveness between the first heater element 605 and the temperature controlling base part 603, and thus in a case of performing the temperature control of the electrostatic chuck device 602, temperature control with good responsiveness becomes possible.

The electrostatic chuck device 601 configured as described above can be used to attract the plate-shaped sample W onto the protrusion portions 611b of the mounting surface 611a by generating an electrostatic attraction force by feeding electric power from the power supply terminal 615C to the electrode for electrostatic attraction 613 of the electrostatic chuck part 602.

Further, the plate-shaped sample W can be cooled by circulating a refrigerant in the temperature controlling base part 603, and temperature control can be performed by heating the plate-shaped sample W by causing the main heaters 605A to 605D to individually generate heat by feeding electric power from the power supply to each of the main heaters 605A to 605D through the power supply terminal 617. Further, by individually energizing the heater split bodies 606a to 606d, it is possible to finely adjust the temperatures of the regions corresponding to the heater split bodies 606a to 606d.

If the plate-shaped sample W is supplied to an etching apparatus or a film forming apparatus and exposed to a plasma atmosphere or a film formation atmosphere, a temperature difference occurs in the plate-shaped sample W according to a plasma generation state, a temperature distribution in a film formation chamber, or the like.

Figure 16:
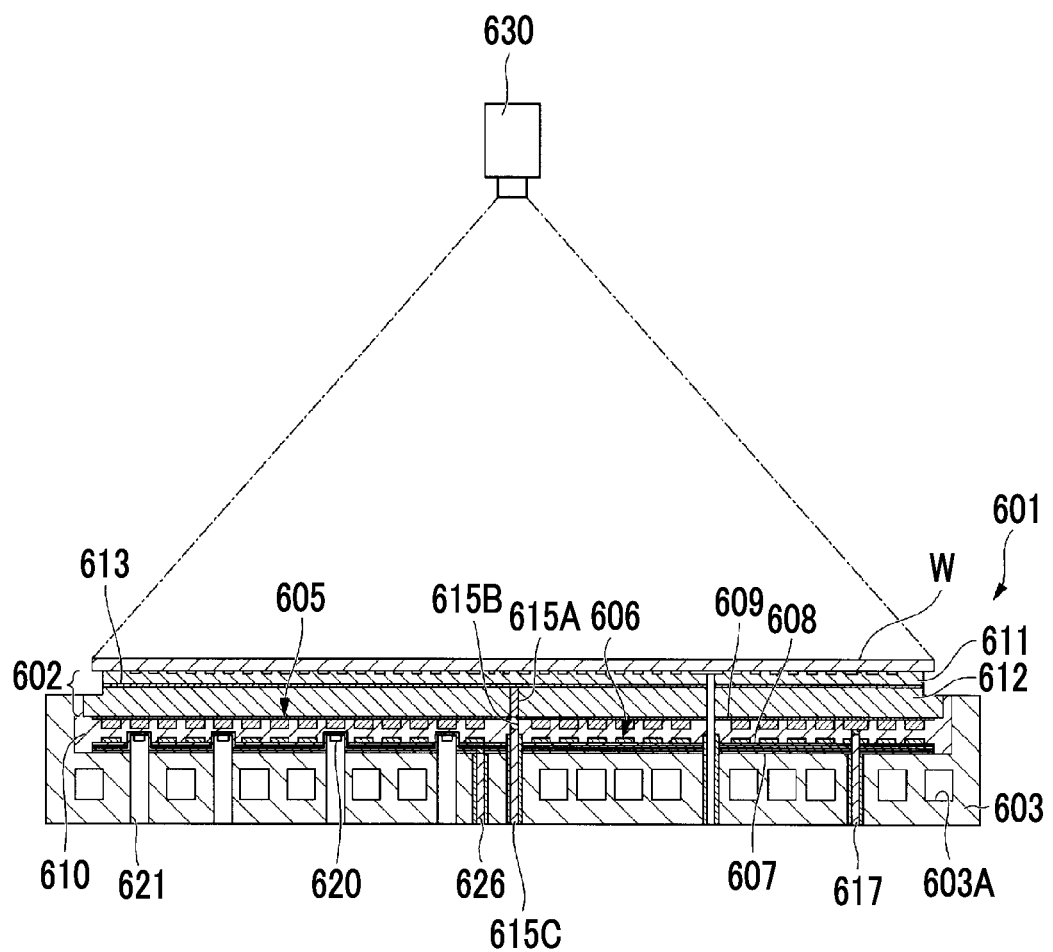
FIG. 16 is an explanatory diagram showing a state where a surface temperature distribution of a plate-shaped sample supported by the electrostatic chuck device is examined by a thermo-camera.

For example, as shown in FIG. 16, a temperature distribution in the surface of the plate-shaped sample W is photographed by a thermo-camera 630 and analyzed by a thermograph, and then, if a region having a low temperature is generated in the plate-shaped sample W, the surface temperature of the plate-shaped sample W can be uniformized by locally raising the surface temperature of each corresponding zone of the plate-shaped sample W above the individual regions of the heater split bodies 606a, 606b, 606c, and 606d by energizing and heating any one of the heater split bodies 606a, 606b, 606c, and 606d in the corresponding region.

Temperature control at the time of heating can be performed by application voltage control, voltage application time control, current value control, or the like when energizing each of the heater split bodies 606a, 606b, 606c, and 606d.

In the structure described above, a configuration is made such that the second heater element 606 is divided into a plurality of heater split bodies 606a, 606b, 606c, and 606d and the energization and heat generation control can be performed individually, and therefore, even in a case where a temperature distribution occurs in the attracted plate-shaped sample W, the temperature distribution can be uniformized by raising the temperature of a low-temperature zone of the plate-shaped sample W by energizing any one of the heater split bodies 606a, 606b, 606c, and 606d at a position corresponding to the low-temperature zone to generate heat.

For this reason, in a case where the plate-shaped sample W is held by the electrostatic chuck device 1 for plasma etching, film formation, or the like, uniform etching or uniform film formation can be performed by uniformizing the surface temperature of the plate-shaped sample W by individual temperature control of the heater split bodies 606a to 606d.

Further, the calorific value per unit area of each of the heater split bodies 606a, 606b, 606c, and 606d is reduced with respect to the main heaters 605A to 605D, and therefore, it is possible to reduce the energization amount of the heater split bodies 606a, 606b, 606c, and 606d for temperature fine adjustment. Further, the energization amount of the heater split bodies 606a, 606b, 606c, and 606d can be reduced, and therefore, for example, the power supply amount can be reduced by using a pulse current as the energizing current of the heater split bodies 606a, 606b, 606c, and 606d.

In the structure described above, the thickness of each of the main heaters 605A to 605D and the thickness of each of the heater split bodies 606a, 606b, 606c, and 606d can be freely selected at the time of manufacturing, and therefore, it is possible to individually set the withstand voltage according to each heater and each wiring and it is possible to set a desirable individual withstand voltage value for each heater and each wiring. For example, by setting the thickness of the main heater made of a Ti thin plate to be 100 μm and setting the thickness of the heater split body made of a Mo thin plate to be 5 μm, as an example, it is possible to adjust the calorific value per unit area of the heater split body to ⅕ or less of the main heater. Of course, the adjustment of the calorific value of the main heater and the heater split body may be performed by the adjustment of a supply voltage, in addition to the constituent material and the heater thickness.

Incidentally, in the structure of the fourth embodiment, a structure is made in which the first heater element 605 is divided into four portions in the radial direction thereof to form the four main heaters 605A to 605D. However, the number of divided portions of the first heater element 605 is not limited to four and may be any number. Further, with respect to the second heater element 606, the second heater element 606 is divided into four portions in the radial direction to form the four sub-heaters 606A to 606D, and the first sub-heater 606A has a two-division structure, the second sub-heater 606B has a four-division structure, the third sub-heater 606C has a four-division structure, and the fourth sub-heater 606D has an eight-division structure. However, the number of divided portions of the second heater element 606 in the radial direction may be any number, and the number of divided portions of each sub-heater may also be any number. However, from the viewpoint of performing local temperature fine adjustment by the sub-heaters, it is preferable that the number of divided portions of the second heater element 606 is larger than the number of divided portions of the first heater element 605.

In this embodiment, the second heater element 606 has a single layer structure. However, the second heater element 606 may have a multilayer structure made of two or more layers. Further, in this embodiment, the first heater element 605 and the second heater element 606 are disposed at regions overlapping in an annular shape when viewed in a planar view. However, they may be disposed at positions slightly deviated from overlapping regions when viewed in a planar view. For example, it is also possible to dispose the plurality of sub-heaters of the second heater element so as to fill slight gaps formed between the plurality of main heater installation regions (annular installation regions) configuring the first heater element 605 when viewed in a planar view, thereby filling the gap regions between the plurality of main heaters with the plurality of sub-heaters. Of course, in a case where two or more layers of second sub-heaters are disposed, a structure may be adopted in which the gap between the main heaters is filled by shifting the disposition region of each layer when viewed in a planar view.

Fifth Embodiment

Figure 17:
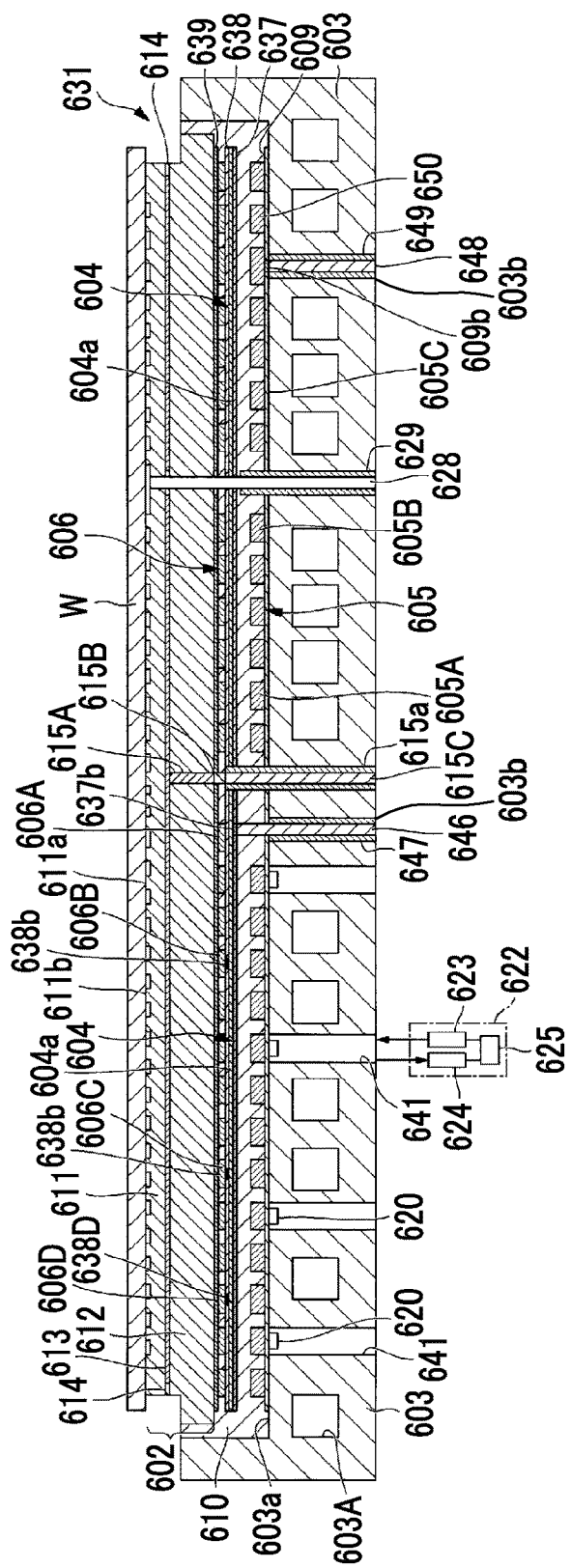
FIG. 17 is a cross-sectional view showing an electrostatic chuck device according to a fifth embodiment of the present invention.

FIG. 17 is a cross-sectional view showing an electrostatic chuck device according to a fifth embodiment of the present invention, and an electrostatic chuck device 631 of this embodiment has a structure in which the vertically structured relationship between the main heater and the sub-heater is reversed with respect to the electrostatic chuck device 601 of the fourth embodiment.

The electrostatic chuck device 631 is the same as the electrostatic chuck device 601 of the fourth embodiment in that the electrostatic chuck device 631 is provided with the electrostatic chuck part 602, the temperature controlling base part 603 provided below the electrostatic chuck part 602, and the heater elements 605 and 606 interposed between the electrostatic chuck part 602 and the temperature controlling base part 603. However, the electrostatic chuck device 631 of this embodiment is different from the electrostatic chuck device 601 of the fourth embodiment in that the second heater element 606 is provided between the first heater element 605 and the electrostatic chuck part 602.

The electrostatic chuck device 631 is provided with two insulation plates 637 and 638, an adhesion layer 639, and the adhesion layer 609 interposed so as to be laminated with the heater elements 605 and 606 between the electrostatic chuck part 602 and the temperature controlling base part 603, the wiring layer 604 interposed between the insulation plate 637 and the insulation plate 638, and the adhesive layer 610 formed to cover the peripheries of these elements. The structure of the electrostatic chuck part 602 is the same as the structure in the fourth embodiment.

In the structure of the fifth embodiment, the adhesion layer 609, the first heater element 605, the insulation plate 637, the wiring layer 604, the insulation plate 638, the second heater element 606, the adhesion layer 639, and the bottom portion side of the supporting plate 612 are accommodated in this order from the bottom portion side in the recess portion 603a of the temperature controlling base part 603, and they are integrated by the adhesive layer 610 formed so as to fill the recess portion 603a.

The first heater element 605 is configured with the first main heater 605A, the second main heater 605B, the third main heater 605C, and the fourth main heater 605D in the same manner as the structure in the fourth embodiment.

The second heater element 606 is configured with the first sub-heater 606A, the second sub-heater 605B, the third sub-heater 605C, and the fourth sub-heater 606D in the same manner as the structure in the fourth embodiment. The first sub-heater 606A is configured with the two heater split bodies 606a, the second sub-heater 606B is configured with the four heater split bodies 606b, the third sub-heater 606C is configured with the four heater split bodies 606c, and the fourth sub-heater 606D is configured with the eight heater split bodies 606d.

A plurality of power supply terminals 648 which are respectively connected to the first main heater 605A, the second main heater 560B, the third main heater 605C, and the fourth main heater 605D are provided so as to penetrate the temperature controlling base part 603 in the thickness direction thereof with insulators 649 and connected to the main heaters 605A to 605D through the conduction parts 609b such as welded parts formed in the contact holes formed in the adhesion layer 609.

A plurality of power supply terminals 646 which are respectively connected to the heater split bodies 606a to 606d are provided so as to penetrate the temperature controlling base part 603, the adhesion layer 609, and the adhesive layer 610 in the thickness direction thereof with insulators 647 and connected to the wiring layer 604 formed on the insulation plate 638 through conduction parts 637b such as welded parts formed in contact holes formed in the insulation plate 637. The wiring layer 604 is formed on the upper surface side of the insulation plate 638 and connected to any one of the heater split bodies 606a, 606b, 606c, and 606d through a conduction part 638b such as a welded part formed in a contact hole formed in the insulation plate 638.

Further, in this embodiment, an installation hole 641 penetrating the temperature controlling base part 603 in the thickness direction thereof is formed below the position of any one of the main heaters 605A to 605D, and the temperature sensor 620 is provided at an upper portion of the installation hole 641 and on the lower surface side of the adhesion layer 609 so as to be close to any one of the main heaters 605A to 605D.

The structure of the fifth embodiment is the same as the structure of the fourth embodiment except that the vertically structured relationship between the first heater element 605 and the second heater element 606 described above is reversed with respect to the structure in the fourth embodiment, the structures of the power supply terminals 646 and 648 are different in connection with it, the structures of the insulation plates 637 and 638 are different, and the installation position of the temperature sensor 620 is different.

In the structure of the fifth embodiment, the second heater element 606 having a small amount of heat generation per unit area, for example, a calorific value of ⅕ or less, is installed on the side close to the electrostatic chuck part 602, and the first heater element 605 is installed on the side close to the temperature controlling base part 603 to be separated from the electrostatic chuck part 602.

Also in the structure of the fifth embodiment, the plate-shaped sample W is uniformly heated by the heat generation of the main heaters 605A to 605D having a large amount of heat generation, and in a case where a temperature distribution occurs in the plate-shaped sample W, the uniformity of the surface temperature of the plate-shaped sample W can be maintained by performing the temperature control of the plate-shaped sample W by energizing any one of the heater split bodies 606a, 606b, 606c, and 606d having a small amount of heat generation.

In this embodiment, the heater split bodies 606a, 606b, 606c, and 606d each having a small amount of heat generation are disposed at positions close to the plate-shaped sample W, and therefore, a more local temperature control can be performed by using the heater split bodies each having a small amount of heat generation.

The other operation and effects are the same as the operation and effects which are obtained from the structure of the fourth embodiment described above.

Sixth Embodiment

Figure 18:
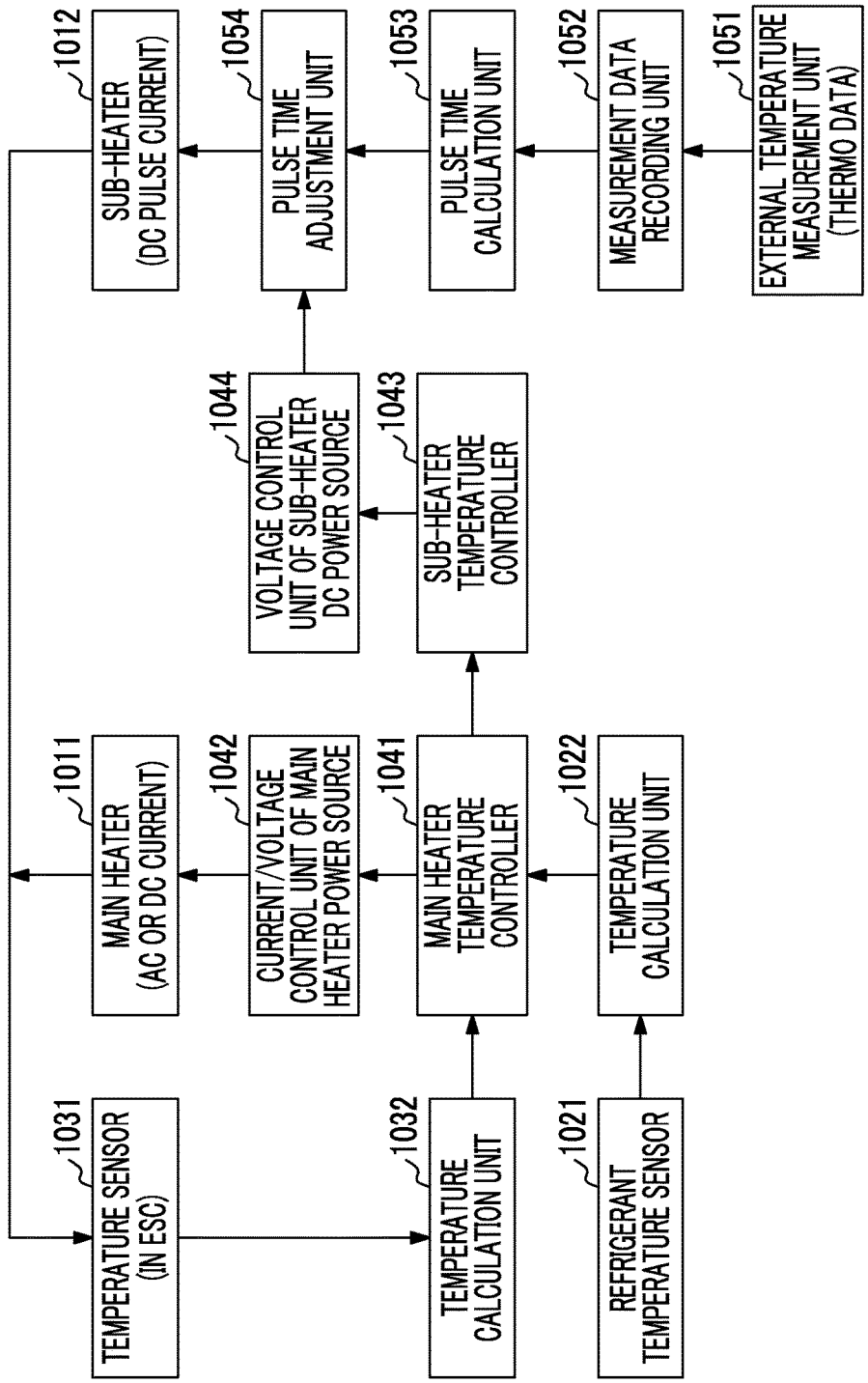
FIG. 18 is a block diagram showing a schematic configuration of an electrostatic chuck device according to an embodiment (a sixth embodiment) of the present invention.

FIG. 18 is a block diagram showing a schematic configuration of an electrostatic chuck device 1001 according to an embodiment (a sixth embodiment) of the present invention.

The electrostatic chuck device 1001 is provided with a temperature controlling base part 1201 (shown in FIG. 19), an electrostatic chuck part 1211 (shown in FIG. 19), a main heater 1011, a sub-heater 1012, a refrigerant temperature sensor 1021, a temperature calculation unit 1022, a temperature sensor 1031 in an electrostatic chuck (ESC), a temperature calculation unit 1032, a temperature controller of each main heater 1011 of the first heater element (a main heater temperature controller 1041), a current/voltage control unit 1042 of a power source of the main heater 1011, a temperature controller of the sub-heater 1012 (a sub-heater temperature controller 1043), a voltage control unit 1044 of a DC power source of the sub-heater 1012, an external temperature measurement unit 1051, a measurement data recording unit 1052, a pulse time calculation unit 1053, and a pulse time adjustment unit 1054.

Figure 19:
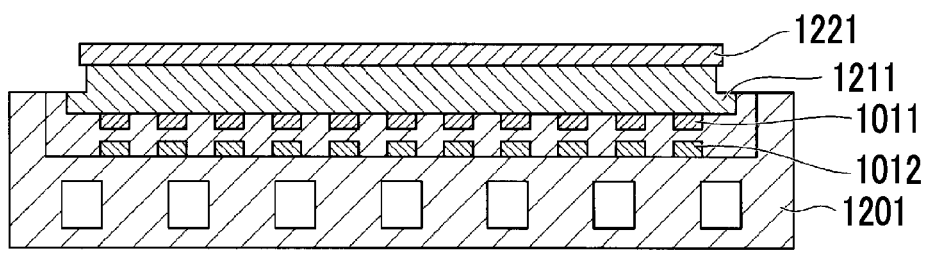
FIG. 19 is a diagram schematically showing disposition of a heater and the like in an electrostatic chuck device according to an embodiment of the present invention.

FIG. 19 is a diagram schematically showing the disposition of a heater and the like in the electrostatic chuck device 1001 according to an embodiment of the present invention.

In the electrostatic chuck device 1001 according to this embodiment, the temperature controlling base part 1201, the sub-heater 1012, the main heater 1011, and the electrostatic chuck part 1211 are disposed in layers in this order from the lower side to the upper side. A wafer 1221 which is the plate-shaped sample is placed on the upper surface of the electrostatic chuck part 1211.

As another configuration example, the sub-heater 1012 may be disposed further toward the upper side than the main heater 1011 and further toward the lower side than the electrostatic chuck part 1211.

Here, the electrostatic chuck part 1211 has one principal surface serving as amounting surface on which the plate-shaped sample is mounted, and is provided with an electrode for electrostatic attraction.

Further, the temperature controlling base part 1201 is disposed on the side opposite to the mounting surface with respect to the electrostatic chuck part 1211 and cools the electrostatic chuck part 1211.

Figure 20:
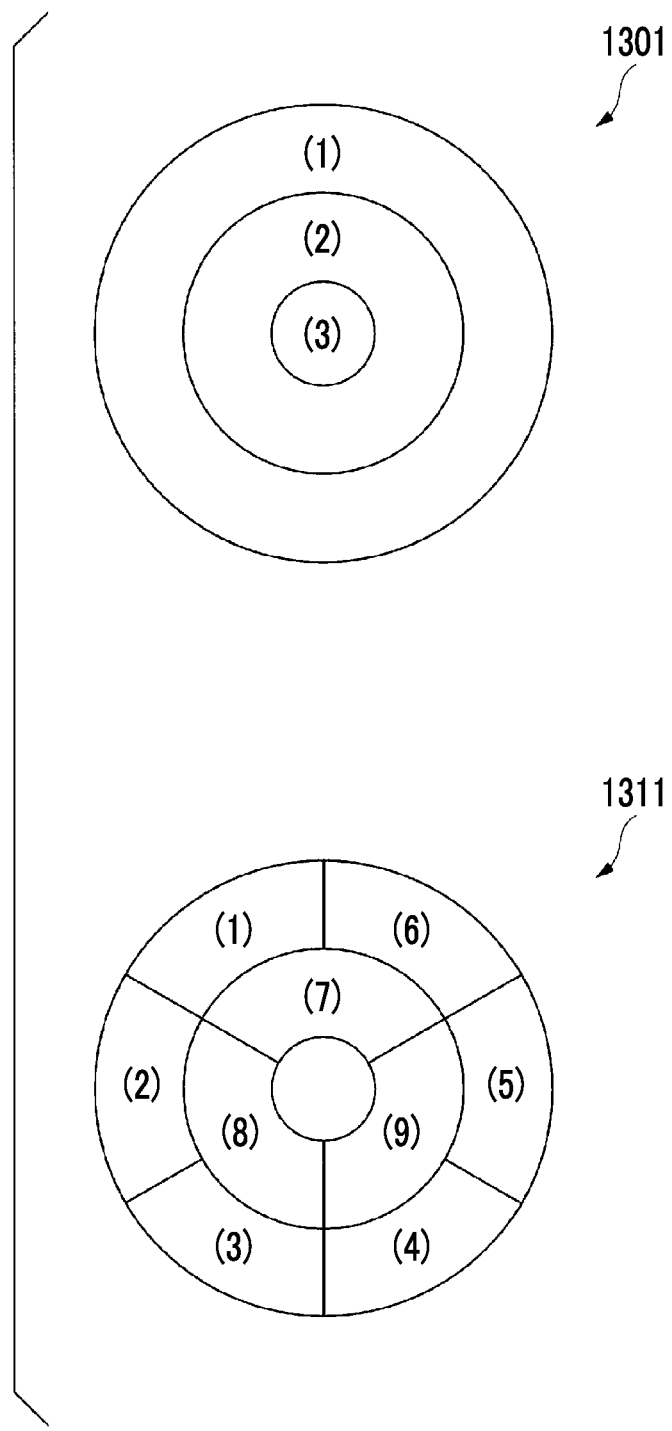
FIG. 20 is a diagram showing an example of regions (temperature control regions) in which a temperature is adjusted by each of a main heater and a sub-heater according to an embodiment of the present invention.

FIG. 20 is a diagram showing an example of a region (a temperature control region) in which a temperature is controlled by each of the main heater 1011 and the sub-heater 1012 according to an embodiment of the present invention.

In this embodiment, a first heater element 1301 has a circular shape as a whole and is divided into three circular regions (temperature control regions) shown by (1) to (3) in FIG. 20 in the radial direction. The main heater 1011 is provided for each of these three regions.

In this embodiment, a second heater element 1311 has a circular shape as a whole and is divided into an outer region and an inner region in the radial direction. The outer region is divided into six regions (temperature control regions) shown by (1) to (6) in FIG. 20 in the circumferential direction. The inner region is divided into a central portion and a circular region surrounding the central portion, and the circular region is divided into three regions (temperature control regions) shown by (7) to (9) in FIG. 20 in the circumferential direction. The sub-heater 1012 is provided for each of these nine regions (temperature control regions). In this embodiment, the sub-heater 1012 is not provided in the central portion.

In this manner, in this embodiment, the first heater element 1301 and the second heater element 1311 configure two upper and lower zones. The zone of the first heater element 1301 is divided into three zones, and the zone of the second heater element 1311 is divided into four zones (one zone does not have the sub-heater) on the inner side and is divided into six zones on the outer side.

In this embodiment, the first heater element 1301 controls the temperatures of (1) to (3) in a plurality of temperature control regions, in each of which a temperature can be independently controlled performed by the main heater 1011.

In this embodiment, the sub-heaters 1012 are disposed so as to divide the respective temperature control regions of the first heater element 1301 (in the example of FIG. 20, (1) to (9) in the second heater element 1311) and disposed in a laminar form.

In this embodiment, the calorific value per unit area of each of the sub-heaters 1012 is ⅕ or less of that of the main heater 1011.

The first heater element 1301 may not be a single layer and may be configured with a plurality of layers. The second heater element 1311 may not be a single layer and may be configured with a plurality of layers.

The temperature controlling base part 1201 is a refrigerant. The temperature controlling base part 1201 performs cooling by using a flow path through which a heat medium such as water, He gas, or N2 gas, for example, circulates.

The electrostatic chuck part 1211 electrostatically attracts the wafer 1221 placed thereon.

The first heater element 1301 is configured of a single or a plurality of main heaters 1011 divided into a single or a plurality of regions.

The first heater element 1301 is configured with a single or a plurality of main heaters 1011 for adjusting the temperature of the attraction surface of the electrostatic chuck part 1211 in a single or a plurality of regions (temperature control regions). The main heater 1011 is controlled by an alternating current or a direct current. The main heater 1011 generates heat according to the voltage which is applied in this manner.

The second heater element 1311 is configured with a plurality of sub-heaters 1012 and performs temperature control of regions more than the regions in only the main heater 1011 by electric power which is supplied to the respective sub-heaters 1012. The sub-heater 1012 is controlled by a direct-current (DC) pulse current. The sub-heater 1012 generates heat according to the voltage (pulse voltage) which is applied in this manner.

The main heater 1011 and the sub-heater 1012 are separate heaters.

Here, in this embodiment, all the regions (1) to (3) in the first heater element 1301 shown in FIG. 20 are equivalent to regions (first heater element control regions) where a temperature is controlled by the first heater element 1301. Further, each of the regions (1) to (3) in the first heater element 1301 shown in FIG. 20 is equivalent to a region (a main heater control region) where a temperature is controlled by each heater (in this example, each of the three main heaters 1011) in the first heater element 1301.

Further, in this embodiment, all the regions (1) to (9) in the second heater element 1311 shown in FIG. 20 are equivalent to regions (second heater element control regions) where a temperature is controlled by the second heater element 1311. Further, each of the regions (1) to (9) in the second heater element 1311 shown in FIG. 20 is equivalent to a region (a sub-heater control region) where a temperature is controlled by each heater (in this example, each of the nine sub-heaters 1012) in the second heater element 1311.

Regarding these, one region (1) in the first heater element 1301 is divided into six regions (1) to (6) in the second heater element 1311. Further, one region (2) in the first heater element 1301 is divided into three regions (7) to (9) in the second heater element 1311.

In this way, a temperature can be adjusted by the main heater 1011 with respect to one region (1) in the first heater element 1301, and a temperature can be adjusted by the sub-heater 1012 for each of the six regions (1) to (6) in the second heater element 1311. Further, a temperature can be adjusted by the main heater 1011 with respect to one region (2) in the first heater element 1301, and a temperature can be adjusted by the sub-heater 1012 for each of the three regions (7) to (9) in the second heater element 1311.

The refrigerant temperature sensor 1021 is a sensor which is installed in the temperature controlling base part 1201 itself or in the vicinity thereof to detect the temperature of the temperature controlling base part 1201. As an example, the refrigerant temperature sensor 1021 is installed in a chiller of the temperature controlling base part 1201 or in the vicinity thereof and detects the temperature of the chiller.

The temperature calculation unit 1022 calculates a temperature on the basis of a signal corresponding to the temperature detection result which is output from the refrigerant temperature sensor 1021.

The temperature sensor 1031 in the electrostatic chuck (ESC) is a sensor which is installed in the electrostatic chuck (ESC) to detect a temperature. This temperature can be affected by the main heater 1011 and the sub-heater 1012. This temperature is at least a temperature corresponding to the main heater 1011.

The temperature calculation unit 1032 calculates a temperature on the basis of a signal corresponding to the temperature detection result which is output from the temperature sensor 1031.

The main heater temperature controller 1041 generates and outputs information for performing temperature control by the main heater 1011 on the basis of the temperatures calculated by the two temperature calculation units 1022 and 1032.

The current/voltage control unit 1042 of the main heater power source controls the current/voltage (one or both of the current and the voltage) of the power supply of the main heater 1011 on the basis of the information output by the main heater temperature controller 1041.

The sub-heater temperature controller 1043 generates and outputs information for performing temperature control by the sub-heater 1012 on the basis of the information output by the main heater temperature controller 1041. The relationship between the information which is output from the main heater temperature controller 1041 and the information which is output from the sub-heater temperature controller 1043 is set and stored in advance, for example.

The voltage control unit 1044 of the sub-heater DC power source controls the value of the voltage of the DC power source of the sub-heater 1012 by controlling the pulse time adjustment unit 1054 on the basis of the information which is output from the sub-heater temperature controller 1043.

The external temperature measurement unit 1051 measures a temperature relating to the temperature control region for each of the sub-heaters 1012. As this measurement data, for example, data based on temperature data (thermo data) detected from above the electrostatic chuck part 1211 by a thermo-camera can be used. Further, this measurement data is collected and recorded in advance, for example. As the temperature, an average value in a predetermined period of time may be used. Further, as the temperature, it is not limited to the temperature of the electrostatic chuck part 1211, and the temperature of the wafer 1221 placed on the upper surface of the electrostatic chuck part 1211 may be used.

The measurement data recording unit 1052 records (stores) the measurement data obtained by the external temperature measurement unit 1051.

The pulse time calculation unit 1053 calculates a pulse time (for example, a pulse time for each of the sub-heaters 1012) on the basis of the measurement data recorded in the measurement data recording unit 1052, and outputs information on the calculated pulse time. The manner (for example, an expression or the like) of this calculation is set and stored in advance, for example.

The pulse time adjustment unit 1054 adjusts the voltage value of a pulse signal (for example, a pulse current) under the control by the voltage control unit 1044 of the sub-heater DC power source, and adjusts the pulse time (pulse width) of the pulse signal on the basis of the information output from the pulse time calculation unit 1053.

In this case, the pulse time adjustment unit 1054 may further acquire the information (for example, information on the temperature at the time of measurement) recorded in the measurement data recording unit 1052 through the pulse time calculation unit 1053 and calculate the voltage value by using the information. How to adjust the voltage value of the pulse signal and how to adjust the pulse time are set and stored in advance, for example.

The pulse signal with the adjusted voltage value and pulse time is applied to the sub-heater 1012.

Here, in this embodiment, the function of the control part which controls the voltage which is applied to the sub-heater 1012 is configured using the functions of the refrigerant temperature sensor 1021, the temperature calculation unit 1022, the temperature sensor 1031 in the electrostatic chuck (ESC), the temperature calculation unit 1032, the main heater temperature controller 1041, the sub-heater temperature controller 1043, the voltage control unit 1044 of the sub-heater DC power source, the measurement data recording unit 1052, the pulse time calculation unit 1053, and the pulse time adjustment unit 1054. As the configuration of the control part, it is not limited to that in this embodiment, and it is configured with, for example, one processing unit or two or more processing units which realize necessary functions.

In this embodiment, the control part uses a pulse voltage as the voltage which is applied to the sub-heater 1012.

In this embodiment, the control part uses a DC (direct-current) voltage as the voltage which is applied to the sub-heater 1012.

In this embodiment, the control part controls the magnitude (voltage value) of the voltage which is applied to the sub-heater 1012 with respect to the plurality of regions (temperature control regions) of the second heater element 1311.

In this embodiment, the control part controls the voltage which is applied to the main heater 1011.

In this embodiment, as an example, the control part controls the magnitude of the voltage which is applied to the sub-heater 1012 disposed so as to divide each main heater 1011 on the basis of the magnitude of the voltage which is applied to the main heater 1011. For example, the control part controls the magnitude of the voltage which is applied to the sub-heater 1012 of the division region (temperature control region) which is included in the temperature control region of the main heater 1011 so as to interlock based on the magnitude of the voltage which is applied to the main heater 1011. As the interlocking, proportion or the like is used. Instead of the voltage which is applied to the main heater 1011, a current or electric power may be used.

In this embodiment, as another example, the control part controls the magnitude of the voltage which is applied to the sub-heater 1012 disposed so as to divide each main heater 1011 on the basis of the temperature difference between a temperature detection result relating to the main heater 1011 (at least a temperature detection result corresponding to the main heater 1011) and a chiller temperature (a temperature detection result corresponding to the chiller of the temperature controlling base part 1201). For example, the control part controls the magnitude of the voltage which is applied to the sub-heater 1012 of the division region (temperature control region) which is included in the temperature control region of the main heater 1011 so as to interlock based on the temperature difference between the temperature detection result relating to the main heater 1011 and the chiller temperature. As the interlocking, proportion or the like is used. As the temperature detection result relating to the main heater 1011, in this embodiment, the temperature detection result by the temperature sensor 1031 in the electrostatic chuck (ESC) is used. As the chiller temperature, in this embodiment, the temperature of the temperature detection result by the refrigerant temperature sensor 1021 is used.

In this embodiment, in a state where there is a temperature difference between the electrostatic chuck part 1211 and the temperature controlling base part 1201, the control part can always apply voltage to the main heater 1011 in processes other than a cooling process and intermittently apply voltage to each of the sub-heaters 1012.

Specifically, the control part makes the difference between the temperature of the electrostatic chuck part 1211 and the temperature of the temperature controlling base part 1201 a constant value (for example, 2 degrees, 5 degrees, or the like) or a certain value or more. As an example, the control part detects the difference between the temperature of the electrostatic chuck part 1211 and the temperature of the temperature controlling base part 1201 on the basis of the temperature detection results by the two temperature sensors (the temperature sensor 1031 in the electrostatic chuck (ESC) and the refrigerant temperature sensor 1021), and controls the voltage which is applied to the main heater 1011 such that the difference becomes a predetermined value. As another example, the control part may control the voltage which is applied to the main heater 1011 so as to become a predetermined ratio (for example, 2% or the like) with respect to the maximum output.

In such a configuration, it is possible to adjust the temperature of the electrostatic chuck part 1211 by the heat generation of the main heater 1011, and at this time, the temperature of the electrostatic chuck part 1211 becomes higher than the temperature of the temperature controlling base part 1201 and unevenness (for example, unevenness in a layered surface) can occur in the temperature distribution.

Therefore, a temperature is adjusted by the heat generation of the sub-heater 1012 so as to compensate for the unevenness. The adjustment of the temperature of the electrostatic chuck part 1211 may be performed based on the temperature detection result by the temperature sensor 1031 in the electrostatic chuck (ESC), for example.

In addition to the heat generation of the main heater 1011, the heat input by plasma can also affect the temperature of the electrostatic chuck part 1211, and therefore, the influence may be taken into consideration.

In this embodiment, a memory part (in this embodiment, the measurement data recording unit 1052) which stores information (in this embodiment, the measurement data) which is used to control the voltage which is applied to the sub-heater 1012 is provided. Then, the control part controls the voltage which is applied to the sub-heater 1012 on the basis of the information stored in the memory part.

Here, as an example, it is also possible to collect measurement data with respect to all assumed temperature conditions in advance and determine and store the voltage (a pulse width and a voltage value) which is applied to the sub-heater 1012, in advance. However, normally, the amount of data increases. For this reason, as another example, it is also possible to collect measurement data with respect to some temperature conditions among all assumed temperature conditions in advance, determine and store the voltage (a pulse width and a voltage value) which is applied to the sub-heater 1012, in advance, and control, with respect to the temperature conditions which were not determined in advance, the voltage which is applied to the sub-heater 1012 on the basis of the data stored in advance and the temperature condition at the time of control.

Specifically, as an configuration example, the memory part stores information corresponding to a part of a temperature range in which temperature control is performed by the sub-heater 1012, and the control part controls the voltage which is applied to the sub-heater 1012 on the basis of the information stored in the memory part and the magnitude of the voltage which is applied to the main heater 1011. Instead of the voltage which is applied to the main heater 1011, a current or electric power may be used. As another configuration example, the memory part stores information corresponding to a part of a temperature range in which temperature control is performed by the sub-heater 1012, and the control part controls the voltage which is applied to the sub-heater 1012 on the basis of the information stored in the memory part and the temperature difference between the temperature detection result relating to the main heater 1011 (at least the temperature detection result corresponding to the main heater 1011) and the chiller temperature (the temperature detection result corresponding to the chiller of the temperature controlling base part 1201).

Figure 21:
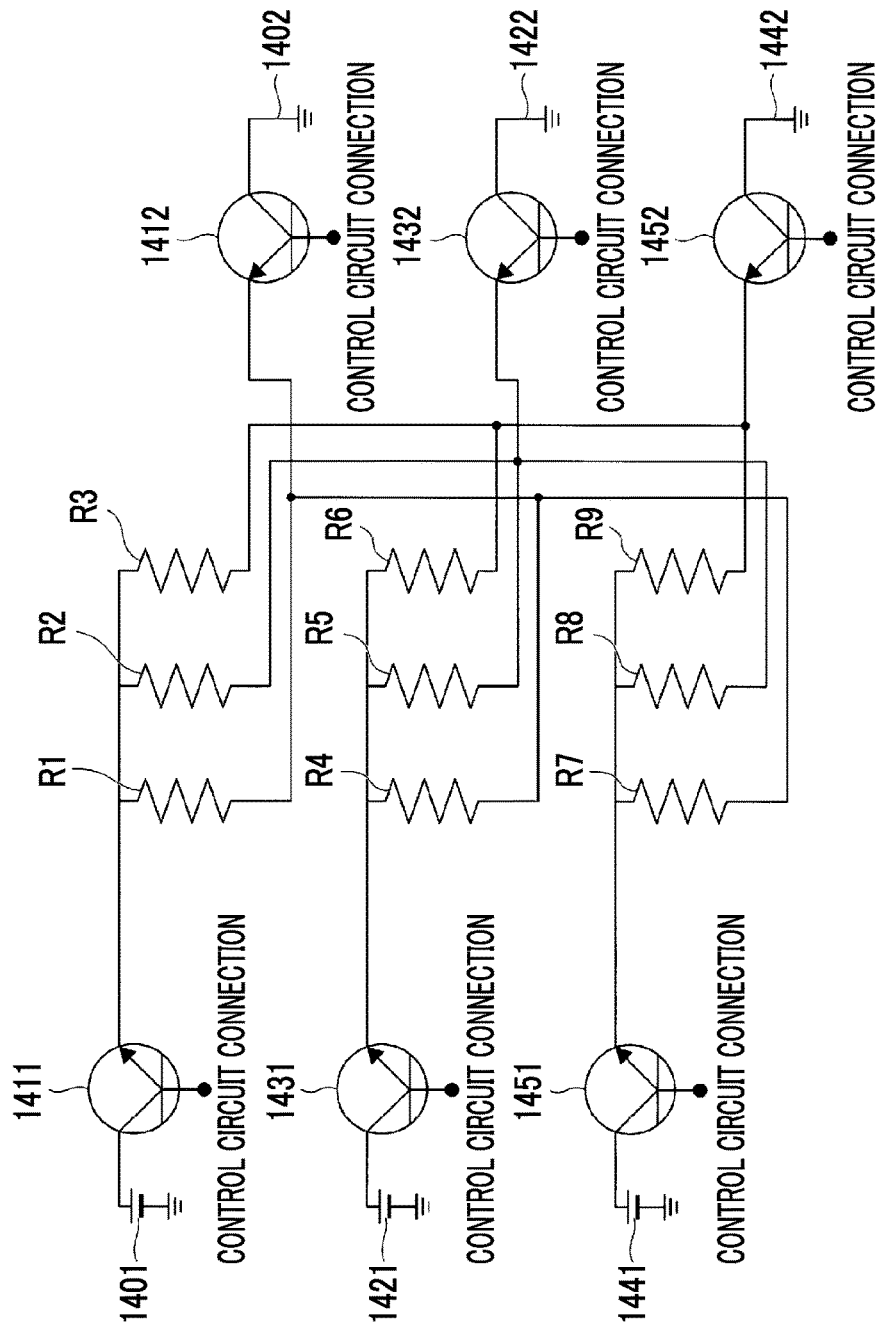
FIG. 21 is a diagram showing an example of a circuit for controlling a sub-heater according to an embodiment of the present invention.

FIG. 21 is a diagram showing an example of a circuit for controlling the sub-heater 1012 according to an embodiment of the present invention. In the example of FIG. 21, a case of being provided with nine sub-heaters 1012 configured with nine resistors R1 to R9 is shown.

In the circuit shown in FIG. 21, a switching element 1411 (a positive-side switching element) is connected between a first DC power source 1401 and three resistors R1 to R3. A control circuit is connected to the switching element 1411. The three resistors R1 to R3 are in parallel.

Similarly, a switching element 1431 (a positive-side switching element) is connected between a second DC power source 1421 and three resistors R4 to R6. A control circuit is connected to the switching element 1431. The three resistors R4 to R6 are in parallel.

Similarly, a switching element 1451 (a positive-side switching element) is connected between a third DC power source 1441 and three resistors R7 to R9. A control circuit is connected to the switching element 1451. The three resistors R7 to R9 are in parallel.

In the circuit shown in FIG. 21, a switching element 1412 (a negative-side switching element) is connected between a first earth 1402 (a ground) and three resistors R1, R4, and R7. A control circuit is connected to the switching element 1412. The three resistors R1, R4, and R7 are in parallel.

Similarly, a switching element 1432 (a negative-side switching element) is connected between a second earth 1422 (a ground) and three resistors R2, R5, and R8. A control circuit is connected to the switching element 432. The three resistors R2, R5, and R8 are in parallel.

Similarly, a switching element 1452 (a negative-side switching element) is connected between a third earth 1442 (a ground) and three resistors R3, R6, and R9. A control circuit is connected to the switching element 1452. The three resistors R3, R6, and R9 are in parallel.

Here, in the positive-side switching elements 1411, 1431, and 1451, for example, in a case where transistors are used, the control circuit is connected to the base terminals of the transistors, the DC power sources 1401, 1421, and 1441 are connected to the collector terminals of the transistors, and the resistors R1 to R9 are connected to the emitter terminals of the transistors.

Further, in the negative-side switching elements 1412, 1432, and 1452, for example, in a case where transistors are used, the control circuit is connected to the base terminals of the transistors, the earths 1402, 1422, and 1442 are connected to the collector terminals of the transistors, and the resistors R1 to R9 are connected to the emitter terminals of the transistors.

As the switching element, a field effect transistor (FET) or the like may be used.

In the circuit shown in FIG. 21, if the switching element 1411 corresponding to the first DC power source 1401 and the switching element 1412 corresponding to the first earth 1402 are turned on, a current flows through only the resistor R1 to turn on it, and if the switching element 1411 corresponding to the first DC power source 1401 and the switching element 1432 corresponding to the second earth 1422 are turned on, a current flows through only the resistor R2 to turn on it, and if the switching element 1411 corresponding to the first DC power source 1401 and the switching element 1452 corresponding to the third earth 1442 are turned on, a current flows through only the resistor R3 to turn on it. Similarly, also with respect to other resistors R4 to R9, only one resistor can be turned on according to the switching state.

In this embodiment, the switching elements 1411, 1431, 1451, 1412, 1432, and 1442 are disposed in both the areas between the DC power sources 1401, 1421, and 1441 and the sub-heaters 1012 (the resistors R1 to R9) and between the sub-heaters 1012 (the resistors R1 to R9) and the earths 1402, 1422, and 1442. As another configuration, it is also possible to dispose the switching elements only on one side out of these areas.

Further, as another configuration, a high frequency cut-off filter may be provided between each of the switching elements 1411, 1431, 1451, 1412, 1432, and 1452 and each of the resistors R1 to R9 so as to protect the DC power sources 1401, 1402, 1421, 1422, 1441, and 1442 and the switching elements 1411, 1412, 1431, 1432, 1451, 1452.

Figure 22:
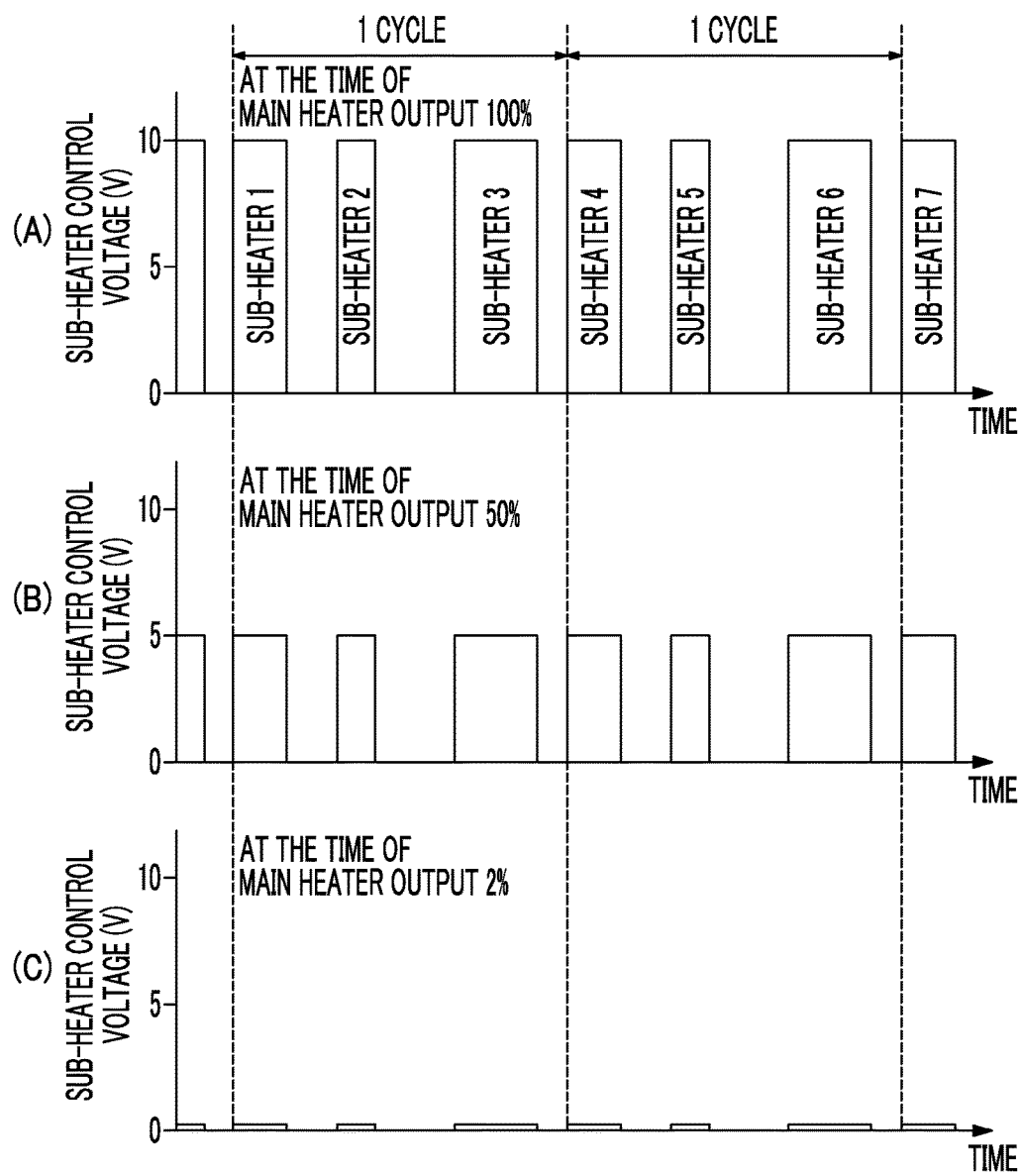
FIGS. 22(A), 22(B), and 22(C) are diagrams showing examples of a pulse voltage which controls a sub-heater according to an embodiment of the present invention.

FIGS. 22(A), 22(B), and 22(C) are diagrams showing examples of pulse voltages which control the sub-heaters 1012 according to an embodiment of the present invention.

In the graphs shown in FIGS. 22(A), 22(B), and 22(C), the horizontal axis represents time and the vertical axis represents the value of a control voltage (V) which is applied to the sub-heater 1012.

FIG. 22(A) is an example when the output of the main heater 1011 is 100%. FIG. 22(B) is an example when the output of the main heater 1011 is 50%. FIG. 22(C) is an example when the output of the main heater 1011 is 2%.

In the examples of FIGS. 22(A), 22(B), and 22(C), in one cycle corresponding to a predetermined period, a pulse voltage is sequentially applied to three sub-heaters 1012. In this way, in three cycles, a pulse voltage is sequentially applied to nine sub-heaters 1012 (the first sub-heater, the second sub-heater, . . . , and the ninth sub-heater).

The pulse voltage is the voltage of a pulse which is switched between a predetermined low voltage value (in this example, zero) corresponding to an OFF state and a predetermined high voltage value (in this example, a controllable predetermined voltage value) corresponding to an ON state. In the OFF state, a heater (a heater in a corresponding temperature control region) is turned off, and in the ON state, the heater (the heater in a corresponding temperature control region) is turned on. If the period of the ON state is long, the calorific value of the heater (the heater in a corresponding temperature control region) increases, and if the period of the ON state is short, the calorific value of the heater (the heater in a corresponding temperature control region) decreases.

In this embodiment, due to continuously repeating the same control as the control of the pulse voltage in a cycle unit as shown in FIGS. 22(A), 22(B), and 22(C), for example, even if there is unevenness (non-uniformity) in the temperature control by the main heater 1011 in the circular mounting surface (the circular surface shown in FIG. 20) of the electrostatic chuck device 1001, it is possible to reduce the unevenness by the temperature control by the sub-heater 1012 in each division region (temperature control region), and thus it is possible to secure the uniformity of temperature control.

In this embodiment, by calculating a pulse width (a temporal width, an application time) of a pulse current (a pulse voltage corresponding thereto) for each of the sub-heaters 1012 in the pulse time calculation unit 1053, it is possible to adjust the pulse width. The pulse widths of the pulse voltages of the plurality of sub-heaters 1012 may be independently different from each other or may be partially the same, for example.

In this embodiment, by controlling the value of the voltage of the DC power source of the sub-heater 1012 in the voltage control unit 1044 of the sub-heater DC power source, it is possible to adjust the level (for example, the value of a pulse voltage) of a pulse current (a pulse voltage corresponding thereto) for each of the sub-heaters 1012. The pulse widths of the pulse voltages of the plurality of sub-heaters 1012 may be independently different from each other or may be partially the same, for example.

In the examples of FIGS. 22(A), 22(B), and 22(C), with respect to each combination of three sub-heaters 1012, the pulse widths of the pulse voltages of the respective sub-heaters 1012 are made different, and with respect to all the sub-heaters 1012, the values of the pulse voltages are controlled to the same level together.

In this manner, in this embodiment, the control part controls the time width (pulse width) of the pulse voltage which is applied to the sub-heater 1012 in each temperature control region of the second heater element 1311 during the periods of the same length cyclically allocated to the plurality of regions (temperature control regions) of the second heater element 1311.

Here, as the length of one cycle, an arbitrary length may be used.

Further, as the number of sub-heaters 1012 which are controlled in one cycle, an arbitrary number may be used.

Further, in this embodiment, one cycle is equally divided by the number of sub-heaters 1012 which are controlled in one cycle, the period of the same length is allocated to each sub-heater 1012, and the pulse width is adjusted within the period. As another configuration example, with respect to a plurality of sub-heaters 1012 which are controlled in one cycle, an arbitrary period (it may not be an equally divided period) may be allocated to each sub-heater 1012 such that the pulse width is adjusted within the period. In this case, for example, instead of increasing the value of the pulse voltage, by increasing the pulse width of the pulse voltage, it is possible to reduce the necessary amount of electric power while keeping the calorific values of the sub-heaters 1012 the same.

As described above, in the electrostatic chuck device 1001 according to this embodiment, by controlling the pulse width and the voltage value of the pulse voltage which is applied to each of the sub-heaters 1012, it is possible to accurately perform temperature control using the main heater 1011 and the sub-heater 1012. In this embodiment, for example, with respect to the pulse width of the pulse voltage, it is possible to control it on the basis of the measurement data, and with respect to the voltage value of the pulse voltage, it is possible to control it on the basis of the temperature conditions.

As another configuration example, with respect to the pulse width of the pulse voltage, control may be performed further using the temperature conditions. Further, as another configuration example, with respect to the voltage value of the pulse voltage, control may be performed further using the measurement data.

In this embodiment, the temperature control region of a certain main heater 1011 is divided into a plurality of temperature control regions, and the sub-heater 1012 is provided for each of the divided regions. As another configuration example, a configuration may be used in which the temperature control region of a certain main heater 1011 is divided into a plurality of temperature control regions, a sub-heater is not provided in one divided region, and the sub-heater 1012 is provided for each of other divided regions. That is, with respect to one divided region, it is possible to adjust a temperature as a whole even without adjusting a temperature by the sub-heater.

Further, as the number of main heaters 1011, the temperature control region of each of the main heaters 1011, the number of sub-heaters 1012, and the temperature control region of each of the sub-heaters 1012, various configurations may be used.

Seventh Embodiment

Figure 23:
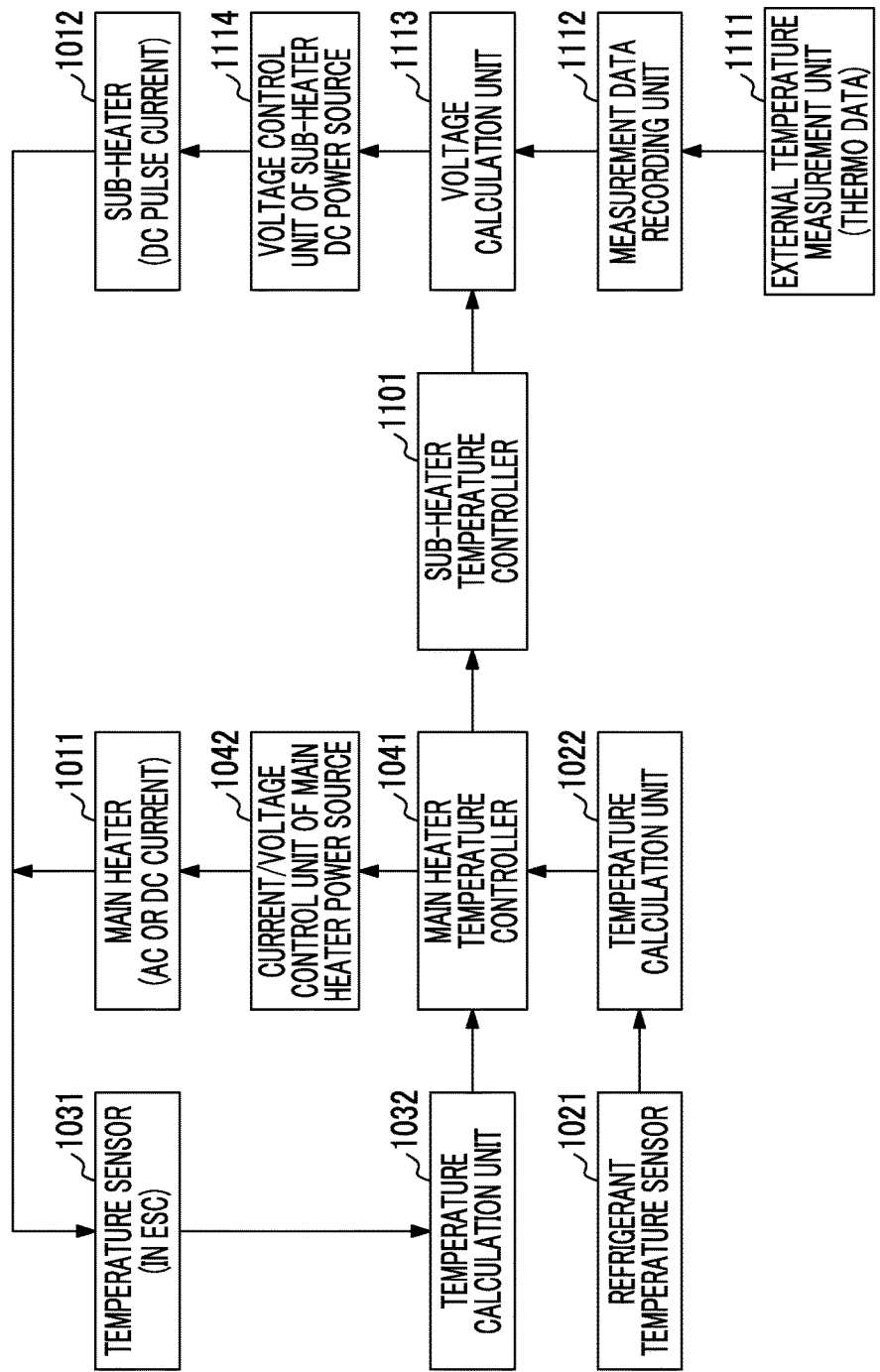
FIG. 23 is a block diagram showing a schematic configuration of an electrostatic chuck device according to an embodiment (a seventh embodiment) of the present invention.

FIG. 23 is a block diagram showing a schematic configuration of an electrostatic chuck device (for convenience of description, it will be referred to as an electrostatic chuck device 1001A) according to an embodiment (a seventh embodiment) of the present invention. The same constituent parts as those shown in FIG. 18 relating to the sixth embodiment are denoted by the same reference numerals.

The electrostatic chuck device 1001A is provided with the temperature controlling base part 1201 (the same as that shown in FIG. 19), the electrostatic chuck part 1211 (the same as that shown in FIG. 19), the main heater 1011, the sub-heater 1012, the refrigerant temperature sensor 1021, the temperature calculation unit 1022, the temperature sensor 1031 in the electrostatic chuck (ESC), the temperature calculation unit 1032, the main heater temperature controller 1041, the current/voltage control unit 1042 of the main heater power source, a sub-heater temperature controller 1101, an external temperature measurement unit 1111, a measurement data recording unit 1112, a voltage calculation unit 1113, and a voltage control unit 1114 of the sub-heater DC power source.

Here, with respect to the main heater 1011, the sub-heater 1012, the refrigerant temperature sensor 1021, the temperature calculation unit 1022, the temperature sensor 1031 in the electrostatic chuck (ESC), the temperature calculation unit 1032, the main heater temperature controller 1041, and the current/voltage control unit 1042 of the main heater power source, they are the same as those shown in FIG. 18 relating to the sixth embodiment.

The sub-heater temperature controller 1101 generates and outputs information for performing the temperature control by the sub-heater 1012 on the basis of the information output by the main heater temperature controller 1041. The relationship between the information which is output from the main heater temperature controller 1041 and the information which is output from the sub-heater temperature controller 1101 is set and stored in advance, for example.

The external temperature measurement unit 1111 measures the temperature relating to the temperature control region for each of the sub-heaters 1012, similar to the case of the sixth embodiment.

The measurement data recording unit 1112 records (stores) the measurement data obtained by the external temperature measurement unit 1111, similar to the case of the sixth embodiment.

The voltage calculation unit 1113 calculates a voltage value on the basis of the information output from the sub-heater temperature controller 1101, and outputs information on the calculated voltage value to the voltage control unit 1114 of the sub-heater DC power source. In this case, the voltage calculation unit 1113 may calculate the voltage value by further using the information (for example, information on the temperature at the time of measurement) recorded in the measurement data recording unit 1112. The manner (for example, an expression or the like) of this calculation is set and stored in advance, for example.

The voltage control unit 1114 of the sub-heater DC power source adjusts the voltage value of a pulse signal (for example, a pulse current) on the basis of the information output from the voltage calculation unit 1113, and sets the pulse time (pulse width) of the pulse signal. How to adjust the voltage value of the pulse signal is set and stored in advance, for example. Further, in this embodiment, the same pulse time is set with respect to all the sub-heaters 1012.

This pulse signal is applied to the sub-heaters 1012.

Here, in this embodiment, the function of the control part which controls the voltage which is applied to the sub-heater 1012 is configured using the functions of the refrigerant temperature sensor 1021, the temperature calculation unit 1022, the temperature sensor 1031 in the electrostatic chuck (ESC), the temperature calculation unit 1032, the main heater temperature controller 1041, the sub-heater temperature controller 1101, the measurement data recording unit 1112, the voltage calculation unit 1113, and the voltage control unit 1114 of the sub-heater DC power source. As the configuration of the control part, it is not limited to that in this embodiment, and it is configured with, for example, one processing unit or two or more processing units which realize necessary functions.

In this embodiment, by calculating the voltage value of the DC power source of the sub-heater 1012 in the voltage calculation unit 1113, it is possible to adjust the level (for example, the value of a pulse voltage) of a pulse current (a pulse voltage corresponding thereto) for each of the sub-heaters 1012.

In this embodiment, with respect to the pulse time (pulse width), a constant pulse time (pulse width) is used.

As described above, in the electrostatic chuck device 1001A according to this embodiment, by controlling the voltage value of the pulse voltage which is applied to each of the sub-heaters 1012, it is possible to accurately perform the temperature control using the main heater 1011 and the sub-heater 1012. In this embodiment, for example, with respect to the pulse width of the pulse voltage, it is set to be constant, and with respect to the voltage value of the pulse voltage, it is possible to control it on the basis of the temperature conditions.

As another configuration example, with respect to the voltage value of the pulse voltage, control may be performed further using the measurement data.

Eighth Embodiment

Figure 24:
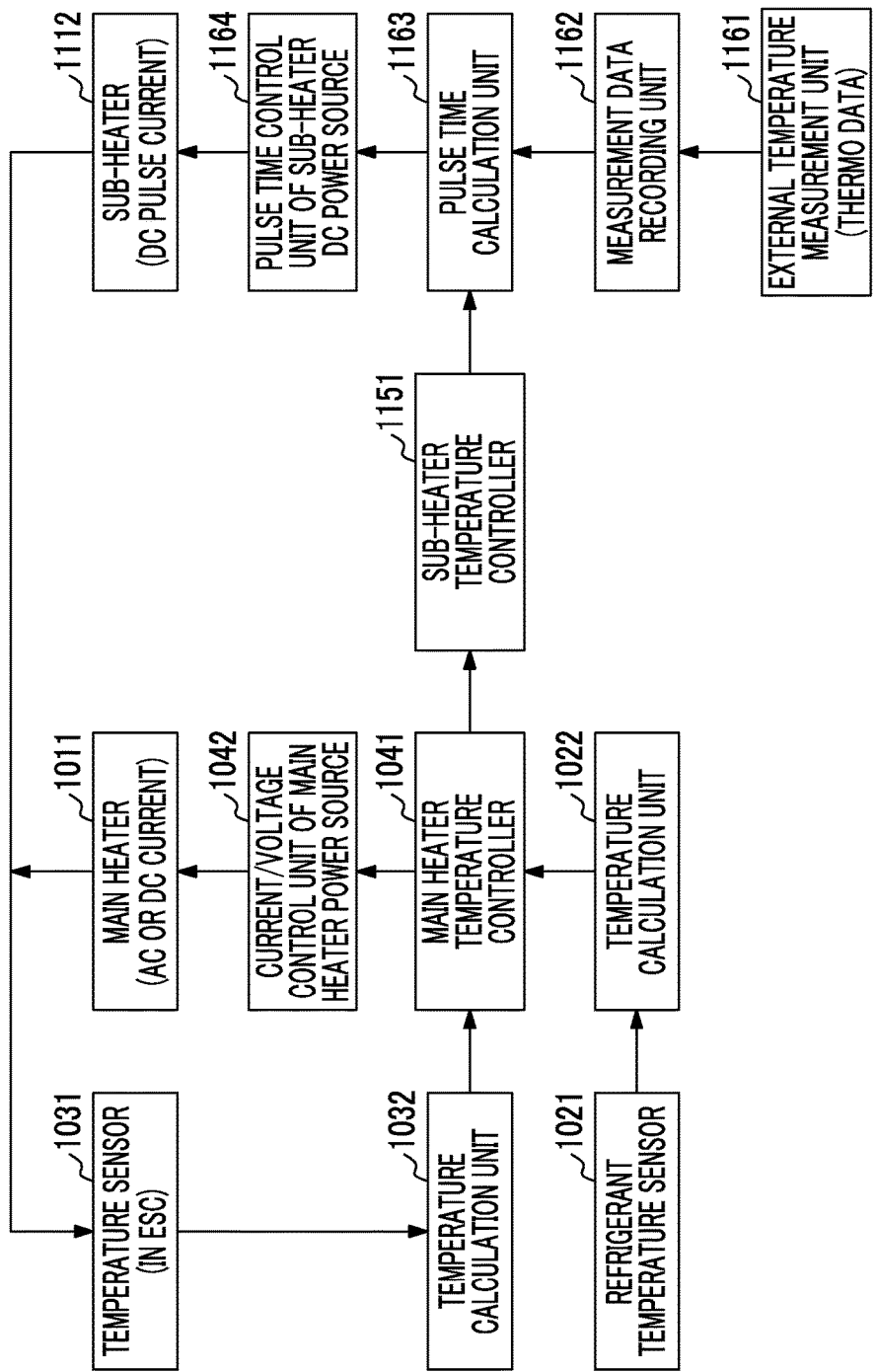
FIG. 24 is a block diagram showing a schematic configuration of an electrostatic chuck device according to an embodiment (an eighth embodiment) of the present invention.

FIG. 24 is a block diagram showing a schematic configuration of an electrostatic chuck device (for convenience of description, it will be referred to as an electrostatic chuck device 1001B) according to an embodiment (an eighth embodiment) of the present invention. The same constituent parts as those shown in FIG. 18 relating to the sixth embodiment are denoted by the same reference numerals.

The electrostatic chuck device 1001B is provided with the temperature controlling base part 1201 (the same as that shown in FIG. 19), the electrostatic chuck part 1211 (the same as that shown in FIG. 19), the main heater 1011, the sub-heater 1012, the refrigerant temperature sensor 1021, the temperature calculation unit 1022, the temperature sensor 1031 in the electrostatic chuck (ESC), the temperature calculation unit 1032, the main heater temperature controller 1041, the current/voltage control unit 1042 of the main heater power source, a sub-heater temperature controller 1151, an external temperature measurement unit 1161, a measurement data recording unit 1162, a pulse time calculation unit 1163, and a pulse time control unit 1164 of the sub-heater DC power source.

Here, with respect to the main heater 1011, the sub-heater 1012, the refrigerant temperature sensor 1021, the temperature calculation unit 1022, the temperature sensor 1031 in the electrostatic chuck (ESC), the temperature calculation unit 1032, the main heater temperature controller 1041, and the current/voltage control unit 1042 of the main heater power source, they are the same as those shown in FIG. 18 relating to the sixth embodiment.

The sub-heater temperature controller 1151 generates and outputs information for performing the temperature control by the sub-heater 1012 on the basis of the information output by the main heater temperature controller 1041. The relationship between the information which is output from the main heater temperature controller 1041 and the information which is output from the sub-heater temperature controller 1151 is set and stored in advance, for example.

The external temperature measurement unit 1161 measures the temperature relating to the temperature control region for each of the sub-heaters 1012, similar to the case of the sixth embodiment.

The measurement data recording unit 1162 records (stores) the measurement data obtained by the external temperature measurement unit 1161, similar to the case of the sixth embodiment.

The pulse time calculation unit 1163 calculates a pulse time (for example, a pulse time for each of the sub-heaters 1012) on the basis of the measurement data recorded in the measurement data recording unit 1162 and the information output from the sub-heater temperature controller 1151, and outputs information on the calculated pulse time. The manner (for example, an expression or the like) of this calculation is set and stored in advance, for example.

The pulse time control unit 1164 of the sub-heater DC power source adjusts the pulse time (pulse width) of a pulse signal on the basis of the information output from the pulse time calculation unit 1163. Further, in this embodiment, the same voltage value (voltage value of the pulse signal) is set with respect to all the sub-heaters 1012.

This pulse signal is applied to the sub-heaters 1012.

Here, in this embodiment, the function of the control part which controls the voltage which is applied to the sub-heater 1012 is configured using the functions of the refrigerant temperature sensor 1021, the temperature calculation unit 1022, the temperature sensor 1031 in the electrostatic chuck (ESC), the temperature calculation unit 1032, the main heater temperature controller 1041, the sub-heater temperature controller 1151, the measurement data recording unit 1162, the pulse time calculation unit 1163, and the pulse time control unit 1164 of the sub-heater DC power source. As the configuration of the control part, it is not limited to that in this embodiment, and it is configured with, for example, one processing unit or two or more processing units which realize necessary functions.

In this embodiment, by calculating the pulse width (temporal width) of a pulse current (a pulse voltage corresponding thereto) for each of the sub-heaters 1012 in the pulse time calculation unit 1163, it is possible to adjust the pulse width. The pulse widths of the pulse voltages of the plurality of sub-heaters 1012 may be independently different from each other or may be partially the same, for example.

In this embodiment, with respect to the voltage value of the pulse signal, a constant voltage value is used.

As described above, in the electrostatic chuck device 1001B according to this embodiment, by controlling the pulse width of the pulse voltage which is applied to each of the sub-heaters 1012, it is possible to accurately perform temperature control using the main heater 1011 and the sub-heater 1012. In this embodiment, for example, with respect to the pulse width of the pulse voltage, it is possible to control it on the basis of the measurement data and the temperature conditions, and with respect to the voltage value of the pulse voltage, it is set to be constant.

With Respect to the Above Sixth to Eighth Embodiments

Here, it is also possible to configure an electrostatic chuck controller in which some functions in each of the electrostatic chuck devices 1001, 1001A, and 1001B according to the above embodiments are separated.

As an example, an electrostatic chuck controller is provided with a control part which controls the voltage which is applied to the sub-heater 1012 in the electrostatic chuck device 1001, 1001A, or 1001B (the electrostatic chuck device which is provided with the first heater element 1301 configured with a single or a plurality of main heaters 1011 which adjust the temperature of the attraction surface of the electrostatic chuck part 1211 in a single or a plurality of regions, and the second heater element 1311 configured with a plurality of sub-heaters 1012 which adjust the temperatures of regions more than the regions of the first heater element 1301).

Further, it is also possible to implement a control method, which is performed in each of the electrostatic chuck devices 1001, 1001A, and 1001B according to the above embodiments, as an electrostatic chuck control method.

As an example, in an electrostatic chuck control method, a single or a plurality of main heaters 1011 configuring the first heater element 1301 adjust a temperature of the attraction surface of the electrostatic chuck part 1211 in a single or a plurality of regions, a plurality of sub-heaters 1012 configuring the second heater element 1311 adjust temperatures of regions more than the regions of the first heater element 1301, and a control part controls a voltage which is applied to the sub-heaters 1012.

As an example, in an electrostatic chuck control method, the magnitude of a voltage which is applied to the sub-heater 1012 disposed so as to divide the region of the main heater 1011 is controlled based on the magnitude of a voltage which is applied to the main heater 1011. Instead of the voltage which is applied to the main heater 1011, a current or electric power may be used.

As an example, in an electrostatic chuck control method, the magnitude of a voltage which is applied to the sub-heater 1012 disposed so as to divide the region of the main heater 1011 is controlled based on a temperature difference between at least the temperature detection result corresponding to the main heater 1011 and the temperature detection result of the chiller of the temperature controlling base part 1201.

As an example, in an electrostatic chuck control method, in the temperature control of the sub-heater 1012 disposed so as to divide the region of the main heater 1011, electric power which is supplied to the sub-heater 1012 is controlled by an application time (pulse width) and a voltage value of a pulse voltage, the application time (pulse width) is controlled by a temperature provided by the main heater 1011, and the voltage value is controlled by the electric power applied to the main heater 1011 or a temperature difference between at least the detected temperature corresponding to the main heater 1011 and the temperature detection result of the chiller of the temperature controlling base part 1201.

As an example, in an electrostatic chuck control method, in cyclic application of a pulse voltage to each divided sub-heater 1012 of the second heater element 1311, switching elements (in the example of FIG. 21, each of the switching elements 1411, 1431, 1451, 1412, 1432, and 1452) is disposed between each of DC power sources (in the example of FIG. 21, the DC power sources 1401, 1421, and 1441) and each of the sub-heaters 1012 and/or between each of the sub-heaters 1012 and each of earths (in the example of FIG. 21, the earths 1402, 1422, and 1442) and a predetermined pulse voltage is applied to each divided sub-heater 1012.

In an electrostatic chuck control method, the function of the control part (or the function of the control part and other functions) may be provided in a device (for example, an electrostatic chuck controller) separate from the main body of the electrostatic chuck device 1001, 1001A, or 1001B.

Further, it is also possible to execute a program which realizes the control which is performed in each of the electrostatic chuck devices 1001, 1001A, and 1001B according to the above embodiments.

As an example, it is also possible to execute a program which controls the electrostatic chuck device 1001, 1001A, or 1001B (the electrostatic chuck device provided with the first heater element 1301 configured with a single or a plurality of main heaters 1011 which adjust a temperature of an attraction surface of the electrostatic chuck part 1211 in a single or a plurality of regions, and the second heater element 1311 configured with a plurality of sub-heaters 1012 which adjust temperatures of regions more than the regions of the first heater element 1301), the program causing a computer to execute a step of controlling a voltage which is applied to the sub-heaters 1012 by using a pulse voltage as the voltage which is applied to the sub-heaters 1012.

Further, it is possible to execute a program for causing a computer to execute various other steps.

Such a program may be executed in a computer which configures a device (for example, an electrostatic chuck controller) separate from the main body of the electrostatic chuck device 1001, 1001A, or 1001B.

In this manner, the processing may be performed by recording a program for realizing each function according to the above-described embodiments on a computer-readable recording medium, reading the program recorded on the recording medium into a computer system, and executing the program by a CPU (Central Processing Unit) or the like.

The "computer system" as referred to herein may include an operating system (OS) or hardware such as a peripheral device.

Further, the "computer-readable record medium" refers to a flexible disk, a magneto-optical disk, a ROM (Read Only Memory), a writable nonvolatile memory such as a flash memory, a portable medium such as a DVD (Digital Versatile Disk), a storage device such as a built-in hard disk of a computer system.

Further, the "computer-readable record medium" includes also a medium holding a program for a certain period of time, like a volatile memory (for example, a DRAM (Dynamic Random Access Memory)) in a computer system serving as a server or a client in a case where a program is transmitted through a network such as the Internet, or a communication line such as a telephone line.

Further, the above-described program may be transmitted from a computer system in which the program is stored in a storage device or the like to another computer system through a transmission medium or by transmission waves in a transmission medium. Here, the "transmission medium" for transmitting a program refers to a medium having a function of transmitting information, like a network (a communication network) such as the Internet, or a communication line (a communication wire) such as a telephone line.

Further, the above-described program may be a program for realizing some of the above-described functions. Further, the above-described program may be a so-called difference file (differential program) which can realize the above-described functions by a combination with a program already recorded in a computer system.

The embodiments of the present invention have been described above in detail with reference to the drawings.

However, the specific configurations are not limited to these embodiments, and design changes and the like within a scope which does not depart from the gist of the present invention are also included.

REFERENCE SIGNS LIST

W: plate-shaped sample
1. 101: electrostatic chuck device
2: electrostatic chuck part
3: temperature controlling base part
3*a*: recess portion
3*b*: through-hole
4: high frequency generating electrode
5: first heater element
5A, 5B, 5C, 5D: main heater
6: second heater element
6A, 6B, 6C, 6D: sub-heater
6*a*, 6*b*, 6*c*, 6*d*: heater split body
7, 8, 10: insulation plate
8*b*: conduction part
9: wiring layer
9*a*: wiring body
4A, 7A: adhesion layer
11: adhesive layer
21: mounting plate
21*a*: mounting surface
22: supporting plate
23: electrode for electrostatic attraction (internal electrode for electrostatic attraction)
24: insulating material layer
25A: extraction electrode terminal
25B: conductive adhesion part
25C: power supply terminal
30: temperature sensor
30*a*: protrusion portion
31: installation hole
32: temperature measurement unit
33: excitation unit
34: fluorescence detector
35: control part
38: pin insertion hole
41, 51, 61: power supply terminal
71: current-carrying terminal
25*a*, 38*a*, 51*a*, 61*a*, 71*a*: insulator
70: guard electrode
80: heater part 200: thermo-camera
W: plate-shaped sample
501: electrostatic chuck device
502: electrostatic chuck part
503: temperature controlling base part
503a: recess portion
503A: flow path
503b: through-hole
503B: opening portion
504: wiring layer
504a: wiring body
505: first heater element
505A, 505B, 505C, 505D: main heater
506: second heater element
506A, 506B, 506C, 506D: sub-heater
506a, 506b, 506c, 506d: heater split body
507, 508: insulation plate
509A: adhesion layer
507b, 508b, 509b: conduction part
509B: adhesive layer
510: insulating part
511: mounting plate
511a: mounting surface
511b: protrusion portion
512: supporting plate
513: electrode for electrostatic attraction (internal electrode for electrostatic attraction)
514: insulating material layer
515A: extraction electrode terminal
515B: conductive adhesion part
515C: power supply terminal
515a: insulator
517: power supply terminal
518: insulator
520: temperature sensor
520a: protrusion portion
521: installation hole
522: temperature measurement unit
523: excitation unit
524: fluorescence detector
525: control part
526: power supply terminal
527: insulator
528: pin insertion hole
529: insulator
530: thermo-camera
550: high frequency generating electrode
551: metal plate
552: power supply terminal
552a: insulator
553: insulating layer
W: plate-shaped sample
601: electrostatic chuck device
602: electrostatic chuck part
603: temperature controlling base part
603a: recess portion
603b: through-hole
604: wiring layer
605: first heater element
605A, 605B, 605C, 605D: main heater
606: second heater element
606A, 606B, 606C, 606D: sub-heater
606b, 606c, 606d: heater split body
607, 608: insulation plate
609: adhesion layer
607b, 608b, 609b: conduction part
610: adhesive layer
611: mounting plate
611a: mounting surface
613: electrode for electrostatic attraction (internal electrode for electrostatic attraction)
615A: extraction electrode terminal
615B: conductive adhesion part
615C: power supply terminal
615a: insulator
617: power supply terminal
618: insulator
620: temperature sensor
621: installation hole
622: temperature measurement unit
626: power supply terminal
627: insulator
630: thermo-camera
637, 638: insulation plate
637b, 638b: conduction part
639: adhesion layer
646, 648: power supply terminal
647, 649: insulator
1001: electrostatic chuck device
1011: main heater
1012: sub-heater
1021: refrigerant temperature sensor
1022, 1032: temperature calculation unit
1031: temperature sensor
1041: main heater temperature controller
1042: current/voltage control unit
1043, 1101, 1151: sub-heater temperature controller
1044, 1114: voltage control unit
1051, 1111, 1161: external temperature measurement unit
1052, 1112, 1162: measurement data recording unit
1053, 1163: pulse time calculation unit
1054: pulse time adjustment unit
1201: temperature controlling base part
1211: electrostatic chuck part
1221: wafer
1301: first heater element
1311: second heater element
1401, 1421, 1441: DC power source
1402, 1422, 1442: earth
1411, 1412, 1431, 1432, 1451, 1452: switching element
R1 to R9: resistor (heater)
1113: voltage calculation unit
1164: pulse time control unit

The invention claimed is:
1. An electrostatic chuck device comprising:
an electrostatic chuck part which has a mounting surface on one principal surface thereof to mount a plate-shaped sample and has an electrode for electrostatic attraction;
a temperature controlling base with a flow path through which a cooling medium circulates which is provided at a side opposite to the mounting surface of the electrostatic chuck part and is configured to cool the electrostatic chuck part;
a high frequency generating electrode which is provided in a layer between the electrostatic chuck part and the temperature controlling base;
a high frequency power source which is connected to the high frequency generating electrode;
a first heater element which is configured with a plurality of main heaters which are provided in a layer between the high frequency generating electrode and the temperature controlling base; and a guard electrode which is provided in a layer between the high frequency generating electrode and the first heater element, wherein the guard electrode has a first heat transfer barrier extending in a circumferential direction thereof.

2. The electrostatic chuck device according to claim 1, further comprising a second heater element which is configured with a plurality of sub-heaters disposed in a layer between the first heater element and the guard electrode or between the first heater element and the temperature controlling base.

3. The electrostatic chuck device according to claim 1, wherein the plurality of main heaters, which form the first heater element, are disposed concentrically in an annular shape in a circular region along the surface on which the first heater element is disposed, and the first heat transfer barrier is provided to planarly overlap a region wherein the region is provided between the plurality of main heaters which are adjacent to each other in a radial direction in the circular region.

4. The electrostatic chuck device according to claim 1, wherein the plurality of main heaters, which form the first heater element, are disposed concentrically in an annular shape in a circular region along the surface on which the first heater element is disposed, the high frequency generating electrode has a second heat transfer barrier which extends in a circumferential direction thereof, and the second heat transfer barrier is provided to planarly overlap a region wherein the region is provided between the plurality of main heaters which are adjacent to each other in a radial direction in a circular region.

5. The electrostatic chuck device according to claim 1, wherein a material which forms the high frequency generating electrode is a non-magnetic metal material.

6. The electrostatic chuck device according to claim 1, wherein a material which forms the high frequency generating electrode has a thermal expansion coefficient of $4 \times 10^{-6}$/K or more and $10 \times 10^{-6}$/K or less.

7. The electrostatic chuck device according to claim 1, wherein the high frequency generating electrode has a thickness of 20 μm or more and 1000 μm or less.

8. The electrostatic chuck device according to claim 2, wherein a calorific value per unit area of the sub-heaters is set to be smaller than that of the main heater.

9. An electrostatic chuck device comprising:

an electrostatic chuck part which has a mounting surface on one principal surface thereof to mount a plate-shaped sample and has an electrode for electrostatic attraction;

a temperature controlling base which is provided at a side opposite to the mounting surface of the electrostatic chuck part and is configured to cool the electrostatic chuck part;

a high frequency generating electrode which is provided in a layer between the electrostatic chuck part and the temperature controlling base and insulated from the temperature controlling base;

a high frequency power source which is connected to the high frequency generating electrode;

a first heater element which is configured with a plurality of main heaters which are provided in a layer between the electrostatic chuck part and the high frequency generating electrode;

a second heater element which is configured with a plurality of sub-heaters which are provided between the high frequency generating electrode and the temperature controlling base; and a metal plate which is provided between the high frequency generating electrode and the second heater element.

10. The electrostatic chuck device according to claim 9, wherein a material which forms the temperature controlling base is a metal material, and the metal plate and the temperature controlling base are electrically connected to each other.

11. The electrostatic chuck device according to claim 9, wherein a calorific value per unit area of the sub-heaters is set to be smaller than that of the main heaters.

12. The electrostatic chuck device according to claim 9, wherein both the first heater element and the second heater element are arranged such that the first heater element and the second heater element are provided in circular regions along surfaces on which the elements are provided, the first heater element and the second heater element are divided into a plurality of portions in circumferential directions or radial directions thereof, and the number of divided portions of the second heater element is greater than that of the first heater element.

13. The electrostatic chuck device according to claim 9, wherein the plurality of main heaters which form the first heater element are provided concentrically in a circular region along the surface on which the first heater element and the second heater element are disposed, and the metal plate has a plurality of first heat transfer barriers extending in a circumferential direction thereof.

14. The electrostatic chuck device according to claim 9, wherein both the first heater element and the second heater element are arranged such that the first heater element and the second heater element are provided in circular regions along surfaces on which the elements are provided, and the metal plate has the plurality of first heat transfer barriers which are provided to planarly overlap a region provided between the plurality of adjacent main heaters and a region provided between the plurality of adjacent sub-heaters.

15. The electrostatic chuck device according to claim 9, wherein both the first heater element and the second heater element are arranged such that the first heater element and the second heater element are provided in circular regions along surfaces on which the elements are provided, and the high frequency generating electrode has a plurality of second heat transfer barriers which are provided to planarly overlap a region provided between the plurality of adjacent main heaters and a region provided between the plurality of adjacent sub-heaters.

16. The electrostatic chuck device according to claim 9, wherein a temperature sensor which measures a temperature of the main heater is provided to be in contact with the main heater via an insulation material on a temperature controlling base side of the main heater or installed in a temperature measuring part which is provided on the same surface on which the main heater is provided.

17. The electrostatic chuck device according to claim 9, wherein one surface of the temperature sensor is in contact via the insulation material or installed in the temperature measuring part which is provided on the same surface on which the main heater is provided, and the other surface of the temperature sensor is not in contact with the temperature controlling base.

\* \* \* \* \*